United States Patent
Heldeis et al.

(10) Patent No.: US 9,876,510 B2
(45) Date of Patent: Jan. 23, 2018

(54) METHOD FOR DETERMINING ACTIVE INPUT ELEMENTS OF AN INPUT ARRANGEMENT AND INPUT ARRANGEMENT

(71) Applicant: Christoph Heldeis, Munich (DE)

(72) Inventors: Christoph Heldeis, Munich (DE); Tilo Hacke, Anzing (DE)

(73) Assignee: Christoph Heldeis, Munich (DE)

( * ) Notice: Subject to any disclaimer, the term of this patent is extended or adjusted under 35 U.S.C. 154(b) by 208 days.

(21) Appl. No.: 14/768,121

(22) PCT Filed: Feb. 21, 2014

(86) PCT No.: PCT/EP2014/053408
§ 371 (c)(1),
(2) Date: Aug. 14, 2015

(87) PCT Pub. No.: WO2014/131699
PCT Pub. Date: Sep. 4, 2014

(65) Prior Publication Data
US 2016/0013806 A1    Jan. 14, 2016

(30) Foreign Application Priority Data
Feb. 28, 2013   (WO) ................. PCT/EP2013/054108

(51) Int. Cl.
*H03M 11/00*  (2006.01)
*H03M 11/20*  (2006.01)

(52) U.S. Cl.
CPC .......... *H03M 11/003* (2013.01); *H03M 11/20* (2013.01)

(58) Field of Classification Search
CPC ............................. H03M 11/003; H03M 11/20
(Continued)

(56) References Cited

U.S. PATENT DOCUMENTS 4,709,228 A    11/1987  Huecking et al.
7,151,432 B2 *  12/2006  Tierling ................. H03M 11/20
                                              340/14.4
(Continued)

FOREIGN PATENT DOCUMENTS

EP    1876711      9/2008
RU    2006108876   10/2007

*Primary Examiner* — Brian Wilson
(74) *Attorney, Agent, or Firm* — Duane Morris LLP; J. Rodman Steele, Jr.; Gregory M. Lefkowitz

(57) ABSTRACT

The invention relates in an aspect A to a method for determining active input elements ($S1a$, $S2a$) of an input arrangement (10), comprising provide input elements ($S1a$ to $S2b$) that are connected according to a matrix arrangement, providing within the matrix arrangement at least two drive lines ($L1$, $L2$) that are each connected to a respective driving circuit (2, 4), providing within the matrix arrangement at least two sense lines ($Ca$, $Cb$) that may be used to detect active input elements ($S1a$, $S2a$), providing within the matrix arrangement serial connections ($SC1$ to $SC4$) each comprising one of the input elements ($S1a$) and a resistor ($R1a$) and each serial connection ($SC1$ to $SC4$) being connected to a respective one of the drive lines ($L1$, $L2$) and to a respective one of the sense lines ($Ca$, $Cb$), providing pull resistors ($Ra$, $Rb$) that connect the sense lines ($Ca$, $Cb$) to a first potential, and using a control device for the driving circuits that drives an active drive line ($L1$) to a second potential that is different from the first potential and that drives a non active drive line ($L2$) or non active drive lines to the first potential or to a potential having an absolute offset value from the first potential that is at most 50 percent (Continued)

or at most 10 percent of the absolute value of the difference of the first potential and of the second potential.

18 Claims, 36 Drawing Sheets

(58) Field of Classification Search
USPC .............................................. 341/24, 26, 34
See application file for complete search history.

(56) References Cited

U.S. PATENT DOCUMENTS

| | | |
|---|---|---|
| 8,089,289 B1 | 1/2012 | Kremin et al. |
| 2005/0271442 A1 | 12/2005 | Ho et al. |
| 2006/0202867 A1 | 9/2006 | Hsieh |
| 2008/0007529 A1 | 1/2008 | Paun et al. |
| 2010/0066572 A1 | 3/2010 | Dietz et al. |
| 2011/0179372 A1 | 7/2011 | Moore et al. |

\* cited by examiner

METHOD FOR DETERMINING ACTIVE INPUT ELEMENTS OF AN INPUT ARRANGEMENT AND INPUT ARRANGEMENT

CROSS-REFERENCE TO RELATED APPLICATION

This application is a §371 national stage entry of International Application. No. PCT/EP2014/053408, filed Feb. 21, 2014, which claims priority to International Patent Application No. PCT/EP2013/054108, filed Feb. 28, 2013, the entire contents of which are incorporated herein by reference.

FIELD OF THE INVENTION

This invention relates generally to input arrangements and more particularly concerns such input arrangements which allow multiple key detection of key switches that are pressed at the same time.

BACKGROUND OF THE INVENTION

There is already a plurality of keyboard types. However, there are still some problems. Simply constructed keyboards often have problems with the detection if multiple key switches are activated at the same time. These problems are known for instance as "ghost keys" and "mask keys". On the other hand it is important to keep the complexity of the keyboard as low as possible.

SUMMARY OF THE INVENTION

The invention relates to a method for determining active input elements of an input arrangement, comprising
providing input elements that are connected according to a matrix arrangement,
providing within the matrix arrangement at least two drive lines that are each connected to a respective driving circuit,
providing within the matrix arrangement at least two sense lines that may be used to detect active input elements,
providing within the matrix arrangement serial connections each comprising an input element and a resistor and each serial connection connected to a respective one of the drive lines and to a respective one of the sense lines,
providing pull resistors that connect the sense lines to a first potential, and
using a control device for the driving circuits that is able to drive an active drive line to a second potential that is different from the first potential and that is able to drive a non active drive line or non active drive lines to the first potential or to a potential having an absolute offset value from the first potential that is at most 50 percent or at most 10 percent of the absolute value of the difference of the first potential and of the second potential.

Furthermore, the invention relates to an input arrangement, comprising:
a plurality of input elements,
wherein the input elements are connected according to a matrix arrangement,
wherein the matrix arrangement comprises at least two drive lines that are each connected to a respective driving circuit,
wherein the matrix arrangement comprises at least two sense lines that may be used to detect active input elements,
wherein according to the matrix arrangement serial connections each comprising an input element and a resistor are each connected to a respective one of the drive lines and to a respective one of the sense lines.

Description of General Embodiments—Aspect A

It is an object of the invention to provide a method that may be used in a simple manner and that preferably deals with the problems of wrong key switch detection and/or of multiple key switch detection of key switches that are pressed at the same time. Preferably it shall be easy and/or fast to determine which key switches is/are pressed. Furthermore, a corresponding input arrangement should be provided.

A method for determining active input elements of an input arrangement may comprise:
providing input elements that are connected according to a matrix arrangement,
providing within the matrix arrangement at least two drive lines that are each connected to a respective driving circuit,
providing within the matrix arrangement at least two sense lines that may be used to detect active input elements,
providing within the matrix arrangement serial connections each comprising an input element and a resistor and each serial connection connected to a respective one of the drive lines and to a respective one of the sense lines,
providing pull resistors that connect the sense lines to a first potential, and
using a control device used for driving of the driving circuits that is able to drive an active drive line to a second potential that is different from the first potential and that is able to drive a non active drive line or non active drive lines to the first potential or to a potential having an absolute offset value from the first potential that is at most 50 percent or at most 10 percent of the absolute value of the difference of the first potential and of the second potential.

If there is an offset, the non active potential may have a value that lies between the value of the first potential and the value of the second potential.

The absolute value is defined as giving always a positive sign, i.e. the absolute value of 4 is 4 and the absolute value of −4 is also 4.

The resistors prevent for instance short circuits between different drive lines via the same sense line in the case in that more than one input element is active or pressed in one column or at the same sense line of the matrix arrangement.

The using of these potentials results in a simple voltage divider. The tap of this voltage divider may be sensed at a sense line. The more switches are active in one column the more the voltage of the voltage divider tap shifts to plus or to source/ground potential depending on the value of the first potential. An exception exists only if no switch is active in one column. The first potential will be sensed if no switch is active.

The input elements are connected according to a connection scheme. The actual arrangement or location of the input elements may be different from the connection scheme. This means that input elements may have changed places compared with the matrix arrangement according to the connection scheme. Although places may have changed the connection of input elements to the drive lines and to the sense lines remains the same.

Each serial connection may comprise an input element and a resistor. Each serial connection may consists of a switch or push button and a resistor. The resistor may be unmovable with regard to a carrier substrate of the matrix arrangement in this case.

Alternatively each serial connection may consists of a first switch or a first push button and of a resistor and of a second switch or push button, especially if the resistor is movable with regard to drive lines and/or sense lines. In this case both switches are coupled to each other. Other configurations within the serial connections are possible as well.

The first potential may be preferably the positive operation potential. In this case, the second potential may be the ground/source potential or a potential near ground/source. The usage of these potentials is preferred for most driving circuits, see the more detailed explanation given below. However, it is possible to use other potentials for the first potential, for instance ground/source potential or a potential near ground/source, and for the second potential as well, for instance positive operational potential or a potential near positive operational potential.

The input arrangement may be for instance:
- a keyboard, especially an alpha numeric keyboard having at least 50 key switches, usually not more than 150 key switches or not more than 2000 key switches. The keyboard may be a device separate of a computer or it may be an integral part of the computer, or
- a keypad having between 10 and 20 key switches, especially a keypad used for entrance control.

For instance the keyboard may comprise of at least one, two three, four, five or all of:
- at least 25 keys for the input of letters a, b, c etc.,
- at least 10 keys for the input of digits 0, 1, 2, etc., preferably combined with further input characters, for instance "!", """, "§", "$" etc.
- at least 10 keys for functions, i.e. function F1, function F2, etc.,
- at least 10 keys of a keypad for entering numbers, i.e. digits 0, 1, 2, etc., especially a further group of these numbers, —no further input characters are used for the keys of the further group,
- modifier keys as for instance defined in the HID (Human Interface Device) specification, i.e. left CTRL, left SHIFT, left ALT, left GUI (Graphic User Interface), i.e. for instance Microsoft left Win key, Macintosh Left Apple key, Sun left Meta key etc., right CTRL, right SHIFT, right ALT, right GUI,
- auxiliary keys: Caps Lock, Tab, Spacebar, Page Down, Page Up, Right Arrow, Left Arrow, Up Arrow, Down Arrow.

In the following the switching elements or the input elements may be touch switches or push buttons. The switching elements may also be named keys or key switches.

The method allows a very fast scanning of the matrix, especially if only one threshold value is used to determine whether a scanned input element is active or not. This threshold value may be independent of the number of pressed keys or activated input elements in one column of the matrix arrangement, i.e. on one sense line.

However, the detection of active input elements may be made very fast because of the use of the voltage divider mentioned above even if more than one threshold value is used.

In both cases, there will be no detection faults due to ghost keying.

The method may comprise:
- activating a first drive line of the drive lines, wherein preferably only one drive line (L1) of the drive lines (L1, L2) is active at one time, i.e. at the same time,
- detecting a first value of an electrical signal, preferably a first value of a potential, on a first sense line of the sense lines during activating the first drive line, and
- determining an activated input element in the serial connection between the first drive line and the first sense line due to the undershoot or due the exceeding of a threshold value by the first value,
- whereby the threshold value is independent of the number of active input elements or independent of at least two, at least three or at least four different numbers of active input elements on the first sense line and/or on others of the sense lines.

Therefore, it is possible to detect a pressed key only due to the fact that the first value is below the threshold value or above the threshold value. Ghost keying is no issue any more. The exact value of the first value may be used to determine the number of pressed keys within a column of the matrix. This number may then be used to make the scanning of the matrix faster. This will be explained in more detail below.

The threshold value may be determined in different ways, for instance:
- empirically,
- by monitoring the detected values, or
- by using a calibration column, which will be explained below in more detail.

The method may comprise:
- detecting a second value of an electrical signal, preferably a second value of a potential, on a second sense line of the sense lines during activating the first drive line, especially after determining on the first sense line,
- determining an activated input element in the serial connection between the first drive line and the second sense line due to the undershoot or due the exceeding of the threshold value by the second value.

All sense lines may be sensed one after the other using preferably only one and/or the same threshold value. Alternatively it is possible to sense more than one sense line at the same time, for instance by using more than one analog digital converter (ADC).

The method may comprise:
- deactivating (driving to a corresponding fixed potential, for instance to the first potential or to a potential near the first potential, i.e. not to high Ohmic state) the first drive line after detecting the first value and the second value,
- activating a second drive line of the drive lines, —determining an activated input element in the serial connection between the second drive line and the first sense line due to the undershoot or due the exceeding of the threshold value by the first value.

This means that scanning of the matrix arrangement may be done row by row and in each row column by column. This is a fast scanning scheme because the settle times of the signals on the rows have to be obeyed only once per row.

The matrix arrangement may comprise a calibration line. Reference resistors may be connected to the calibration line and to each drive line respectively. The method may comprise:
- detecting a calibration value using the calibration line,
- using the calibration value to determine the threshold value.

The calibration line may be preferably connected to the first potential by a further pull resistor.

All drive lines may be activated if the calibration value is detected. This simulates the case in which all keys within a column are being pressed at the same time, i.e. the worst case for detection without detection faults.

The calibration value may be used as the threshold value. Alternatively an offset may be added to the calibration value in order to get the threshold value. The offset may be calculated with regard to an interval between the calibration value and a maximum value of an analog digital converter (ADC) or a potential that corresponds to this maximum value. The offset may be in the range of one tenth or one half of this interval, preferably at one quarter of this interval. Alternatively, reference may be made to a minimum value if the first potential is ground/source potential and active drive lines are driven to positive operation potential, for instance. In this case, the offset or the offset value may be subtracted from the calibration value.

The threshold value may be used to determine further threshold values or threshold ranges that are each valid only if a special number of keys are pressed within one column, for instance one key, two keys etc. or all keys. The further threshold values/ranges may be used to determine whether for instance more than a given number of keys are active or whether less keys than the given number of keys are active.

The calibration makes it possible to consider drift of temperature and/or voltage that may otherwise lead to wrong detection values. The operating potential of the ADC (analog digital converter) may be different from an reference potential of the ADC that is made smoother than the operation potential by an electrical filter device, for instance a PI-filter comprising coil(s) and capacitor(s). Thus differences between both potentials may occur. Especially, at the end of the detection range of the ADC there may be a nonlinear detection region that may result in wrong detections if no calibration is used.

The calibration line may be sensed and the threshold value may be determined after the activation of a drive line but before sensing of one of the sense lines, preferably for each drive line. This allows to take care of differences within the line drivers inner resistances, short time fluctuations of temperature, voltage or other conditions that may influence the sensing of the sense lines.

The threshold value may be a first threshold value that is used to calculate or to determine further threshold values or threshold ranges which indicate different numbers of activated input elements on a sensed sense line respectively. The exact number of input elements may be determined and used for an acceleration of a scan cycle of the complete matrix arrangement. This will be explained in more detail below.

The resistors or the resistors and the pull resistors may have the same resistance values, especially within a range of tolerance smaller than 5 percent, smaller than 3 percent or smaller than 1 percent with regard to the largest resistance value. Alternatively, the pull resistors may have a resistance value that is different from the resistors within the matrix. The pull resistors, especially without the pull resistor on the optional calibration line, may have a resistance value that is greater than the resistance value of the matrix resistors, for instance at least 75 percent or at least 100 percent greater than the resistance value of the matrix resistors.

The low tolerances allow a very exact determination of the number of pressed key switches within one column of the matrix arrangement, if this number is used to accelerate the scanning of the matrix. The low tolerances may also result in a calibration value that is non ambiguous.

The resistors may have a fixed resistance value, i.e. there is no pressure sensitivity of the resistors. Resistors that are not pressure sensitive are cheaper than pressure sensitive resistors.

The resistors or the resistors and the pull up/down resistors may be produced by carbon printing. Carbon printing is a low cost manufacturing method compared to the usage of discrete resistor elements.

The resistors may have a resistance values of at least 4.5 kilo ohms. Thus, there will be only small currents if a key is activated or pressed down.

The scanning of the matrix arrangement may be accelerated by at least one of the following measures:
a) it is determined how many input elements are being pressed or activated on a sensed sense line as soon as the first active input element is detected at this sense line based on the detected value and based on threshold values that indicate the number of active input elements, no further electrical signal is detected as soon as a number of active input elements is detected that is equal to the determined number of active input elements,
b) all drive lines are driven to the second potential and sense lines are determined that do not have activated input elements,
these determined sense lines are not considered during the scan of the matrix arrangement within the current scan cycle any more,
c) the order of driving the drive lines is dependent on the probability of activating input elements connected to the corresponding drive line,
d) a bisection method is used for driving the drive lines.

The first potential may be the positive operation potential. If the first potential is the positive operating potential of an integrated circuit or of a microprocessor or microcontroller, the second value may be the ground/source potential. This means that the scanning is done to ground/source potential. There are a lot more drivers that allow a "clean" driving to ground/source potential compared to drivers that also allow a clean driving to positive potential. There are a lot of drivers that allow for instance driving 8 mA against ground. However, this current cannot always be driven against positive potential. This means that good driving to ground may be a prerequisite for precise detection of a pressed key. This is valid all the more if a threshold value is used that is independent of the number of pressed keys at a sense line.

If the first value is the ground/source potential, the second value may be the positive operating potential of an integrated circuit or of a microprocessor or microcontroller. This alternative may be used if drivers are used at the drive line that draw to positive operation potential in a sufficient manner.

An input arrangement may comprise:
a plurality of input elements,
wherein the input elements are connected according to a matrix arrangement,
wherein the matrix arrangement comprises at least two drive lines that are each connected to a respective driving circuit,
wherein the matrix arrangement comprises at least two sense lines that may be used to detect active input elements,
whereby according to the matrix arrangement serial connections each comprising an input element and a resistor are each connected to a respective one of the drive lines and to a respective one of the sense lines.

Connected to a respective one of the drive lines and to a respective one of the sense lines means that the connection defines a unique position within the matrix.

This input arrangement may be used for the methods mentioned above. Therefore, the same technical effects are valid too.

The sense lines may be connected to a first potential by pull resistors, preferably by pull up resistors. There may be a control device for the driving circuits that drives an active drive line to a second potential that is different from the first potential and that drives a non active drive line or non active drive lines to the first potential or to a potential having an absolute offset value from the first potential that is at most 50 percent or at most 10 percent of the absolute value of the difference of the first potential and of the second potential.

This input arrangement may also be used for the methods mentioned above. Therefore, the same technical effects are valid too.

The matrix arrangement may comprise a calibration line. Reference resistors may be connected to the calibration line and to each drive line respectively. The calibration line may be connected to or connectable to a detection unit for detecting a calibration value.

The calibration line may be used to simulate the case that all key switches or input elements within one column of the matrix, i.e. on one sense line, are activated. This case may be the worst case for detection. Therefore, this case may be used to determine a threshold value that is used for the detection of active input elements later.

A threshold determination unit may be used that determines a threshold value that indicates the activation of an input element independently of the number of activated input elements or independently of at least two, three or at least four different numbers of activated input elements connected to the same sense line and/or that determines at least one threshold value that indicates the exact number of activated input elements connected to the same sense line. Both cases have been explained in detail above.

A detection unit (ADC) may be used on the sense line(s) and/or on the calibration line. The detection unit may be operated by an operation potential and may use a reference potential. The reference potential may be filtered in a smoother way compared to the operation potential of the detection unit. There may be a potential difference of for instance 0.1 volts between both potentials. However, the use of the calibration line makes sure that detection of the activation of input elements is not influenced by this potential difference.

The resistors or the resistors and the pull resistors may have the same resistance values, especially within a range of tolerance smaller than 5 percent, smaller than three 3 percent or smaller than 1 percent with regard to the largest resistance value. The resistors may have a fixed resistance value, i.e. there is no pressure sensitivity of the resistors. The resistors of the serial connections or these resistors and the pull resistors may be produced by cost effective carbon printing.

The serial connection may comprise a resistor that is unmovable with regard to a carrier substrate for the matrix arrangement. Alternatively, the serial connection may comprise a resistor that is movable with regard to a carrier substrate of the matrix arrangement. It may be much cheaper to have a resistor within an movable input element compared to a resistor that is mounted on the carrier substrate, for instance by carbon printing. However, the resistor within the movable input element may also be made by carbon printing.

The input arrangement may not include decoupling diodes within and/or connected to the matrix arrangement. Diodes are comparably expensive if compared with resistors. Furthermore, the decoupling and the prevention of ghost keying can be reached without using decoupling diodes as explained above for the method and for the input arrangement.

The driving circuit or the driving circuits for driving the driving lines may be connected directly to the drive lines or by using a serial resistor having a resistance smaller than 200 Ohm or smaller than 100 Ohm. The serial resistance may be tuned according to the wave resistance of a carrier substrate of the matrix arrangement.

Preferably there is/are no pull up or pull down resistor(s) connected to an output of the driver circuit(s), especially no pull resistors having resistance values greater than 1 kilo ohm or greater than 4 kilo ohms. The driving circuit(s) may have a hard potential level at its output as it is typically created by a push pull driver. This means that the output potential or the output voltage of the driving circuit remains essentially unchanged independent of the number of active input elements or keys within one column of the matrix arrangement. Especially, for the ground/source potential it is possible to have changes lower than 0.2 volts (200 mill volts) or even lower than 0.1 Volt (100 mill volts). This makes the detection of the pressed keys much easier, especially if threshold values have to be considered that are dependent of the number of pressed keys within one column of the matrix arrangement. Contrary to using a hard level is the usage of a "soft level". A soft level may be generated using pull up or pull down resistors. However, a soft level would vary within a much greater range compared to the variation of a hard level.

The driving circuit or the driving circuits may be output circuits of a microcontroller unit. In this case, no separate components are necessary for the drivers, which is very cost effective.

Description of General Embodiments—First Aspect

It is an object of the invention to provide an input arrangement that may be produced in a simple manner and that preferably deals with the problems of wrong key switch detection and/or of multiple key switch detection of key switches that are pressed at the same time. Furthermore, a corresponding method should be provided.

These problems are solved by the arrangement according to claim 21 and by the method according to the independent method claim. Embodiments are mentioned in the subclaims.

The invention relates to an input arrangement comprising the features mentioned above. The serial connection comprises a switching element which can be activated by a user for instance by a press down movement. The electronic characteristic between the terminals of the switching element, for instance the resistance, is changed if the switching element is activated. The serial connection also comprises at least one electronic component (element or device), for instance one (1) resistor or two resistors. Usually there are not more than two electronic components in addition to the switching element in the serial connection.

The first conductive line and a third conductive line form for instance the rows of a matrix. A second conductive line and a further conductive line form for instance the columns of the matrix. However, it is also possible to use a "matrix" with only one column, i.e. with only the second conductive line or only one sense line.

The connection is an electrical conductive connection and is for instance on a printed circuit board (PCB) that is made of a flexible or rigid material.

The analog digital converter may be directly coupled to the second conductive line, i.e. without additional electronic elements. Alternatively, a multiplexer may be used to map several conductive lines to only one input of the analog digital converter each at a different time. It is also possible to use a first analog digital converter on the second conductive line and to use a second analog digital converter on the further conductive line.

The input device is for instance:
- a keyboard, especially an alpha numeric keyboard having at least 50 key switches, usually not more than 150 key switches or not more than 2000 key switches. The keyboard may be a device separate to a computer or it may be an integral part of the computer, or
- a keypad having between 10 and 20 key switches, especially a keypad used for entrance control.

For instance the keyboard may comprise of at least one, two three, four, five or all of:
- at least 25 keys for the input of letters a, b, c etc.,
- at least 10 keys for the input of digits 0, 1, 2, etc., preferably combined with further input characters, for instance "!", """, "§", "$" etc.
- at least 10 keys for functions, i.e. function F1, function F2, etc.,
- at least 10 keys of a keypad for entering numbers, i.e. digits 0, 1, 2, etc., especially a further group of these numbers, —no further input characters are used for the keys of the further group,
- modifier keys as for instance defined in the HID (Human Interface Device) specification, i.e. left CTRL, left SHIFT, left ALT, left GUI (Graphic User Interface), i.e. for instance Microsoft left Win key, Macintosh Left Apple key, Sun left Meta key etc., right CTRL, right SHIFT, right ALT, right GUI,
- auxiliary keys: Caps Lock, Tab, Spacebar, Page Down, Page Up, Right Arrow, Left Arrow, Up Arrow, Down Arrow.

The analog digital converter may be a converter based on successive approximation or based on parallel encoding. It is also possible to use at least two comparator devices that compare at least two reference values and the signal on the second conductive line or that compare at least two reference values and the signal on the further conductive line to realize the converter.

The first conductive line and the third conductive line may be named as drive lines. The second conductive line and the further conductive line may be named as sense lines.

The drive lines may be connected with a driver that strobes or scans the drive lines according to a predetermined working scheme. All drive lines but one are preferably set to a first potential and the remaining drive line is preferably set to a different second potential with regard to the first potential. Strobing or scanning is done in sequence for all drive lines. The first potential is preferably higher than the second potential. The second potential is preferably ground potential.

The sense lines may be directly connected to the analog digital converter. Alternatively, a multiplexer may be coupled between each sense line and the analog digital converter input.

A third conductive line may be connected to a second serial connection of a second input element and a second electronic component or to a second input device having a high Ohmic state if active. Preferably, there may be at least six or at least eight conductive lines (drive lines).

The first conductive line may be connected to a further serial connection of a further input element and a further electronic component or to a further input device having a high Ohmic state if active.

A further conductive line may be connected to the further serial connection or to the further input device and preferably also to other serial connections or input devices. Thus there may be a number of column lines or of sense lines, for instance at least six or at least eight.

The analog digital converter may receive its input selectively from the first conductive line or from the further conductive line. Alternatively, a second analog digital converter is coupled to the further conductive line instead of the first analog digital converter.

The input elements or the input devices or all of the input elements or of the input devices may comprise only two terminals. A single pole single throw switch may be used, especially a pushbutton switch or corresponding semiconductor device. Single pole single throw switches have simpler construction compared to single pole double throw switches or push buttons. The input element may be normally open, i.e. if not activated or pressed down.

The analog digital converter may be a converter of output word length of at least two bits, of at least three bits, of at least four bits or of at least eight bits. This means that the resolution of the converter is 4 values, 8 values, 16 values, or 256 values or larger. Analog digital converters with longer word length may also be used, for instance 12 bit word length, i.e. having a resolution of 4096 values. Usually less than 20 bits word length are used.

The first electronic component and the second electronic component may comprise at least one resistor or resistive element, respectively. The resistors or resistive element may have resistance values larger than 4.5 kilo ohms or 5 kilo ohms or larger than 10 kilo ohms. The resistors may have values that are typically less than 100 kilo ohms. The resistive element may be a transistor that is integral to a touch screen. Furthermore, the same is true if no separate electronic component is used, i.e. the resistor or resistive element is part of the input device, for instance of a transistor that is used for switching.

Each of the resistors may have the same nominal value or the same Ohmic value within a tolerance of, for instance, plus 5 percent or minus 5 percent from an arithmetic mean value or a nominal value of the resistors. This allows a simple production of the keyboard.

Alternatively, the same values are used within groups of serial connections or input devices. However, different values are used in different groups on the same conductive line of the matrix, for instance on the same sense line. The amount of the resistivity is at least 50 percent larger in one group compared with the value in another group on the same sense line.

Each input element may comprise a switching element. The switching element may preferably comprise a mechanical switch that has contacts which by itself make physical contact if the switch is activated or pressed down. Alternatively a touch or pressure sensitive device may be used involving no movement of mechanical parts. Examples are touch screens and touch sensitive transistors.

Alternatively, it is also possible to use other types of switches, for instance touch sensitive switches that do not involve movement of mechanical parts, especially transistors that change resistance if activated by an operator or user.

Furthermore, hybrids of switches may be used. It is possible to use for instance dome-switches that comprise an electrical conductive dome that is pressed by a finger of the user against two interdigitated contacts.

The input device may comprise a processor, especially a microcontroller, that is coupled to or that comprises the analog digital converter. The microcontroller may also contain a memory and peripheral devices.

The input device may comprise an interface device which functions according to an international standard for data transmission between an input device and a computer, for instance PS/2 (personal system 2), i.e. having a make or break key switch signaling, or USB (Universal Serial Bus), i.e. sending multiple signals as long as a key switch is activated.

The input arrangement may comprise a control device which detects the activation of an input element or of an input device, for instance of a switch, depending on a threshold voltage that lies within the last third of signal change of the signal value at the beginning of the activation and of the signal value at the end of the activation of the switch. This means for a falling signal level that the debouncing of the signal has decreased already and the signal has a comparatively low level that is easy to detect.

Alternatively, the input arrangement may comprise a control device which detects the activation of an input element or of an input device, for instance of a switch, depending on a threshold voltage that lies within the first half or within the first quarter of the signal change of a signal value at the beginning of the activation and of the signal value at the end of the activation of the switch.

This means that the debouncing of the signal is still comparably high. However, the use of the analog digital converter allows accurate detection because it is possible to sample the signal while debouncing several times. The threshold value may be set or selected by a user of the input device, for instance to set the sensitivity of the switches of a keyboard.

It is possible to get a smooth value in contrast to the fast changing debouncing function by using a smoothing capacitor, for instance in combination with optimal statistical analysis. Alternatively it is possible to detect minima of the debouncing signal or values that are less than a high potential at the beginning of the activation of a key switch.

Maxima or values that are considerable higher than the low signal value may be detected if the signal is low at the beginning.

The control device may be realized by a processor, microprocessor or microcontroller and corresponding program. Alternatively an electronic circuit without a processor may be used for the control device.

The input arrangement may detect at least three states or at least four states of the input element or input device during activation depending on at least two threshold values. An example for three states is: not pressed, halfway pressed, fully pressed. New applications can be based on this multi state detection mechanism. A function may be prepared at the beginning of the activation and executed only if the switch is fully pressed, for instance.

The input device may comprise a second control device which detects the number of activated input elements or input devices connected to the second conductive line and/or the number of activated input elements or input devices connected to the further conductive line.

The second control device may be realized by a processor using another program. Alternatively, another hardware may be used, i.e. a circuit without a processor.

The second control device may comprise a threshold unit that sets at least two ranges of output values of the analog digital converter. The second control device may comprise a comparison unit which compares the output of the analog digital converter with the ranges in order to determine the number of switches activated on one of the conductive lines at the same time. The ranges may be predetermined by only one value for each range and a common value for the length of these ranges or by two values for each range, i.e. lower boundary value and higher boundary value. Detection accuracy can be increased if there are ranges between these predetermined ranges that are not used.

At least the first electronic component may comprise or may be a carbon resistor or at least the first input device may comprise a carbon resistor. The carbon resistor is preferably manufactured by carbon printing. There may be at least 90 atomic percent of carbon in the carbon resistor. Preferably, all resistive electronic components of the input arrangement, in particular all resistive electronic components within the input matrix, are carbon resistors.

The input arrangement maybe part of a device having a largest extend of lower than 20 centimeters and/or a weight of lower than 500 gram or lower than 250 gram. The resistor or resistive element may have a resistivity of at least 20 kilo ohms or at least 30 kilo ohms.

The weight relates to the complete weight, i.e. comprising the device and an accumulator or a battery. Such small devices may be portable, i.e. used mobile. It is important to have low energy consumption in such devices. This is true even for the keyboard or keypad.

The values of resistivity given allow a current of only about 0.15 milli amperes (mA) for each key that is pressed. This value is much lower than the current in known keyboards that have a value of for instance 0.3 milli amperes. The low value of current results in high energy efficiency.

Pull up resistors at the sense lines have also an influence to the current that is needed by the keyboard or keypad.

Alternatively, the input arrangement may be part of a device having a largest extend of at least 20 centimeters and/or a weight of more than 500 gram or more than 1 kilo gram. The resistor or resistive element may have a resistivity of at least 20 kilo ohms or at least 30 kilo ohms.

Energy efficiency is also an issue for larger devices, for instance for personal computers, servers, etc. These devices are usually operated at an accelerated current network having a voltage within the range of 100 volts to 300 volts, i.e. a network that is driven by a utility plant.

The input arrangement may be part of a device having a largest extend of at least 20 centimeters and/or a weight of more than 500 gram or more than 1 kilo gram. The resistor or resistive element may have a resistivity of lower than 20 kilo ohms or of lower than 15 kilo ohms or of lower than 10 kilo ohms.

The effect of reducing the values of resistivity is that the detection can be made faster. This may be important for keyboards that are used for playing computer games. A resistivity of 10 kilo ohms may result in a detection time that is about 1 milli second.

The invention also relates to an input method comprising the features mentioned above. The method may further comprise generating a key code depending on the digital value.

The detection of a potential may be preferred contrary to the detection of a current because detection is easier and more reliable.

The method may comprise determining an intermediate state of the activation of one of the switches or input devices.

It is possible to get a smooth value in contrast to the fast changing debouncing function by using a smoothing capacitor, for instance in combination with statistical analysis. Alternatively it is possible to detect minima of the debouncing signal or values that are less than a high potential at the beginning of the activation of a key switch. Maxima or values that are considerable higher than the low signal value may be detected if the signal is low at the beginning.

The threshold value may lie within the first half of a signal level change between pressed state and open state of the key switch. The threshold value may be set or selected by a user of the input device, for instance to set the sensitivity of the switches of the keyboard.

The method may comprise determining at least three states or at least four states during the activation of one of the switches or input devices. At least two threshold values may be used to detect a third state between open state and closed state. In other embodiments three or more than three threshold values are used, for instance four, five, six or more than six. New applications are possible by using this method, for instance preparing the execution of a function at the beginning of the activation and only executing the function if the switch is fully pressed.

The method may comprise determining the number of activated switches or input devices that are connected to the conductive line (sense line) depending on the digital value, wherein the number is preferably larger than 1. Thus, it is not only possible to avoid ghost keying but also to detect without an error multiple key switches that are activated at the same time.

The first resistor or the second resistor ma be made using carbon printing, i.e. a very effective manufacturing process.

The first resistor or the high Ohmic state of the first input device and the second resistor or the high Ohmic state of the second input device may have a resistivity of at least 20 kilo ohms or at least 30 kilo ohms.

Energy efficiency may be important for portable devices but even for larger devices as for instance personal computers. High resistivity results in lower current consumption and therefore lower overall energy consumption.

Alternatively, the first resistor or the high Ohmic state of the first input device and the second resistor or the high Ohmic state of the second input device may have a resistivity of lower than 20 kilo ohms or of lower than 15 kilo ohms or of lower than 10 kilo ohms.

It is possible to get very high detection rates if higher detection currents are used. The detection rate may be important for keyboards and keypads that are used in high speed application, as used in simulation programs and in computer gaming.

The methods may be performed using one of the devices mentioned above. The same technical effects as mentioned above are valid also for the method that uses the corresponding device.

Description—Second Aspect

Circuit Arrangement and Method for Controlling an Optical Element
Field of the Invention Second Aspect This invention generally relates to a control circuit and to a control method for the control of at least one optical element or for at least one driver for an optical element or for optical elements. The invention concerns more particularly such circuit arrangements which can be operated with high energy efficiency and with low energy consumption.

Background of the Invention—Second Aspect

A lot of control principles are known to control the current that flows through an optical element, especially through a semiconductor optical element, e.g. a light emitting diode (LED):
current limiting resistor,
linear drivers, i.e. voltage regulators,
oscillating drivers using switching on and off a switching transistor depending on two threshold voltages for the output voltage of the driver.

Summary of the Invention—Second Aspect

The invention relates to a circuit arrangement for controlling an optical element, comprising:
a converter that is controlled by a pulse width modulation signal,
at least one optical element or a driver circuit for at least one optical element connected to an output of the converter,
a first detection unit connected to or connectable to a first circuit branch that comprises the optical element or the driver, and
a digital control unit that is coupled to the first detection unit and to a controlling input of the converter and that controls the current that flows through the at least one optical element or through the driver by controlling the output voltage of the converter.
Furthermore, the invention relates to a method for controlling an optical element, comprising:
controlling the current that flows through at least one optical element or through a driver circuit for at least one optical element by digitally controlling the output voltage of a converter that is controlled by pulse width modulation (PWM), additionally a pulse frequency modulation (PFM) may be used.

Description of General Embodiments—Second Aspect

It is an object of the invention to provide a circuit arrangement for controlling, especially with regard to brightness, an optical element, in particular operating with high efficiency, low energy consumption and/or enabling a large value of brightness of the optical element. Furthermore, a corresponding method has to be provided.

These problems are solved by the device according to claim 43 and by the method according to the independent method claim. Embodiments are given in the subclaims.

The circuit arrangement may comprise the features mentioned above. This circuit arrangement may use a voltage control of the converter, e.g. of a voltage converter, in order to control the current of the optical element or of the driver. This is contrary to a current control that may be used in the case of a strongly non linear voltage current characteristics of the optical device or of the driver. Nevertheless, the circuit arrangement may use voltage control because the digital controlling is based on the individual detection of characteristics of the optical element or driver, especially voltage to current characteristic curve or current to voltage characteristic curve. Alternatively or additionally, other characteristic curves may be considered, for instance the duty cycle versus the voltage characteristic curve of the voltage converter.

Furthermore, the circuit is able to use voltage control instead of current control because both the non linear characteristic of the converter and the non linear characteristic of the LEDs may also be considered for controlling.

The detection unit may be an analog digital converter (ADC). The bit length of the ADC may be in the range of four bits to twenty bits or more. A multiplexer may be used between the first circuit branch and the detection unit.

The optical element may be or may comprise a semiconductor element, for instance an LED (Light Emitting Diode), a laser diode, an IR-diode (Infra Red) or an UV diode (Ultra Violet).

The non linear characteristic of the optical element or of a string of optical elements or a bundle of strings of optical elements may be an exponential function or may resemble an exponential function. This means that adjustments of the point of operation are much harder compared to elements with linear characteristics or to direct current control because small changes in voltage result in comparably large changes in current, in particular at the end of the range. It is possible to use an appropriate control strategy to find the proper point of operation, for instance by sampling the complete individual characteristic. The same is true with regard to drivers for optical elements.

The converter may be a voltage converter, for instance a DC/DC converter (Direct Current/Direct Current). The converter may be a step-down converter (buck converter), an inverter or a step up converter (boost converter). These kinds of converters comprise one inductive element as well as one switch and one diode or alternatively an inductive element and two switches. The switch is preferably an electronic switch, i.e. a transistor, for instance a FET (Field Effect Transistor) or a MOSFET (Metal Oxide Semiconductor FET). Other kinds of converters may also be used, for instance fly back converters.

There may also be a non linear characteristic curve of the voltage converter. The converter may have a low efficiency in an operation mode with a low load or low output power (PWM-Mode). There may be a high efficiency if the load or output power is much larger. The converter is usually designed for this normal mode. However, non linear characteristics of voltage converter and of the optical elements/drivers may be taken into consideration if an overall characteristic of the converter and of the optical element(s)/driver(s) is detected at least once, for instance at the end of the production of the circuit arrangement, each time the circuit arrangement is switched on or if there is a temperature change that may also be detected, or according to other strategies.

The first detecting unit, for instance an analog digital converter, may be directly coupled to the first circuit branch or a multiplexer may be used between the first circuit branch and the first detecting unit or first analog digital converter.

The controlling may be done using a closed loop. Alternatively, open loop controlling may be used.

The first circuit branch may be free of a further electronic device for current regulation within the first circuit branch in addition to the converter. Especially, the first circuit branch does not comprise a transistor for current control. This means that only the voltage control is used to control the optical element or the driver of the optical element automatically. Even if a resistor is used within the first circuit branch, the value of the resistivity may be less than the value of a current limiting resistor.

The first circuit branch may comprise a resistive element or resistor and the first detection unit may be connected to or connectable to a connection between said at least one optical element or the driver circuit and the resistive element or the resistor. The resistor may have a low tolerance, for instance one percent or smaller than one percent. The resistor or the resistive element allows the detection of the current within the branch by using the first detection unit.

The value of the resistor is preferably smaller than the value of a current limiting resistor (protection resistor) that would be necessary for the optical element or optical elements. The Ohmic value of the resistor may be in the range of 1 Ohm to 50 Ohm, for instance.

The value of the detected current may be used to calculate the current power, i.e. the power that is consumed at the time being, of the optical element(s).

The first detection unit may be connected to or may be connectable to at least one further circuit branch that comprises at least one further optical element or a further driver for at least one further optical element. This means that a sum or mean value of the current may be detected, especially an arithmetic mean value.

It may be sufficient for many applications to detect only the current and to use the voltage of the converter to set a current or to change the current.

Alternatively the first detection unit may detect the output voltage of the voltage converter.

A second detection unit may be connected to or may be connectable to the first circuit branch, especially to the output of the converter. The second detection unit may be a second analog digital converter that detects the output voltage of the voltage converter, especially in the case in which the first detection unit is used for the detection of a current. The bit length of the second ADC may be in the range of four bits to twenty bits or more. Alternatively, the second detection unit may comprise a part of a multiplexer and an analog digital converter, for instance the first analog digital converter.

The second detection unit may be connected to a tap of two resistors that are connected in a serial connection, i.e. of a voltage divider. This serial connection may be connected to the circuit branches and/or to the output of the voltage converter. A unity gain amplifier or a voltage follower may be coupled between the voltage divider and the second detection unit.

The second detection unit may be used with or without the first detection unit.

The detection of the output voltage of the voltage converter and of the current in a circuit branch allows determining the electric output power within one circuit branch or within a plurality of circuit branches containing only one optical element or several optical elements or drivers. The output voltage and the current may be used to get pairs for the voltage versus current characteristic of the optical elements. The output voltage alone may be used to detect the overall non linear duty cycle versus voltage characteristic of the voltage converter and of the optical element(s) or of the driver(s) of the optical element(s).

A third detection unit may be connected to or may be connectable to an input of the voltage converter or of the circuit arrangement. The third detection unit may be a third analog digital converter. The bit length of the third ADC may be in the range of four bits to twenty bits or more. Alternatively, the third detection unit may comprise a multiplexer and an analog digital converter, for instance the first analog digital converter or the second analog digital converter. The third detection unit may determine the voltage or the current at the input of the voltage converter or of the circuit arrangement.

In case of a voltage detection a voltage divider and/or a unity gain amplifier may be used. The value of the input voltage of the circuit arrangement may be used to detect brake down conditions of the voltage and to act accordingly. This is especially important if the circuit arrangement is operated via an USB (Universal Serial Bus) interface.

The third detection unit may be used with or without the first detection unit and/or with or without the second detection unit.

A fourth detection unit may be connected to or may be connectable to an input of the voltage converter or of the circuit arrangement. The fourth detection unit may be an analog digital converter. The bit length of the ADC may be in the range of four bits to twenty bits or more. Alternatively, the fourth detection unit may comprise a multiplexer and an analog digital converter, for instance the first analog digital converter or the second analog digital converter or the third analog digital converter.

The fourth detection unit may detect the input current of the circuit arrangement, i.e. voltage converter and a microcontroller, for instance. A resistor or a resistive element within the input line of the voltage regulator or of the circuit arrangement may be used for current detection. The resistive element may be part of an inductive element, for instance of an inductive element that is used to fulfill the USB standard. A resistive capacitive network may be used to detect the input current at the inductive element. This is known as DCR sensing (Direct Current Resistance). Other ways of sensing the input current may be used as well.

The detection of input voltage and input current of the voltage converter allows determining the input power.

The value of the input current may be compared with a maximum current value of a standard, for instance an international standard, especially USB (Universal Serial Bus) or PS2 (Personal System 2), that is used to connect keyboards to a computer.

The fourth detection unit may be used with or without the third detection unit and/or also with or without the first detection unit and/or with or without the second detection unit.

Thus it is possible not to use any multiplexer connected to an ADC. It is also possible to use only one or two analog digital converters and a multiplexer circuit. It is possible to use only one multiplexer or more than one multiplexer.

The circuit arrangement may comprise a processor wherein the processor is coupled to an output of the first detection unit and to the voltage converter, especially to a controlling terminal of the voltage converter. The processor may also be coupled to the other detection units that are used. The processor may be a microprocessor or a microcontroller. A microcontroller comprises a processor, a memory and input/output devices.

The circuit arrangement may comprise an interface circuit that forms the interface between a computer and a keyboard or another peripheral device, especially according to one of the USB (Universal Serial Bus) standards, i.e. 1.0, 2.0, 3.0 or higher, or to the PS2 (Personal System 2) standard. There are special problems for these interfaces:
    the voltage, power and/or current at the interface has to be within a nominal range, especially lower than a maximum voltage or a maximum current, and/or
    it may be important to avoid current states and/or voltage states that are outside the limits defined in the standard.

The circuit arrangement may comprise a plurality of input elements that are illuminated by the at least one optical element. Wave guides made of glass or of plastic may be used to conduct the light to the input elements. The input elements may be mechanical switches, movable switches or touch elements for switching. There are special requirements for these kinds of illumination, for instance:
    maximum brightness, and/or
    limits set by an interface standard have to be obeyed, and/or
    low power consumption is essential.

These requirements may be fulfilled by using a control strategy that is based on the detection values of at least one detection unit or ADC (Analog Digital Converter), of two detection units/ADCs, three detection units/ADCs or four detection units/ADCs. Alternatively, it is possible to use multiplexers and to use only one ADC that is connected or connectable to different detection points of the circuit arrangement by the multiplexer. Non linear characteristics of a voltage converter and of optical elements or drivers for optical elements may be included within the control strategy.

The circuit arrangement may comprise a further control unit that determines at least one characteristic curve of the circuit arrangement within a range that comprises at least 50 percent or at least 75 percent of the overall working range of the circuit arrangement. The range may comprise more than three decades, for instance currents of micro amperes and currents of several milli amperes. Within this range there may also be several modes of operation of the voltage converter. Thus, there may be an automatically determining of the overall characteristic of the circuit arrangement.

The characteristic curve may be determined for instance:
    only once at the end of the production of an electronic device that comprises the circuit arrangement, for instance a keyboard,
    each time the circuit arrangement is switched on,
    several times between switching on and switching off the circuit arrangement,
    especially periodically, for instance once, more than 10 times, more than 100 times or more than 1000 times each minute, but preferably less than 10000 times each minute,
    depending of change in temperature etc.

Pairs of values may be stored in a memory. An interpolation method may be used to get values between the stored pairs of values. Spline interpolation and/or extrapolation may be appropriate, for instance.

The circuit arrangement may comprise a further control unit that changes the frequency of the pulse width signal that is used to control the voltage converter depending on the load at the output of the voltage converter. There may be a first PWM mode if there flow only micro amperes through the optical element(s). The frequency within the first PWM mode may be higher than the frequency for higher loads or output powers of the converter.

There may be a first relationship between duty cycle and output voltage of the voltage converter. A plateau may follow at which there is no change of output voltage with increasing duty cycle. In a normal mode or inductive mode of operation, there may be a third relationship between duty cycle and output voltage of the voltage converter.

The higher frequency within the first PWM mode may reduce the length of the plateau.

The frequency of the PWM signal may be decreased at the end of the range, i.e. for higher loads, in order to make controlling easier. Decreasing frequency allows more exact controlling. The frequency may be reduced within the range of 25 percent to 75 percent, preferably in a stepwise manner.

A PFM (pulse frequency modulation) may be used for lower output powers of the converter alternatively to a higher frequency within the first PWM mode. PFM may lead to a lower frequency resulting in less exact controlling. However, this is tolerable within the range of lower power as the absolute change caused by an asserted relative change due to the smaller power is smaller anyway. The lower power is for instance below 500 Milliwatt or below 100 Milliwatt.

At least one of the detection units or all of the detection units may comprise or consist of an analog digital converter. The analog digital converter may have a resolution in the range of four bits to twenty bits or more. An analog digital converter enables a digital data processing that is more flexible compared to analog data processing.

The control unit may comprise a first sub unit that is preferably coupled to the first detection unit. The first sub unit may detect pairs of values of the duty cycle of a control signal of the converter and of corresponding current values of a current that flows through the at least one optical element. Alternatively, pairs of values of the output voltage of the converter and of corresponding current values of a current that flows through the at least one optical element may be detected.

The first sub unit may be responsible for the controlling of brightness at operation points that are far enough from a maximum power, current or voltage. A second sub unit may be responsible for the controlling at points that are close to operation points near or closely to the maximum power, current or voltage. The second sub unit will be described in more detail below.

Here, the challenge is to do the controlling although there are exponential functions involved that play a major role. The slope of an exponential function becomes steeper and steeper with increasing x-values. Furthermore, the brightness of the optical element or elements is very sensitive with regard to smallest changes of the duty cycle or of the output voltage of the voltage converter. The embodiment is based on the consideration that different control strategies may be used for different operation points.

The first sub unit may comprise a calculation unit that calculates the duty cycle or the output voltage of the converter depending on a value of the current. This calculation unit may comprise a microcontroller or another processor that performs instructions which are stored in an electronic memory.

The first sub unit may comprise an interpolation unit that finds a curve that goes through the pairs of values. Spline interpolation may be used, for instance by using cubic splines or quadratic splines. However, other interpolation methods may also be used.

Alternatively or additionally, the first sub unit may comprise an iteration unit that finds a duty cycle or an output voltage which is valid for the value or for a given value of the current. A Newton iteration or another iteration may be used. The iteration allows an improvement of the result by each step. Further control units may be used to find appropriate starting values.

The first sub unit may comprise a changing unit that changes the duty cycle or the output voltage of the converter depending on a deviation of the current (I) value that flows through the at least one optical element and of a reference current or another reference value. This digital closed loop control results in a compensation of a drift to higher values of the current and also of a drift to lower values of the current. The current will drift to higher values if the temperature of the circuit arrangement rises, for instance due to long operation. The temperature may fall due to external conditions, for instance an open window.

The first sub unit may comprise a first slope calculation unit that calculates the slope of a curve at a current above the reference current and that uses this slope to calculate a new value of the duty cycle or of the output voltage. Alternatively or additionally, the first sub unit may comprise a second slope calculation unit that calculates the slope of a curve at the reference current and that uses this slope to calculate a new value of the duty cycle or of the output voltage. Both embodiments use a greater slope at greater values of the relevant curve, i.e. a steeper slope if exponential functions are involved. This allows a very exact and fast calculation.

The second slope calculation unit may be used with or without the first slope calculation unit.

The control unit may comprise a second sub unit and preferably a unit that determines a maximum electric power or voltage or current. Thus, the second sub unit may consider the maximum. There may be restrictions near the maximum that have to be obeyed. Furthermore, the controlling near the maximum may be more complicated than controlling at other points of operation. Therefore, a special second sub unit may be used. Further actions or alternative actions may be taken near the maximum, for instance reducing the frequency of the PWM signal controlling the converter.

The second sub unit may be used with or without the first sub unit.

The maximum electric power or voltage or current may be considered during the detection of relevant curves or during the detection of pairs of values that are the base for finding the relevant curves. Furthermore, the maximum may have to be lowered during the operation of a keyboard if a further device is plugged into one peripheral interface of several interfaces having the same power supply, for instance into an USB port. Removing a device from these peripheral interfaces of the computer may lead to an increase of the maximum.

The second sub unit may preferably be coupled to the first detection unit and the second sub unit may preferably detect pairs of values of the duty cycle of a control signal of the converter and of corresponding current values of a current that flows through the at least one optical element. Alternatively, pairs of values of the output voltage of the converter and of corresponding current values of a current that flows through the (i.e. said) at least one optical element may be detected. The first detection unit may be an analog digital converter that detects the overall current through strings of optical elements or the medium current through these strings. The overall current may be estimated by multiplying the medium current by k, i.e. the number of parallel strings of optical elements. Alternatively, only one optical element may be used or a parallel connection of single optical elements or a summing up of the separately measured string currents.

The maximum may be considered during the detection of the pairs of values. Thus, it is possible to remain within an operation area or range that is within a specification which demands that the maximum is not exceeded.

The second sub unit may comprise at least one, two or all of the following units:
 an extrapolation unit that calculates a curve that extends to the maximum, and/or
 a slope calculation unit that calculates the slope of a curve at the maximum, and/or
 a calculation unit that is coupled to the slope calculation unit and that calculates a duty cycle or an output voltage that is closer to the maximum than the other pairs of values.

Splines are again a good choice for functions that allow a good extrapolation, in particular with functions that on the whole domain or range may be continuously differentiated at least once to get the slope at a specified point of the extrapolated curve.

The other pairs of values may already have been detected. The new duty cycle or the new output value may be used to control the voltage converter. Then, a new pair of values may be detected. The new pair of values may then be used to get even closer to the maximum.

The second sub unit may comprise an iteration unit that is coupled to the slope calculation unit of the second sub unit and to the calculation unit. The iteration allows a successive extension of the relevant curve without exceeding the maximum.

The iteration unit may be coupled to the extrapolation unit. The extrapolated curve may be updated several times during the iteration. This allows a very exact iteration that is finally faster than an iteration without updated extrapolation curves. There may be only a few iteration steps, for instance less than ten or even less than five iteration steps.

The iteration may also be performed without an update of the extrapolated curve. This may be sufficient for some applications.

The second sub unit may comprise a changing unit that changes the duty cycle or the output voltage of the converter depending on a deviation of the current value that flows through the at least one optical element and of a reference current. Thus digital control of brightness is also possible near the maximum of power, current or voltage.

The second sub unit may comprise a first slope calculation unit that calculates the slope of a curve at a current above the reference current and that uses this slope to calculate a new value of the duty cycle or of the output voltage.

Alternatively or additionally, the second sub unit may comprise a second slope calculation unit that calculates the slope of a curve at the reference current and that uses this slope to calculate a new value of the duty cycle or of the output voltage. In both cases a the calculated slope value will be very near to the real one. This allows a very exact and fast calculation.

The second slope calculation unit may be used with or without the first slope calculation unit.

The circuit arrangement may comprise a unit that determines a maximum electric power or voltage or current. The unit that determines a maximum may be coupled to a detection unit that determines the input voltage of the circuit arrangement and/or of the voltage converter, and/or to a detection unit that determines the input current of the circuit arrangement and/or of the voltage converter. Both detection units may be analog digital converters. It is possible to estimate for instance the maximum power based on a voltage drop of the input voltage of the circuit arrangement. Alternatively, an input current may be detected and used to calculate the electric power, for instance for comparably constant input voltage of the circuit arrangement due to voltage regulation.

The invention also relates to a method for controlling an optical element, comprising:
controlling the current that flows through at least one optical element or through a driver circuit for at least one optical element by digitally controlling the output voltage of a voltage converter that is controlled by pulse width modulation (PWM), additionally a pulse frequency modulation (PFM) may be used.

For the method the same technical effects are also relevant that are mentioned above for the circuit arrangements. Controlling digitally means here that at least one analog digital converter and/or a processor is used, contrary to a pure analog circuit, for instance.

A characteristic curve of the circuit arrangement may be determined within a range that comprises at least 50 percent or at least 75 percent of the overall working range of the circuit arrangement. The technical effects are mentioned above.

The frequency of the pulse width signal that is used to control the voltage converter may be changed depending on the load at the output of the converter. Higher frequencies may be used for lower duty cycles compared to the frequencies that are used for higher duty cycles. Lower frequencies may be used near maximum output power of the voltage converter. The frequency may be reduced within the range of 25 percent to 75 percent, preferably in a stepwise manner.

A PFM (pulse frequency modulation) may be used for lower output powers of the converter alternatively to a higher frequency within the first PWM mode. PFM may lead to a lower frequency resulting in less exact controlling. However, this is tolerable within the range of lower power as the absolute change caused by an asserted relative change is smaller anyway.

At least one, at least two, at least three, at least four or all of the following currents or voltages may be detected:
an input voltage of the voltage converter or of the circuit arrangement,
an input current of the voltage converter or of the circuit arrangement,
an output voltage of the voltage converter,
a current that flows through the at least one optical element or through the driver of an optical element, and
an output current of the voltage converter.

Only one detection unit and a multiplexer or several detection units may be used, preferably analog digital converter(s).

One of the circuit arrangements that have been described above may be used to perform one of the methods mentioned above. There will be method steps that correspond to the units of the circuit arrangement.

Description—Third Aspect

Methods for Transmitting Key Codes and Corresponding Keyboards

Field of the Invention—Third Aspect

The invention relates to methods for transmitting key codes and corresponding keyboards, especially virtual keyboards.

Background of the Invention—Third Aspect

Such methods are specified for instance within the USB x.0 (Universal Serial Bus) specification and/or in the HID (Human Interface Device) specification or in other specifications. However, these specifications do not specify all relevant methods and parameters. Thus there is room for further development during the implementation phase of these specifications.

Summary of the Invention—Third Aspect

The invention relates to a method for transmitting key codes, comprising:
using first report data containing a first report identifier for the transmission of a first group of key codes,
using second report data containing a second report identifier for the transmission of a second group of key codes, wherein the second report identifier has a different value than the first report identifier.

The invention relates also to a keyboard, comprising a memory in which a report descriptor is stored, the report descriptor defining:
  first report data containing a first report identifier for the transmission of a first group of key codes,
  second report data containing a second report identifier for the transmission of a second group of key codes, wherein the second report identifier has a different value than the first report identifier.

Furthermore, the invention relates to a method for transmitting key codes, comprising:
  using first endpoint data containing a first endpoint identifier for the transmission of a first group of key codes,
  using second endpoint data containing a second endpoint identifier for the transmission of a second group of key codes, wherein the second endpoint identifier has a different value than the first endpoint identifier,
  wherein the number of key codes within the first group is preferably in the range of 1 to 6, and
  wherein the number of key codes within the second group is in the range of 7 to 20 or 7 to 500.

The invention relates also to a keyboard, comprising a memory in which a first endpoint descriptor and a second endpoint descriptor are comprised,
  the first endpoint descriptor defining a first endpoint identifier for the transmission of a first group of key codes,
  the second endpoint descriptor defining a second endpoint identifier for the transmission of a second group of key codes, wherein the second endpoint identifier has a different value than the first endpoint identifier,
  comprising further a control unit that controls the transmission of a first number of key codes within the first group and that controls the transmission of a second number of key codes within the second group,
  wherein the number of key codes within the first group is preferably in the range of 1 to 6, and
  wherein the number of key codes within the second group is in the range of 7 to 20 or 7 to 500.

Description of General Embodiments—Third Aspects

It is an object of the invention to provide simple but effective methods for transmitting key codes. Furthermore, corresponding keyboards have to be provided. Especially, fast methods shall be given and/or methods that can be performed with low cost integrated circuits. Furthermore, it may be important that the methods and the keyboards that implement the method can work together with different kinds of BIOS (Basic Input Output System) and/or main operating systems (OS).

At least one of these problems is or all of these problems are solved by the method according to claim 77 and by the other independent method for transmitting key codes and by the keyboards according to the independent claims. Embodiments are given in the subclaims.

The method for transmitting key codes may comprise:
  using first report data containing a first report identifier for the transmission of a first group of key codes,
  using second report data containing a second report identifier for the transmission of a second group of key codes, wherein the second report identifier has a different value than the first report identifier.

The report data may be comprised within a set of data. The boundaries of the set may be defined in various ways, for instance by instruction to a parser, by predefined payload data of a data packet etc. The report identifier may be a number. Alternatively the sequence of data sets may have the function of an identifier, i.e. first data set belonging to first identifier an second data set belonging to second identifier and so on.

Each data set may comprise at least one key code or typically a plurality of key codes. The key codes may be defined for at least one operating system, for instance Mac OS, Windows, Linux/Unix etc.

A group of key codes may comprise a number of key codes. The using of different groups may result in a very fast transmission method, especially when it is allowed to transmit only a group that contains key codes and to sent no or only a short data for groups that do not include key codes at the moment.

The transmission of many key codes may be necessary for games and/or for applications that use macros, i.e. input data that has been recorded earlier. Many key codes have to be transmitted if multiple keys are pressed at the same time. This is also true for gaming but also for other applications.

The technical effect of using different reports is that it may not be necessary to use too many endpoints, for instance the endpoints that are defined within the USB x.0 framework. The number of available endpoints may be limit by the design of a chip or integrated circuit. Only two endpoints or less than four or less than five endpoints may be supported. The number of reports may not be limited.

It is possible to define the maximum number of key codes for each group in advance, i.e. for the first group, for the second group or for further groups. Many operating systems may be considered and/or boot protocols for booting the BIOS (Basic Input Output System).

The BIOS is very closely related to the hardware of a computer and enables simple inputs from a keyboard for instance and simple outputs to a screen. The BIOS may comprise methods that allow the start of an operating system as for instance Windows, Mac OS, Linux/Unix. The operating system usually uses methods of the BIOS, preferably via interrupt vectors.

Just a single report with no identifier is used during booting of the BIOS. Thus, only one type of report can be used during booting.

The first report data may fulfill the HID specification and/or the second report data may fulfill the HID specification.

The full name of the HID specification is: Universal Serial Bus (USB)—Device Class Definition for Human Interface Devices (HID), Firmware Specification Jun. 27, 2001, Version 1.11, or higher or lower, USB Implementers' Forum. Alternatively, a specification may be used that is based on one of these specifications.

However, the HID specification/protocol is not only valid for USB but also for a lot of other protocols or specifications, for instance for Bluetooth.

The HID specification allows the definition of reports. However, it does not state that several reports may be used for the same input device, especially for only one keyboard.

The data structure of the first report data may be defined according to a report descriptor that fulfills the HID specification and/or the second report data may be defined according to a report descriptor that fulfills the HID specification. Also, the second report data may be defined in the same report descriptor that defines the first report data, for instance within a different section. Thus, it is possible to define the report data within the same data structure allowing easy programming and easy maintenance.

The report descriptor for the first report data may comprise at least one or all of the following data fields:
- report size, i.e. the number or length of data for each report,
- report count, i.e. the number of repetitions of the report data of the same kind,
- report identifier, for instance a number that indicates the first report,
- input, i.e. an instruction that gives the special input format,
- output, i.e. an instruction that gives the special output format.

All these fields are in line with the HID specification. The sequence of the fields may again be different from the sequence given above. The first report descriptor may comprise further data fields, for instance giving the details of the data as maximum value and/or minimum value.

The report descriptor for the second report data may comprise at least one or all of the following data fields:
- report size, i.e. the number or length of data for each report,
- report count, i.e. the number of repetitions of the report data of the same kind,
- report identifier, for instance a number that indicates the second report,
- input, i.e. an instruction that gives the special input format,
- output i.e. an instruction that gives the special output format.

Again, all these fields are in line with the HID specification. The sequence of the fields may again be different from the sequence given above. The second report descriptor may comprise further data fields, for instance giving the details of the data as maximum value and/or minimum value.

All data fields of the first report descriptor and of the second report descriptor are in line with the HID specification. Thus the keyboards and computers of different hardware manufacturers may be work together without problems.

The key codes may correspond to the keys of the same input device, for instance to the keys of only one keyboard. An example for the keyboard is described in more detail below.

Alternatively or additionally, each key code may comprise a number of bits in the range of 2 to 8, typically 8 bits, i.e. 1 byte. Thus there is a difference between a key code of a keyboard and a button that has logical switching or signaling states 1 and 0, i.e. on and off.

The input device may be a keyboard or may comprise a keyboard, wherein the keyboard has at least 100 key switches.

For instance the keyboard may comprise of at least one, two three, four, five or all of:
- at least 25 keys for the input of letters a, b, c etc.,
- at least 10 keys for the input of digits 0, 1, 2, etc., preferably combined with further input characters, for instance "!", """, "§", "$" etc.
- at least 10 keys for functions, i.e. function F1, function F2, etc.,
- at least 10 keys of a keypad for entering numbers, i.e. digits 0, 1, 2, etc., especially a further group of these numbers, —no further input characters are used for the keys of the further group,
- modifier keys as for instance defined in the HID specification, i.e. left CTRL, left SHIFT, left ALT, left GUI (Graphic User Interface), i.e. for instance Microsoft left Win key, Macintosh Left Apple key, Sun left Meta key etc., right CTRL, right SHIFT, right ALT, right GUI,
- auxiliary keys: Caps Lock, Tab, Spacebar, Page Down, Page Up, Right Arrow, Left Arrow, Up Arrow, Down Arrow.

However, other or further key codes may also be used.

The key codes may be defined according to the HID specification and/or according to a "keyboard scan code specification" of an operating system manufacturer.

All or at least some of the key codes for these keys may correspond to: Microsoft, Windows Platform Design Notes—Designing Hardware for the Microsoft Windows Family Operating System—Keyboard Scan Code Specification, Revision 1.3a—Mar. 16, 2000 or higher or lower. Alternatively, a specification may be used that is based on one of these specifications. Especially, Appendix C is relevant, i.e. USB Keyboard/Keyboard Page (0x07). Other manufacturers of computers and/or operating systems do also have corresponding specifications using the same values, for instance Apple.

Examples of key codes are:
- "a" or "A"=hex 04 (hexadecimal), "b", or "B"=hex 05, "c" or "C"=hex 06 etc.
- "0"=hex 27, "1"=hex 1E, "2"=hex 1F, etc.,
- function F1=hex 3A, function F2=hex 3B, etc.,
- keypad: "0"=hex 62, "1"=hex 59, "2"=hex 5A, etc.,
- auxiliary keys: Caps Lock=hex 39, Tab=hex 2B, Spacebar=hex 2C, etc.

Examples of modifiers are:
- left CTRL=hex E0,
- left SHIFT=hex E1, etc.

However, according to USB a bitmap of eight bits, i.e. one byte, has to be used for the modifiers instead of a code.

The key codes of the first group and/or the key codes of the second group may belong to keys that have been pressed within a time period of less than 1 second or less than 500 milli seconds.

The time period may be greater than 1 micro second, for instance. These time periods may be relevant for gaming, i.e. a person or user presses for instance eight keys with eight fingers at the same time, the thumbs may press a further key or further keys at the same time. Furthermore, these time periods may be relevant if macros are played that have been recorded earlier. It is also possible to use a combination of keys that are pressed within the time period and keys that are played by a macro within this period.

The key codes of the first group and or the key codes of the second group may be stored in a memory for a time period that is longer than 1 minute. The time period may be lower than 10 years or lower than 1 year, for instance. This is the case if only macros are played for key codes. The macros may be recorded or programmed earlier.

A mouse macro may also be used. However, the inputs of the computer mouse may be transmitted using different reports. Other input and output devices may also be used.

At least one key code of the first and/or second group may not be stored within a macro. At least one key code of the first and/or second group may be stored within a macro. This means that a combination of keys that are pressed by a user and macros that have been recorded or programmed earlier may be used. The key codes of pressed keys may only be within the first group and the key codes of a macro may only be within the second group or vice versa. Alternatively, key codes of pressed keys and of a macro may be within the first group and/or key codes of pressed keys and the key codes of a macro may be within the second group.

The number of key codes within the first group may be in the range of 1 to 6, especially without modifiers. Lots of operating systems can handle these ranges. This means that the input device, for instance the keyboard may be selectively used with two or more operating systems.

The number of key codes within the second group may also be in the range of 1 to 6, especially without modifiers. Most operating systems can handle these ranges. If both reports comprise a number of key codes within these ranges it is possible to transmit all key codes completely. This may be important for some applications, for instance gaming.

Alternatively, the number of key codes within the second group may be greater than the number of key codes within the first group, for instance greater than 10 or greater than 20 or greater than 50. This very huge report allows a reduction of the number of reports for large amounts of key codes within on transmission period. The number of key codes within the second report may be smaller than 500 or smaller than 200 or smaller than 100. At least the first group may be used if the main operating system is not able to deal with the larger second group.

The invention relates also to a keyboard, comprising a memory in which a report descriptor is stored, the report descriptor defining:
  first report data containing a first report identifier for the transmission of a first group of key codes,
  second report data containing a second report identifier for the transmission of a second group of key codes, wherein the second report identifier has a different value than the first report identifier.

Therefore, the same technical effect are valid that have been mentioned for the method for transmitting key codes, i.e. the method according to claim 1.

The keyboard may be used to perform a method according to one of the embodiments given above. Again, the same technical effects as given for these embodiments above are also valid for the keyboard.

The computer driver or the device driver, for instance of the input device, has not to be modified for windows or one of the other operating systems mentioned above. However, there may be operating systems that need a modification of the driver software if the invention shall be used.

Furthermore, the invention relates also to a further method for transmitting key codes. This method may comprise:
  using first endpoint data containing a first endpoint identifier for the transmission of a first group of key codes,
  using second endpoint data containing a second endpoint identifier for the transmission of a second group of key codes, wherein the second endpoint identifier has a different value than the first endpoint identifier,
  wherein the number of key codes within the first group may be preferably in the range of 1 to 6, especially without modifiers, and
  wherein the number of key codes within the second group may be in the range of 7 to 20 or 7 to 500, especially without modifiers.

Thus the number of key codes in the first group may be lower than the number of key codes in the second group.

The ranges for the second group may be from 7 to 20 or from 7 to 500, especially if modifiers are not counted.

The endpoints may be defined according to USB 2.0 or higher or lower. Alternatively, the endpoints may be defined according to a standard or specification that is based on one of these specifications.

The technical effect is a reduction of the number of reports and/or endpoints. At least the first endpoint may be used if the main operating system cannot deal with larger reports.

With regard to the kind of key codes and/or the kind of keyboard kindly see the description of the first method for transmitting key codes above and the description of corresponding subclaims or embodiments as mentioned above.

The invention relates to a keyboard, that may comprise a memory in which a first endpoint descriptor and a second endpoint descriptor may be comprised:
  the first endpoint descriptor may define a first endpoint identifier for the transmission of a first group of key codes,
  the second endpoint descriptor may define a second endpoint identifier for the transmission of a second group of key codes, wherein the second endpoint identifier has a different value than the first endpoint identifier,
  comprising further a control unit that controls the transmission of a first number of key codes within the first group and that controls the transmission of a second number of key codes within the second group,
  wherein the number of key codes within the first group is preferably in the range of 1 to 6, especially without modifiers, and
  wherein the number of key codes within the second group is in the range of 7 to 20 or 7 to 500.

Thus the number of key codes in the first group may be lower than the number of key codes in the second group.

The ranges for the second group may be from 7 to 20 or from 7 to 500 if modifiers are not counted within the second group.

Both endpoint descriptors may be defined according to the USB specification as stated above.

The technical effect is a reduction of the number of reports and/or endpoints. At least the first endpoint may be used if the main operating system cannot deal with larger reports.

With regard to the kind of key codes and/or the kind of keyboard kindly see the description of the first method for transmitting key codes above and description of corresponding subclaims and embodiments as mentioned above.

BRIEF DESCRIPTION OF THE DRAWINGS

For a more complete understanding of the present invention and of the advantages thereof, reference is now made to the following description taken in conjunction with the accompanying drawings, in which:

FIG. 35 illustrates a keyboard that is connected to a computer via a USB cable according to a second embodiment.

DETAILED DESCRIPTION—ASPECT A

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. Moreover, the same reference signs refer to the same technical features if not stated otherwise. As far as "may" is used in this application it means the possibility of doing so as well as the actual technical implementation.

Figure 1:
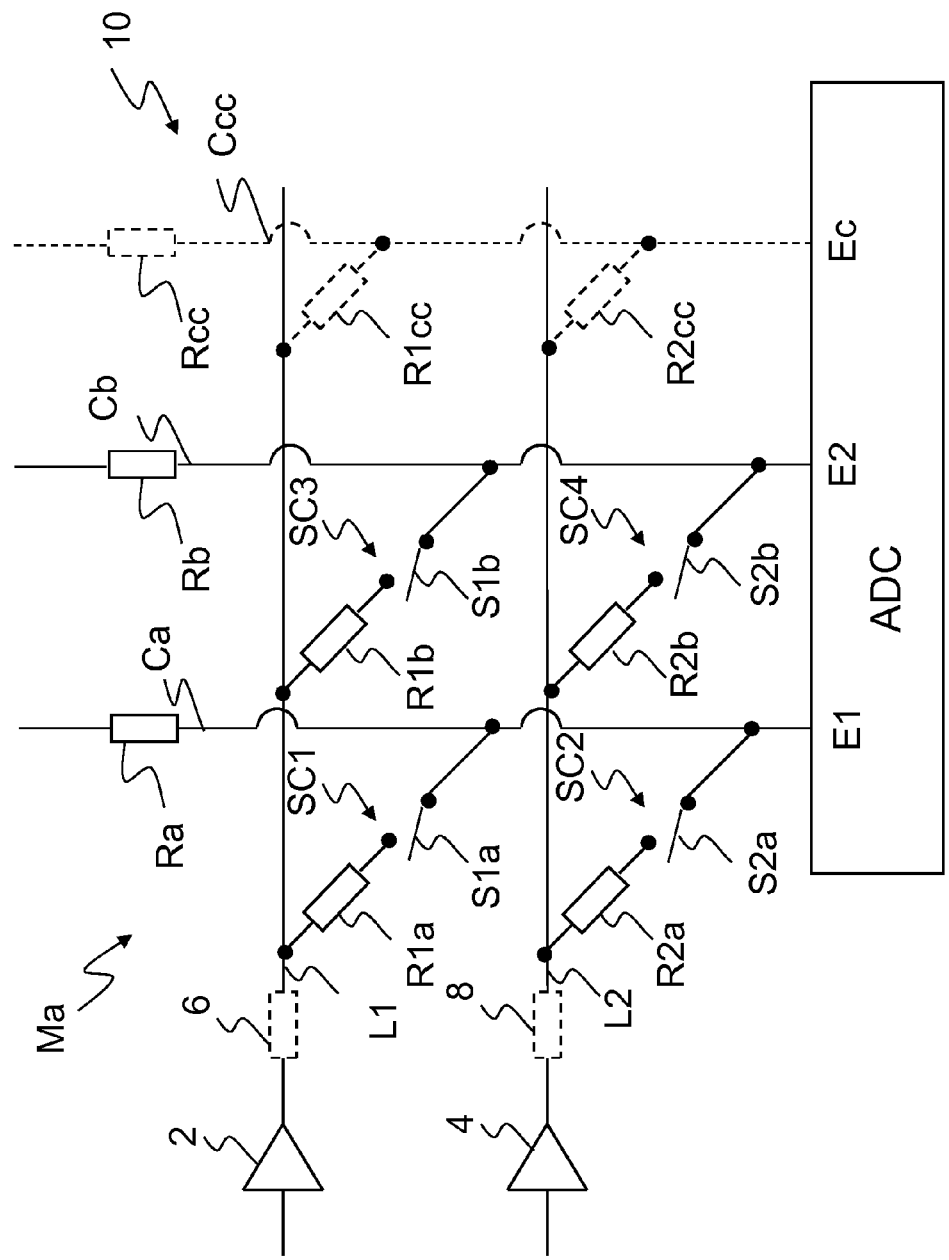
FIG. 1 illustrates a matrix of an input arrangement.

FIG. 1 illustrates a matrix of an input arrangement 10, for instance of a keyboard. The input arrangement 10 comprises a matrix M of conductive lines Ca, Cb that form the columns and of conductive lines L1, L2 that form the rows of the matrix M. The conductive lines L1, L2 are drive lines and the conductive lines Ca, Cb are sense lines. Although only two rows and two columns are shown in FIG. 1, there are usually more than two rows and/or two columns in each direction.

There are four serial connections SC1 to SC4 at the intersections of the conductive lines L1, L3 and Ca, Cb in the example. The first serial connection SC1 consists of a key switch S1a and a resistor R1a. The second serial connection SC2 consists of a key switch S2a and of a resistor R2a. The third serial connection SC3 comprises a key switch S1b and a resistor R1b. The fourth serial connection SC4 comprises a key switch S2b and a resistor R2b. Further serial connections are at other intersections of the matrix M but are not shown in FIG. 1. Other examples of serial connections are serial connections having the resistor coupled directly to the conductive lines Ca and Cb or serial connections having two resistors each, for instance one of the resistors coupled directly to a drive line, i.e. L1, L2, and one of the resistors coupled directly to a sense line, i.e. Ca, Cb.

Alternatively, it is possible to use for instance semiconducting switches, e.g. MOSFET (Metal Oxide Semiconductor Field Effect Transistor) transistors having a resistivity Ron in the activated state of more than 4.5 kilo ohms or 5 kilo ohms. The resistivity of the transistor is much larger in the deactivated state, i.e. no input is made. It is also possible to use push buttons that include resistors R1a etc. within the movable part of the input element or key switch. In this case, no separate resistor may be used in the serial connection SC1 or in the other serial connections. The movable resistors may be pressed against conductive lines L1, L2, Ca, Cb on a carrier substrate of the matrix arrangement Ma.

The input arrangement 10 also comprises an analog digital converter ADC. Two input terminals E1, E2 of the analog digital converter ADC are shown in FIG. 1. The analog digital converter ADC may have more than two input terminals, for instance eight input terminals. A multiplexer may be used internally in the analog digital converter ADC to map the plurality of sense lines to only one analog digital converter ADC. Alternatively, an analog digital converter ADC may be used at each conductive line Ca, Cb that forms a sense line and or an optional calibration line Ccc. It is also possible to use an external multiplexer in combination with an analog digital converter ADC.

Furthermore, there is a resistor Ra in serial connection with conductive line Ca at the end of the conductive line Ca that is not connected to the analog digital converter ADC. A resistor Rb is connected to conductive line Cb in the same manner.

All resistors R1a to R2b as well as Ra and Rb have the same nominal value of the Ohmic resistance. Undefined potentials are avoided by using the resistors Ra, Rb. The resistors may be discrete elements/devices or may be integrated, for instance into a touch screen. The resistors may also be replaced by resistive elements, especially by transistors that do not fulfill a switching function. The resistors may be manufactured by carbon printing.

The input arrangement Ma may optionally comprise a calibration line Ccc that runs in the direction of the columns of the matrix arrangement Ma. A pull up resistor Rcc may be used to connect the calibration line Ccc with the positive operation potential. The other end of the calibration line Ccc or another location of the calibration line Ccc may be connected with a detection circuit, for instance with an input Ec of the analog digital converter ADC or of an multiplexer that is able to connect the input Ec to the input of the ADC.

A first reference resistor R1cc is connected to the calibration line Ccc with one of its terminals and to the first drive line L1 with its second terminal. Correspondingly, a second reference resistor R2cc is connected to the calibration line Ccc with one of its terminals and to the second drive line L2 with its second terminal. Usually, there are much more than two drive lines and two scan lines. The number of reference resistors R1cc, R2cc, etc. corresponds to the number of drive lines L1, L2, etc., even if there are more than two drive lines L1, L2.

The pull up resistor Rcc of the calibration line Ccc may have the value or the same nominal value of the Ohmic resistance as the resistors R1a to R2b and/or the other pull up resistors Ra, Rb. The resistors R1cc, R2cc, etc. of the calibration line Ccc may have the value or the same nominal value of the Ohmic resistance as the resistors R1a to R2b and/or the other pull up resistors Ra, Rb.

The switches S1a to S1b may be arranged as shown in FIG. 1. However, it is also possible to maintain the connection scheme but to locate the switches S1a to S1b at other positions, e.g. to change places.

FIG. 1 shows two driving circuits 2, 4 that are capable of outputting a hard driving level against ground/source potential. The output of driving circuit 2 is connected directly or by using of a serial resistance 6 to the drive line L1. The output of driving circuit 4 is connected directly or by using of a serial resistance 8 to the drive line L2. No pull up or pull down resistors may be used on drive lines L1, L2 etc. The optional resistors 6 and 8 may have resistance values smaller than 200 ohms or even smaller than 100 ohms, in order to reduce electro magnetic emission of signals on the drive lines L1, L2, etc.

The inputs of the driving circuits 2, 4, etc. may be set by a control device according to the scanning scheme of the matrix arrangement Ma. This will be explained in more detail below with regard to FIG. 6B.

Figure 2:
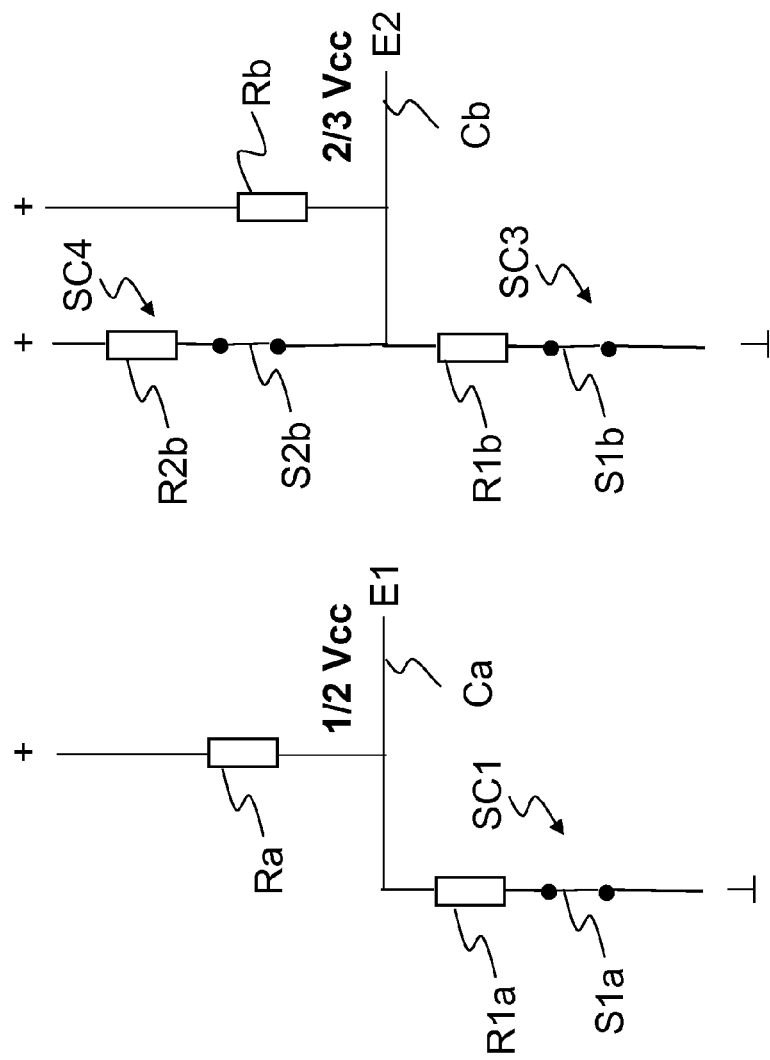
FIG. 2 illustrates signal states for the case in which three key switches are pressed down and in which the first drive line is set to ground potential.

FIG. 2 illustrates signal states for the case in which three key switches S1a, S1b and S2b are pressed down at the same time and in which the first drive line L1 is set to ground. The second drive line L2 and all other drive lines are set to Vcc, for instance to 3.3 volts or 5 volts.

As can be seen in FIG. 2, left side, there are the following signal states relevant for line Ca:
the free terminal of resistor Ra is set to the potential Vcc,
the first serial connection SC1 (S1a, R1a) is at ground.
The switch S2a of the second serial connection SC2 is open, i.e. there is no contribution of this serial connection SC2 to the potential or current on line Ca. Consequently, the second serial connection SC2 is not shown in FIG. 2.

These signal states result in a potential of ½ Vcc on input E1. A potential of ½ Vcc is only possible if only one switch is pressed in a column. Furthermore, the potential of ½ Vcc indicates the pressed or activated switch.

As can be seen in FIG. 2, right side, there are the following signal states relevant for line Cb:
the free terminal of resistor Rb is set to Vcc,
the fourth serial connection SC4 (S2b, R2b) is at Vcc,
the third serial connection SC3 (S1b, R1b) is at ground potential.

This results in an input voltage of ⅔ Vcc at the input E2. This means that there is no ghost keying of switch S1b contrary to many prior art keyboards. The potential on line Cb has no influence to the potential on line Ca due to the decoupling effect of ground or Vcc potential. There is no coupling via the drive lines because the drive lines are coupled to a fixed potential with low Ohmic value compared to the high Ohmic resistors R1a, Ra, etc. These resistors R1a, Ra, etc. do also prevent short circuits.

Figure 3:
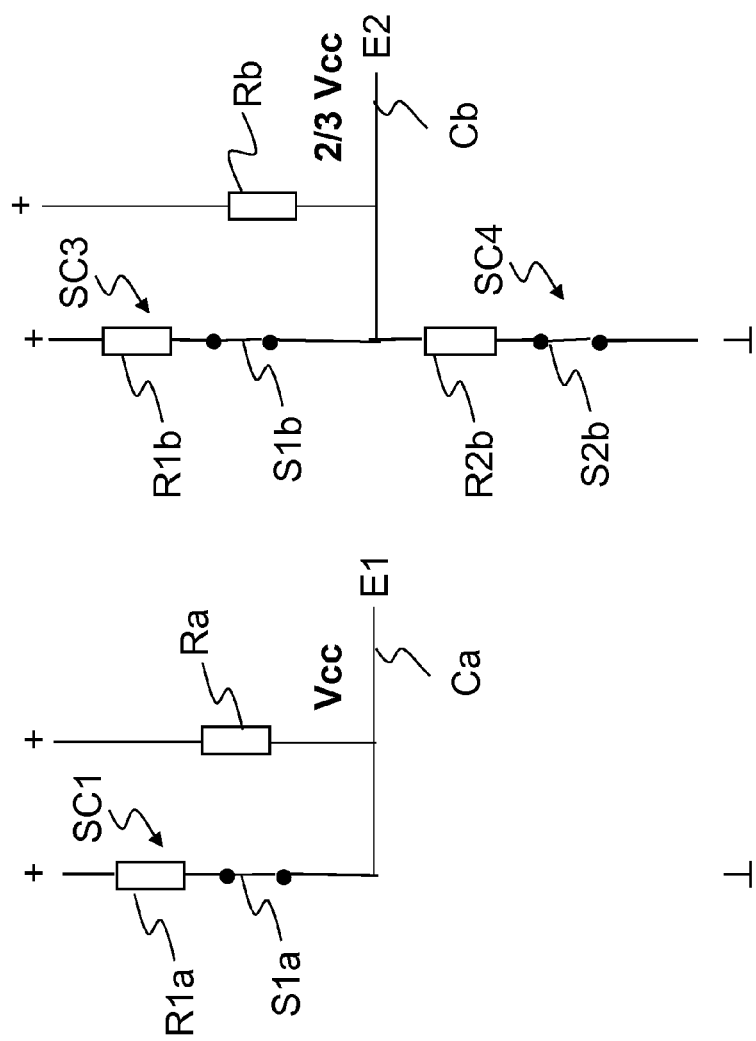
FIG. 3 illustrates signal states for the case in which three key switches are pressed down and in which the second drive line is set to ground.

FIG. 3 illustrates signal states for the case in which three key switches S1a, S1b and S2b are pressed down and in which the second drive line L2 is set to ground. The first drive line L1 and all other drive lines except the second drive line L2 are set to Vcc.

As can be seen in FIG. 3, left side, there are the following signal states relevant for line Ca:
the free terminal of resistor Ra is set to Vcc,
the first serial connection SC1 (S1a, R1a) is also at Vcc.
The switch S2a of the second serial connection SC2 is open, i.e. there is no contribution of this serial connection SC2 to the potential or current on line Ca. Consequently, the second serial connection SC2 is not shown in FIG. 3.

These signal states result in a potential of Vcc on line Ca.

As can be seen in FIG. 3, right side, there are the following relevant signal states for line Cb:
the free terminal of resistor Rb is set to Vcc,
the third serial connection SC3 (S1b, R1b) is at Vcc, and
the fourth serial connection SC4 (S2b, R2b) is at ground potential.

These signal states result in a potential of ⅔ Vcc on line Cb. Thus, there is no change of signal in comparison to FIG. 2, right side. Ghost keying is again no issue.

Figure 4:
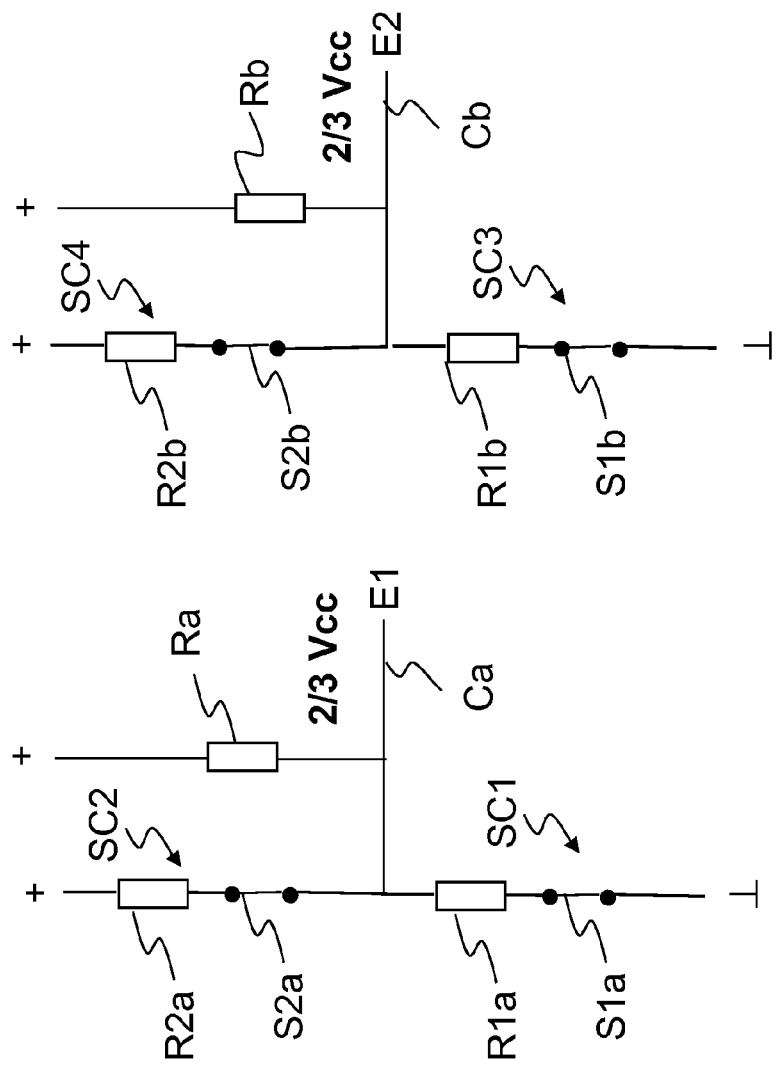
FIG. 4 illustrates signal states for the case in which four key switches are pressed down and in which the first drive line is set to ground.

FIG. 4 illustrates signal states for the case in which four key switches S1a, S1b, S2a and S2b are pressed down and in which the first drive line L1 is set to ground or 0 volt. The second drive line L2 and all other drive lines are set to Vcc of for instance 3.3 volts or 5 volts.

As can be seen in FIG. 4, left side, there are the following signal states relevant for line Ca:
the free terminal of resistor Ra is set to Vcc,
the switch S2a of the second serial connection SC2 is also closed this time, and
the first serial connection SC1 (S1a, R1a) is again at ground.

These signal states result in a potential of ⅔ Vcc on line Ca. The value of the current is ⅔ Vcc indicates that two switches are pressed, i.e. here all switches.

As can be seen in FIG. 4, right side, there are the following signal states are relevant for line Cb:
the free terminal of resistor Rb is set to Vcc.
the fourth serial connection SC4 (S2b, R2b) is at Vcc,
the third serial connection SC3 (S1b, R1b) is at ground potential.

This results in a potential of ⅔ Vcc on input E2.

Figure 5:
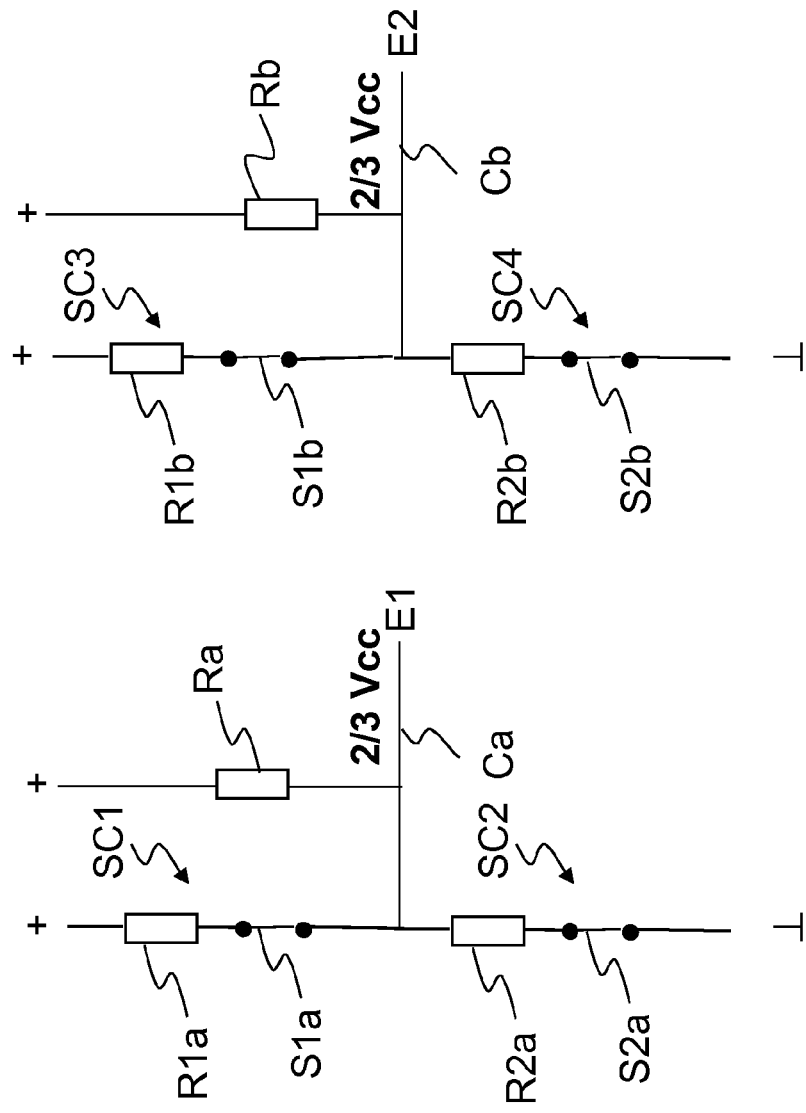
FIG. 5 illustrates signal states for the case in which four key switches are pressed down and in which the second drive line is set to ground.

FIG. 5 illustrates the signal states for the case in which four key switches S1a, S1b, S2a and S2b are pressed down and in which the second drive line L2 is set to ground potential.

The first drive line L1 and all other drive lines except the second drive line L2 are set to Vcc.

As can be seen in FIG. 5, left side, there are the following signal states relevant for line Ca:
the free terminal of resistor Ra is set to Vcc,
the first serial connection SC1 (S1a, R1a) is also at Vcc, and
the second switch S2a of the second serial connection SC2 is closed, i.e. the second serial connection SC2 is set to ground.

These signal states result in a potential of ⅔ Vcc on line Cb. No change of potentials within a column of matrix M indicates that no key switch or all key switches are pressed. The amount of the current also indicates which of these two cases is valid, i.e. here the second case because there is a signal difference with regard to Vcc.

As can be seen in FIG. 5, right side, there are the following signal states that are relevant for line Cb:
the free terminal of resistor Rb is set to Vcc,
the third serial connection SC3 (S1b, R1b) is at Vcc potential, and
the fourth serial connection SC4 (S2b, R2b) is at ground potential.

These signal states result in a potential of ⅔ Vcc on line Ca. the potential at the drive lines L1 and L2 has been changed but the potential at the sense line Ca remains the same. No change of potential within a column of matrix M indicates that no key switch or all key switches are pressed. Ghost keying is again no issue. Furthermore only static states are used for the detection of the pressed or activated key switches.

The following table shows the relevant currents if a 3 by 3 matrix is used. Each row of the table corresponds to a drive line that has the low voltage. The columns of the table refer to the number of key switches that are pressed in a column of the matrix M, i.e. on one sense line Ca, Cb:

|  | Keys switches pressed: | | | |
| --- | --- | --- | --- | --- |
|  | 0 | 1 | 2 | 3 |
| First drive line on ground: | 1 Vcc | ½ Vcc | ⅔ Vcc | ¾ Vcc |
| Second drive line on ground: | 1 Vcc | 1 Vcc | ⅔ Vcc | ¾ Vcc |
| Third drive line on ground: | 1 Vcc | 1 Vcc | 1 Vcc | ¾ Vcc |

In the following, it is assumed that n gives the number of switches on each sense line, i.e. n is equal to 2 for the example that is shown in FIGS. 2 to 5 and n is equal to 3 for the 3 by 3 matrix.

There are the following general rules for indicating the number of pressed keys and for indicating which key is pressed, i.e. for one sequence of strobing or scanning:
1) There is no change of the voltage for all combinations of drive line potential:
a) A potential of Vcc indicates that no key switch is pressed.
b) A potential of n/(n+1) indicates that all key switches are pressed.
2) There is a change of the voltage for different combinations of drive line potential, i.e. within one sequence of strobing or scanning:
a) The number of pressed keys can be determined from the values of the lowest values within a column. The number of pressed key switches corresponds directly to the numerator of a fraction wherein the denominator is given by the number of keys within one column of the matrix, see table given above.
b) A key switch is pressed if during sensing of the corresponding line the potential of the sense line has a value below the maximum of the potential in the column of the matrix, i.e. for instance below Vcc. Note that the number of maxima depends on the number of keys that are not pressed in the column.

Other general rules may also be used.

Alternatively, other components may be used to process the data of the analog digital converter ADC and to control the analog digital converter ADC.

Alternatively, other signal combinations may be used on the drive lines, for instance a bisection method. If there are for instance more than four or more than ten drive lines a method may be used that decreases the number of used combinations below the number of drive lines, i.e. faster detection becomes possible. These methods are known for instance from combinatory, especially from the twelve coin problem, i.e. initially half of the drive lines are set to high level and half of the drive lines are set to low level. Further changes are made depending on the sensed signal. This also allows the prevention of ghost keying and the detection of multiple keys pressed in one column.

In a preferred embodiment it is not necessary, especially within a first detection step, to determine how many keys are pressed or activated within one column of the matrix arrangement Ma. It may be sufficient to know that the key at the drive line that is currently active is pressed/active or not. If a pressed key is detected the key code of this key may be stored in a memory for further processing, e.g. for sending from the keyboard to a computer via an USB (Universal Serial Bus) connection or via another connection.

Figure 7:
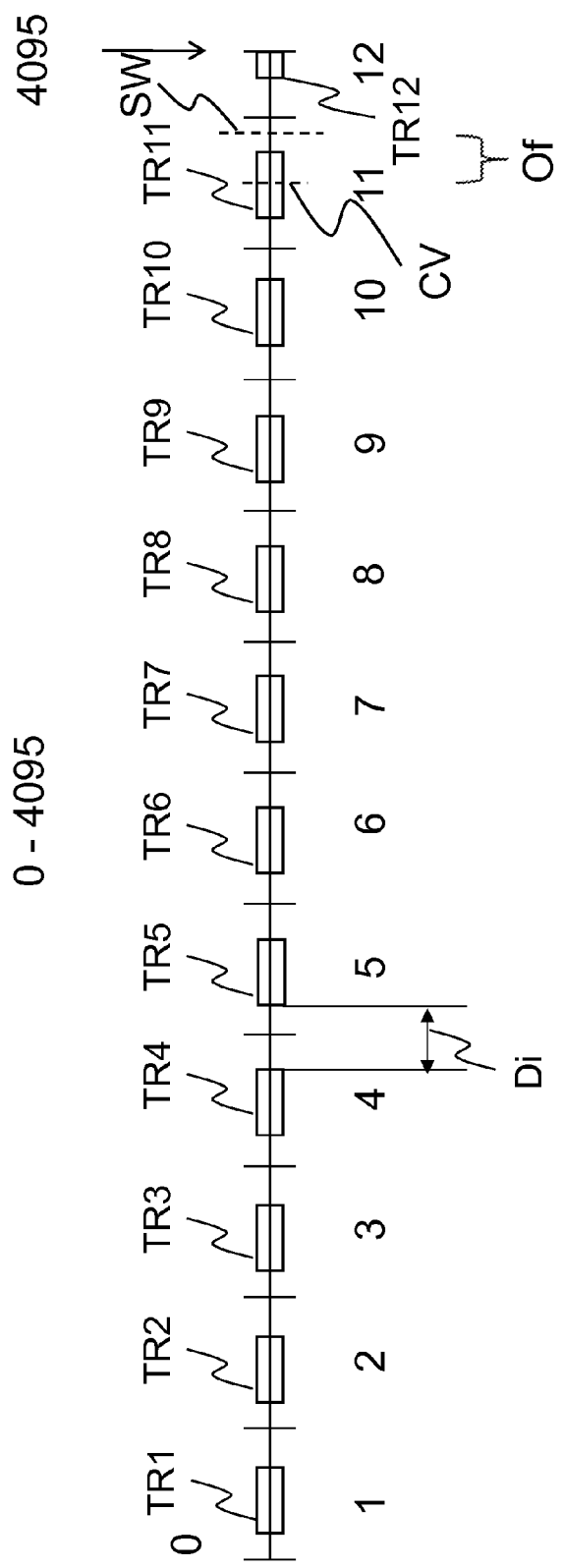
FIG. 7 illustrates the mapping of ranges of ADC-output to the number of pressed key switches.
Figure 7B:
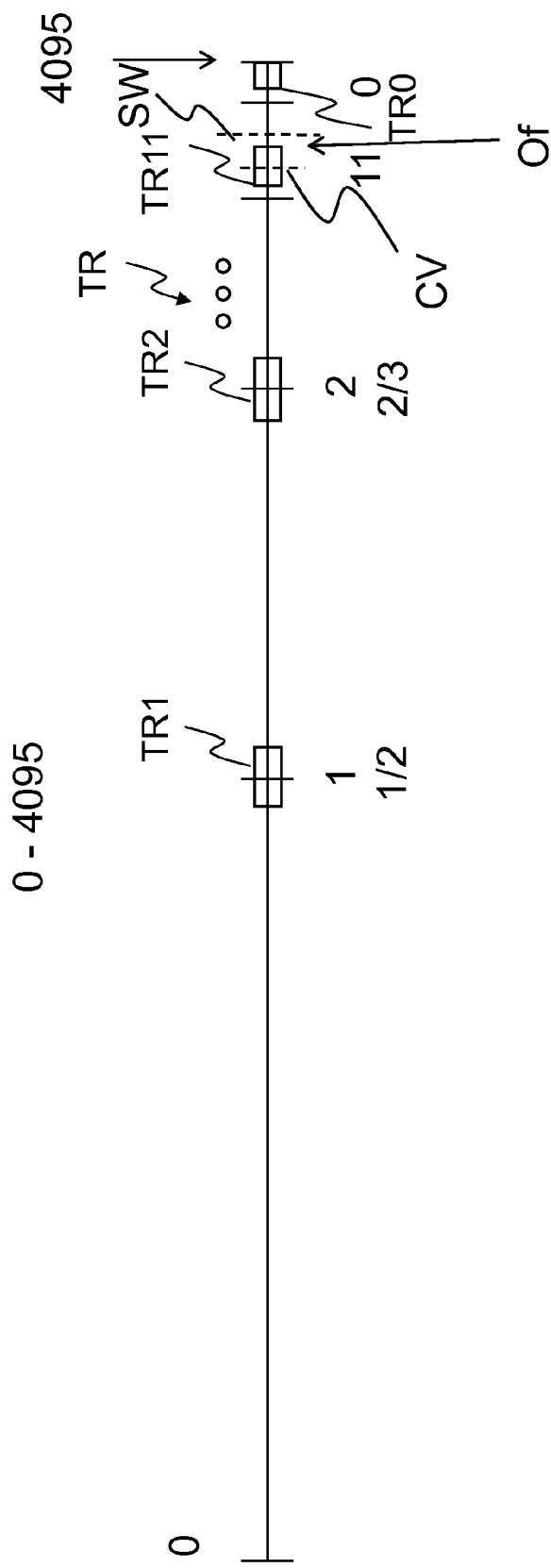
FIG. 7B illustrates the mapping of ranges of ADC-output to the number of pressed key switches according to a more practical example compared to FIG. 7.

In one embodiment only one threshold value SW is used, see FIG. 7 and FIG. 7B, i.e. a threshold value SW that is independent of the number of keys or that is independent of at least two, three or four different numbers of keys activated within one column of the matrix arrangement Ma. In other embodiments the threshold value SW is used and further threshold values or threshold ranges, for instance TR1 to TR11, see FIG. 7 and FIG. 7B, are used that are indicative of a special number of activated keys within one column of the matrix arrangement Ma, especially in order to make the scanning of the matrix faster.

Figure 6:
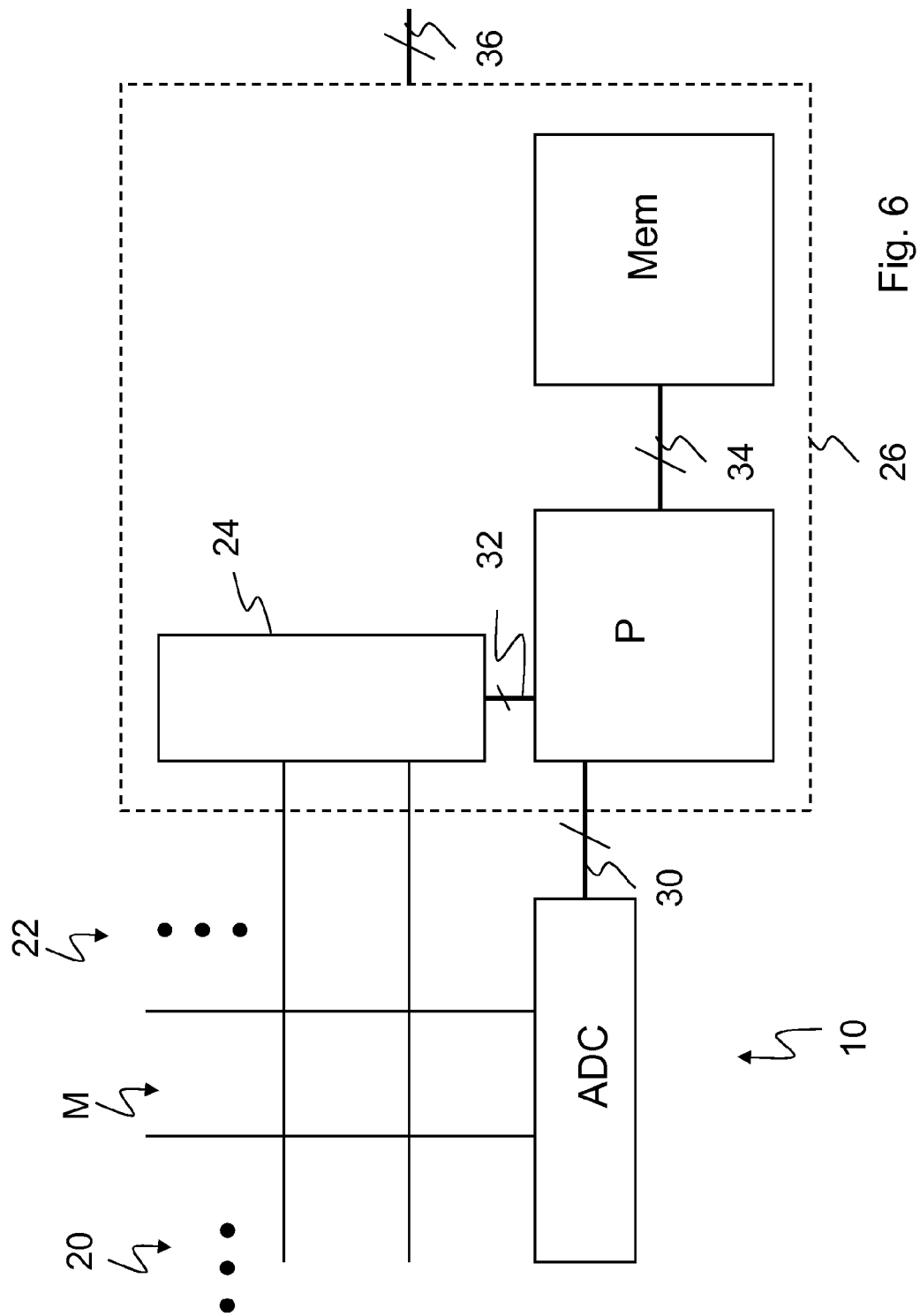
FIG. 6 illustrates the components of a keyboard of a computer.

FIG. 6 illustrates components of a keyboard of a computer. The keyboard comprises:
the input arrangement 10,
a microcontroller 26, and
an interface 36.

FIG. 6 shows further conductive lines 20 (sense lines), for instance eleven lines, and further conductive lines 22 (drive lines), for instance ten lines, in matrix M.

The analog digital converter ADC of the input arrangement 10 is coupled to the microcontroller 26 by a signal bus 30 that comprises data lines and control lines.

The microcontroller 26 comprises:
a memory Mem, for instance a RAM (Random Access Memory), ROM (Read Only Memory), PROM (Programmable ROM) or EEPROM (Electrical Erasable PROM) or another kind of memory,
a processor P that performs instructions stored in the memory Mem,
a drive circuit 24 that is coupled to the drive lines of matrix M, i.e. to lines L1, L2 etc.,
a signal bus 32 between the drive circuit 24 and the processor P, and
a signal bus 34 between the processor P and the memory Mem.

Alternatively, the analog digital converter ADC may also be part of the microcontroller 26.

The signal bus 30 may be connected directly to the processor P. Alternatively, an interface circuit of the microcontroller 26 is used, not shown. The signal bus 36 is coupled to the microcontroller 26. Signal bus 36 is an interface to a central part of a computer. The protocol on signal bus 36 is for instance PS/2 or USB.

Figure 6B:
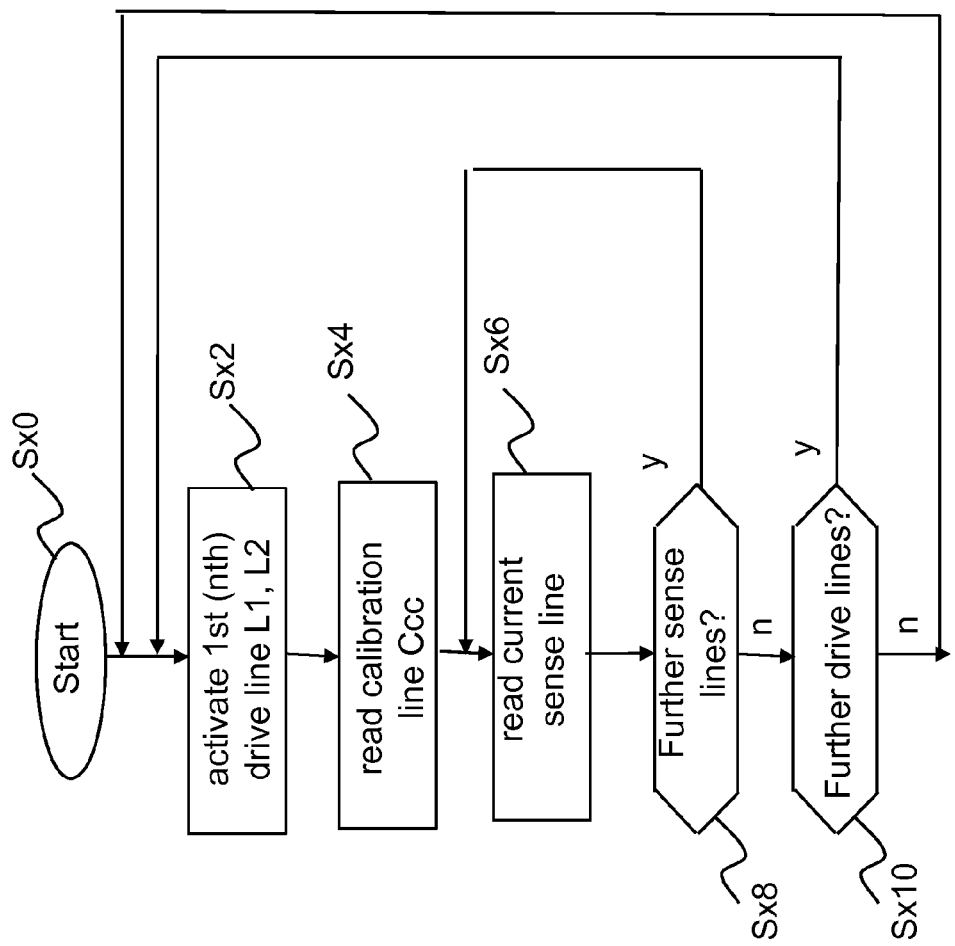
FIG. 6B illustrates a method for performing a cycle of a matrix scan

FIG. 6B illustrates a method for performing a cycle of a matrix scan of matrix arrangement Ma, see FIG. 1. The methods starts in method step Sx0. The method steps are named simple as steps in the following.

A step Sx2 follows after step Sx0. In step Sx2 one of the drive lines L1, L2 etc. is activated beginning for instance with the first drive line L1. Activation means that a ground/source potential is used on that drive line. The other drive lines, i.e. the non activated drive lines, are set to positive operation potential.

After step Sx2 a step Sx4 follows in which the calibration line Ccc is read. The calibration line Ccc simulates the case that all keys of a column have been pressed. It is necessary to set exactly one drive line to low level or low potential in order to get the calibration value VC by sensing the calibration line Ccc.

The sensed value of the calibration line is a calibration value CV that will be explained with regard to FIGS. 7 and 7B in more detail below. The calibration value CV is used directly as threshold value SW or it is used to calculate the threshold value SW as explained in more detail with regard to FIGS. 7 and 7B. The threshold value SW is independent of the number of pressed keys within a column of the matrix arrangement Ma, i.e. it may be used to detect whether a key is pressed or not. Alternatively it is possible to use a threshold value SW that is independent of at least two different numbers, of at least three different numbers, etc. of pressed keys within a column of the matrix arrangement. For instance, if a maximum of four active keys is allowed for each column it is possible to use a much lower threshold value SW that is independent of the number of keys as long as not more than a maximum of four keys are activated, i.e. one key, two keys, three keys of four keys.

During the activation of the current drive line the current sense line is read in step Sx6, for instance beginning with the first sense line Ca. The sensed value is compared to the threshold value SW. If the current sensed value is lower than the threshold value the key that is located at the section of the current activated drive line L1, L2, etc. and the currently sensed sense line Ca, Cb, etc. is pressed or activated. The key code of an detected active key is stored in a digital memory for further processing.

In a following step Sx8 it is checked whether there are further sense lines that have not yet been sensed for the currently active drive line, for instance L1. If this is the case the method increments or decrements a first counter for the sense lines and goes again to step Sx6. This means that all scan lines are sensed for the currently active drive line. The loop consisting of steps Sx6 and Sx8 is left in step Sx8 only then if all sense lines have been scanned, i.e. all active keys at the currently active drive line have been detected.

A step Sx10 follows immediately after step Sx8 if all sense line Ca, Cb have been scanned, i.e. a sense line Ca, Cb sub cycle has been done. In step Sx10 it is checked whether there are further drive lines that have not been activated within the current scan cycle of the matrix arrangement. If there are drive lines left, a second counter is incremented or decremented to indicate the current drive line that has to be activated, i.e. set to ground. The other drive lines, i.e. the non activated drive lines, are set to the positive operation potential. The method is continued in step Sx2 thereafter. This means that the same steps as explained above are repeated for the second drive line L2, the third drive line etc. until all drive lines have been activated and until all keys S1a to S2b etc. have been scanned and the key codes of activated keys have been stored within a digital memory. The method is within a loop of the steps Sx2 to Sx10.

The calibration line Ccc is sensed for each drive line L1, L2, etc. This allows to consider also deviations resulting from inner resistance values of the line drivers 2, 4. Furthermore, it is possible to calculate mean values of the values detected at the calibration line Ccc in order to take consideration of tolerances and/or of electro magnetic radiation (for instance from outside the keyboard) that may interfere the operation of the keyboard.

It is also possible to reduce the value of the pull up resistor Rcc in order to have a hardware offset value, see FIG. 7 and FIG. 7B with regard to a software offset.

The order of reading the calibration line and the sense lines may also be vice versa, i.e. first scanning of the sense lines and then scanning of the calibration line for each drive line cycle. In this case, the sensed values may be stored until the calibration value is read and comparing gets possible.

If there are no further drive lines the loop of the steps Sx2 to Sx10 is left. One cycle of scanning the matrix arrangement Ma is ready.

The scanning of the matrix arrangement Ma may be repeated within a given time interval, for instance smaller than 5 mill seconds.

It may be not necessary to calibrate for every drive line. In other embodiments step Sx2 is performed only ones within one scan of the complete matrix arrangement Ma.

Optionally, it is possible to make the scanning of the matrix faster by one of the following:
a) it is determined how many input elements are being pressed on a sensed sense line as soon as the first active input element is detected at this sense line based on the detected value and based on threshold values or ranges that indicate the number of active input elements, no further electrical signal is detected at this sense line Ca, Cb as soon as a number of active input elements is detected that is equal to the determined number of input elements,
b) all drive lines L1, L2 are driven to the second potential and sense lines Ca, Cb are determined that do not have activated input elements,
these determined sense lines Ca, Cb are not considered during the scan of the matrix arrangement within the current scan cycle any more,
c) the order of driving the drive lines L1, L2, etc. is dependent on the probability of activating input elements connected to the corresponding drive line,
d) a bisection method is used for driving the drive lines L1, L2, etc.

FIG. 7 illustrates the mapping of ranges of the output value of analog digital converter ADC to the number of pressed key switches. It is assumed that there are eleven key switches in one column of matrix M. Therefore, there are eleven ranges TR1 to TR11 that correspond in this order to potential values of $1/12$ to $11/12$ Vcc. TR12 is relevant if no key is pressed.

The length of the ranges TR1 to TR11 may be constant and may be in the range of 2 to 4 percent of the maximum output value if there are eleven key switches in each column of matrix M.

There are output values between adjacent ranges TR1 to TR12 that are not used for determining the number of pressed switches or for determining which switch is pressed or which switches are pressed within a column. The "distance" Di between two adjacent ranges is also for instance in the range of 2 to 4 percent of the largest output value of the analog digital converter ADC. Preferably, the unused ranges have the same length as the ranges that are used for classification. This is not always possible due to rounding, quantization and values that cannot divided giving integer numbers.

A calibration value CV is for instance detected by using the calibration line Ccc whereby all drive lines L1, L2, etc. are set to ground or source potential in order to simulate the case in which all key switches within one column of the matrix arrangement Ma have been pressed, i.e. in the example, 11 keys have been activated.

A threshold value SW may be determined by calculating the difference of the maximum value of the ADC, i.e. 4095 in the example, and the calibration value CV or corresponding potential values. This difference is divided by 4, for instance, resulting in an offset Of that has to be added to the calibration value in order to get the threshold value. All detected values that are smaller than SW indicate a pressed key at the currently active sense line independently of the number of pressed keys in the sensed column Ca, Cb of the matrix arrangement. The calibration value CV may change depending on temperature and voltage fluctuations within the matrix arrangement Ma and/or the ADC. The ADC may have a reference voltage or potential that is filtered much more than an operation potential of the ADC.

FIG. 7B illustrates the mapping of ranges of ADC-output to the number of pressed key switches according to a more practical example compared to FIG. 7. There may be the following relationship with regard to the potential at the tap of the voltage dividers shown in FIGS. 2 to 5:

$$V = Vcc * k/(k+1),$$

whereby k is the number of pressed keys within one column and wherein k has to be greater than 1. The same formula is valid in principle for the digital values of the ADC by replacing Vcc with the maximum digital value of the ADC and by considering rounding errors.

This means that the range TR1 for only one active key is located around the value "one half" or ½ of the range of the ADC or of the corresponding potential. The range TR2 for exact two active keys within one column is located around the value ⅔ of the range of the ADC or of the corresponding potential and so on. The range TR11 for eleven active keys, i.e. all keys are pressed or eleven keys are activated by pressing and/or by using a macro, is very close to the end of the range of the ADC, i.e. at about the value 3754 in the example if there is no additional drift. This means that the calibration value CV will have the value 3754 plus or minus a drift value. The threshold value SW may be calculated as explained above with regard to FIG. 7, i.e. subtracting the value CV from the end value, for instance 4095, and dividing the result by four thereby getting an offset Of. The offset Of is added to the calibration value CV in order to get the threshold value SW. However, other methods for determining or calculating SW may be used as well, for instance using other numbers than 4 for dividing.

FIG. 7B also shows a range TR0 that is relevant if no key is pressed within the current sensed sense line Ca, Cb, etc. The threshold ranges TR1 to TR11 and/or TR0 may have again a length that may lie within the range of 2 to 4 percent of the maximum output value of the ADC or another range.

Alternatively, it is possible to make ranges broader that relate to less active keys than other ranges. Thus, the range TR1 may be broader compared to the range TR2, etc.

It is also possible to determine the threshold value SW in other ways than using a calibration line Ccc, see introduction of this text.

It is of course also possible to have more or less than 11 drive lines, for instance 16 (SW for instance 3915).

The offset may also be implemented by reducing the resistance value of the pull up (or pull down) resistor Rcc on the calibration line.

Figure 8:
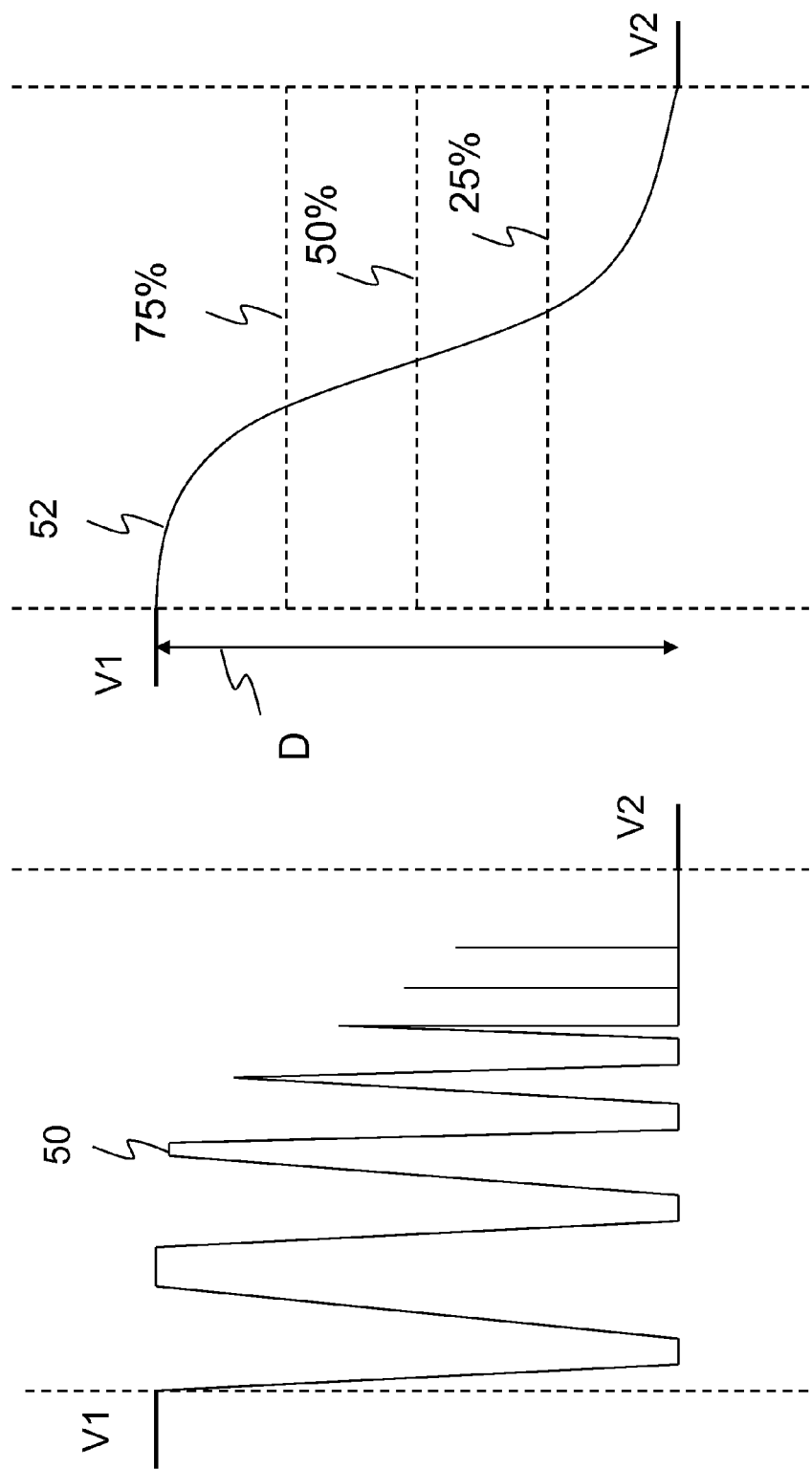
FIG. 8 illustrates the debouncing signal and the signal as processed by a control device.

FIG. 8 illustrates a debouncing signal 50 and a smoothed signal 52 as processed by a control device, e.g. by microcontroller 26, see FIG. 6.

There is a signal difference D between a signal value V1 (voltage or current) before the key switch is pressed and a signal value V2 (voltage or current) at the end of pressing down the key switch.

The debouncing signal 50 goes up and down several times and shows spikes with decreasing width having a decreasing amplitude thereby. Thus it is challenging to detect intermediate states. However, the usage of the analog digital converter ADC allows the detection of intermediate values, of for instance 75 percent, 50 percent and 25 percent of the signal value V1.

It is possible to get a smooth value in contrast to the fast changing debouncing function by using a smoothing capacitor, for instance in combination with statistical analysis. Alternatively it is possible to detect minima of the debouncing signal or values that are less than a high potential at the beginning of the activation of a key switch. Maxima or values that are considerable higher than the low signal value may be detected if the signal is low at the beginning.

High and low signal states may be interchanged in all examples that are given above.

Although embodiments of the present invention and their advantages have been described in detail, it should be understood that various changes, substitutions and alterations can be made therein without departing from the spirit and scope of the invention as defined by the appended claims. For example, it will be readily understood by those skilled in the art that many of the features, functions, processes and methods described herein may be varied while remaining within the scope of the present invention. Moreover, the scope of the present application is not intended to be limited to the particular embodiments of the system, process, manufacture, method or steps described in the present invention. As one of ordinary skill in the art will readily appreciate from the disclosure of the invention systems, processes, manufacture, methods or steps presently existing or to be developed later that perform substantially the same function or achieve substantially the same result as the corresponding embodiments described herein may be utilized according to the present invention. Accordingly, the appended claims are intended to include within their scope such systems, processes, methods or steps.

Detailed Description—First Aspect

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. Moreover, the same reference signs refer to the same technical features if not stated otherwise. As far as "may" is used in this application it means the possibility of doing so as well as the actual technical implementation.

FIG. 1 illustrates a matrix of an input arrangement 10, for instance of a keyboard. The input arrangement 10 comprises a matrix M of conductive lines Ca, Cb that form the columns and of conductive lines L1, L2 that form the rows of the matrix M. The conductive lines L1, L2 are drive lines and the conductive lines Ca, Cb are sense lines. Although only two rows and two columns are shown in FIG. 1, there are usually more than two rows and/or two columns in each direction.

There are four serial connections SC1 to SC4 at the intersections of the conductive lines L1, L3 and Ca, Cb in the example. The first serial connection SC1 consists of a key switch S1a and a resistor R1a. The second serial connection SC2 consists of a key switch S2a and of a resistor R2a. The third serial connection SC3 comprises a key switch S1b and a resistor R1b. The fourth serial connection SC4 comprises a key switch S2b and a resistor R2b. Further serial connections are at other intersections of the matrix M but are not shown in FIG. 1. Other examples of serial connections are serial connections having the resistor coupled directly to the conductive lines Ca and Cb or serial connections having two resistors each, for instance one of the resistors coupled directly to a drive line, i.e. L1, L2, and one of the resistors coupled directly to a sense line, i.e. Ca, Cb.

Alternatively, it is possible to use for instance semiconducting switches, e.g. MOSFET (Metal Oxide Semiconductor Field Effect Transistor) transistors having a resistivity Ron in the activated state of more than 4.5 kilo ohms or 5 kilo ohms. The resistivity of the transistor is much larger in the deactivated state, i.e. no input is made.

The input arrangement 10 also comprises an analog digital converter ADC. Two input terminals E1, E2 of the analog digital converter ADC are shown in FIG. 1. The analog digital converter ADC may have more than two input terminals, for instance eight input terminals. A multiplexer may be used internally in the analog digital converter ADC to map the plurality of sense lines to only one analog digital converter ADC. Alternatively, an analog digital converter ADC may be used at each conductive line Ca, Cb that forms a sense line. It is also possible to use an external multiplexer in combination with an analog digital converter ADC.

Furthermore, there is a resistor Ra in serial connection with conductive line Ca at the end of the conductive line Ca that is not connected to the analog digital converter ADC. A resistor Rb is connected to conductive line Cb in the same manner.

All resistors R1a to R2b as well as Ra and Rb have the same nominal value of the Ohmic resistance. Undefined potentials are avoided by using the resistors Ra, Rb. The resistors may be discrete elements/devices or may be integrated, for instance into a touch screen. The resistors may also be replaced by resistive elements, especially by transistors that do not fulfill a switching function. The resistors may be manufactured by carbon printing.

FIG. 2 illustrates signal states for the case in which three key switches S1a, S1b and S2b are pressed down at the same time and in which the first drive line L1 is set to ground. The second drive line L2 and all other drive lines are set to Vcc, for instance to 3.3 volts or 5 volts.

As can be seen in FIG. 2, left side, there are the following signal states relevant for line Ca:
  the free terminal of resistor Ra is set to the potential Vcc,
  the first serial connection SC1 (S1a, R1a) is at ground.
The switch S2a of the second serial connection SC2 is open, i.e. there is no contribution of this serial connection SC2 to the potential or current on line Ca. Consequently, the second serial connection SC2 is not shown in FIG. 2.

These signal states result in a potential of ½ Vcc on input E1. A potential of ½ Vcc is only possible if only one switch is pressed in a column. Furthermore, the potential of ½ Vcc indicates the pressed or activated switch.

As can be seen in FIG. 2, right side, there are the following signal states relevant for line Cb:
  the free terminal of resistor Rb is set to Vcc,
  the fourth serial connection SC4 (S2b, R2b) is at Vcc,
  the third serial connection SC3 (S1b, R1b) is at ground potential.
This results in an input voltage of ⅔ Vcc at the input E2. This means that there is no ghost keying of switch S1b contrary to many prior art keyboards. The potential on line Cb has no influence to the potential on line Ca due to the decoupling effect of ground or Vcc potential. There is no coupling via the drive lines because the drive lines are coupled to a fixed potential with low Ohmic value compared to the high Ohmic resistors R1a, Ra, etc. These resistors R1a, Ra, etc. do also prevent short circuits.

FIG. 3 illustrates signal states for the case in which three key switches S1a, S1b and S2b are pressed down and in which the second drive line L2 is set to ground. The first drive line L1 and all other drive lines except the second drive line L2 are set to Vcc.

As can be seen in FIG. 3, left side, there are the following signal states relevant for line Ca:
  the free terminal of resistor Ra is set to Vcc,
  the first serial connection SC1 (S1a, R1a) is also at Vcc.
The switch S2a of the second serial connection SC2 is open, i.e. there is no contribution of this serial connection SC2 to the potential or current on line Ca. Consequently, the second serial connection SC2 is not shown in FIG. 3.

These signal states result in a potential of Vcc on line Ca.

As can be seen in FIG. 3, right side, there are the following relevant signal states for line Cb:
  the free terminal of resistor Rb is set to Vcc,
  the third serial connection SC3 (S1b, R1b) is at Vcc, and
  the fourth serial connection SC4 (S2b, R2b) is at ground potential.
These signal states result in a potential of ⅔ Vcc on line Cb. Thus, there is no change of signal in comparison to FIG. 2, right side. Ghost keying is again no issue.

FIG. 4 illustrates signal states for the case in which four key switches S1a, S1b, S2a and S2b are pressed down and in which the first drive line L1 is set to ground or 0 volt. The second drive line L2 and all other drive lines are set to Vcc of for instance 3.3 volts or 5 volts.

As can be seen in FIG. 4, left side, there are the following signal states relevant for line Ca:
  the free terminal of resistor Ra is set to Vcc,
  the switch S2a of the second serial connection SC2 is also closed this time, and
  the first serial connection SC1 (S1a, R1a) is again at ground.
These signal states result in a potential of ⅔ Vcc on line Ca. The value of the current is ⅔ Vcc indicates that two switches are pressed, i.e. here all switches.

As can be seen in FIG. 4, right side, there are the following signal states are relevant for line Cb:
  the free terminal of resistor Rb is set to Vcc.
  the fourth serial connection SC4 (S2b, R2b) is at Vcc,
  the third serial connection SC3 (S1b, R1b) is at ground potential.
This results in a potential of ⅔ Vcc on input E2.

FIG. 5 illustrates the signal states for the case in which four key switches S1a, S1b, S2a and S2b are pressed down and in which the second drive line L2 is set to ground potential. The first drive line L1 and all other drive lines except the second drive line L2 are set to Vcc.

As can be seen in FIG. 5, left side, there are the following signal states relevant for line Ca:
the free terminal of resistor Ra is set to Vcc,
the first serial connection SC1 (S1a, R1a) is also at Vcc, and
the second switch S2a of the second serial connection SC2 is closed, i.e. the second serial connection SC2 is set to ground.

These signal states result in a potential of $\frac{2}{3}$ Vcc on line Cb. No change of potentials within a column of matrix M indicates that no key switch or all key switches are pressed. The amount of the current also indicates which of these two cases is valid, i.e. here the second case because there is a signal difference with regard to Vcc.

As can be seen in FIG. 5, right side, there are the following signal states that are relevant for line Cb:
the free terminal of resistor Rb is set to Vcc,
the third serial connection SC3 (S1b, R1b) is at Vcc potential, and
the fourth serial connection SC4 (S2b, R2b) is at ground potential.

These signal states result in a potential of $\frac{2}{3}$ Vcc on line Ca. the potential at the drive lines L1 and L2 has been changed but the potential at the sense line Ca remains the same. No change of potential within a column of matrix M indicates that no key switch or all key switches are pressed. Ghost keying is again no issue. Furthermore only static states are used for the detection of the pressed or activated key switches.

The following table shows the relevant currents if a 3 by 3 matrix is used. Each line of the table corresponds to a drive line that has the low voltage. The columns of the table refer to the number of key switches that are pressed in a column of the matrix M, i.e. on one sense line Ca, Cb:

|  | Keys switches pressed: | | | |
| --- | --- | --- | --- | --- |
|  | 0 | 1 | 2 | 3 |
| First drive line on ground: | 1 Vcc | ½ Vcc | ⅔ Vcc | ¾ Vcc |
| Second drive line on ground: | 1 Vcc | 1 Vcc | ⅔ Vcc | ¾ Vcc |
| Third drive line on ground: | 1 Vcc | 1 Vcc | 1 Vcc | ¾ Vcc |

In the following, it is assumed that n gives the number of switches on each sense line, i.e. n is equal to 2 for the example that is shown in FIGS. 2 to 5 and n is equal to 3 for the 3 by 3 matrix.

There are the following general rules for indicating the number of pressed keys and for indicating which key is pressed, i.e. for one sequence of strobing or scanning:
1) There is no change of the voltage for all combinations of drive line potential:
a) A potential of Vcc indicates that no key switch is pressed.
b) A potential of n/(n+1) indicates that all key switches are pressed.
2) There is a change of the voltage for different combinations of drive line potential, i.e. within one sequence of strobing or scanning:
a) The number of pressed keys can be determined from the values of the lowest values within a column. The number of pressed key switches corresponds directly to the numerator of a fraction wherein the denominator is given by the number of keys within one column of the matrix, see table given above.
b) A key switch is pressed if during sensing of the corresponding line the potential of the sense line has a value below the maximum of the potential in the column of the matrix, i.e. for instance below Vcc. Note that the number of maxima depends on the number of keys that are not pressed in the column.

Other general rules may also be used.

Alternatively, other components may be used to process the data of the analog digital converter ADC and to control the analog digital converter ADC.

Alternatively, other signal combinations may be used on the drive lines. If there are for instance more than four or more than ten drive lines a method may be used that decreases the number of used combinations below the number of drive lines, i.e. faster detection becomes possible. These methods are known for instance from combinatory, especially from the twelve coin problem, i.e. initially half of the drive lines are set to high level and half of the drive lines are set to low level. Further changes are made depending on the sensed signal. This also allows the prevention of ghost keying and the detection of multiple keys pressed in one column.

FIG. 6 illustrates components of a keyboard of a computer. The keyboard comprises:
the input arrangement 10,
a microcontroller 26, and
an interface 36.

FIG. 6 shows further conductive lines 20 (sense lines), for instance eleven lines, and further conductive lines 22 (drive lines), for instance ten lines, in matrix M.

The analog digital converter ADC of the input arrangement 10 is coupled to the microcontroller 26 by a signal bus 30 that comprises data lines and control lines.

The microcontroller 26 comprises:
a memory Mem, for instance a RAM (Random Access Memory), ROM (Read Only Memory), PROM (Programmable ROM) or EEPROM (Electrical Erasable PROM) or another kind of memory,
a processor P that performs instructions stored in the memory Mem,
a drive circuit 24 that is coupled to the drive lines of matrix M, i.e. to lines L1, L2 etc.,
a signal bus 32 between the drive circuit 24 and the processor P, and
a signal bus 34 between the processor P and the memory Mem.

Alternatively, the analog digital converter ADC may also be part of the microcontroller 26.

The signal bus 30 may be connected directly to the processor P. Alternatively, an interface circuit of the microcontroller 26 is used, not shown. The signal bus 36 is coupled to the microcontroller 26. Signal bus 36 is an interface to a central part of a computer. The protocol on signal bus 36 is for instance PS/2 or USB.

FIG. 7 illustrates the mapping of ranges of the output value of analog digital converter ADC to the number of pressed key switches. It is assumed that there are eleven key switches in one column of matrix M. Therefore, there are eleven ranges TR1 to TR11 that correspond in this order to potential values of $\frac{1}{12}$ to $\frac{11}{12}$ Vcc. TR12 is relevant if no key is pressed.

The length of the ranges TR1 to TR11 may be constant and may be in the range of 2 to 4 percent of the maximum output value if there are eleven key switches in each column of matrix M.

There are output values between adjacent ranges TR1 to TR12 that are not used for determining the number of pressed switches or for determining which switch is pressed or which switches are pressed within a column. The "distance" Di between two adjacent ranges is also for instance in the range of 2 to 4 percent of the largest output value of the analog digital converter ADC. Preferably, the unused ranges have the same length as the ranges that are used for classification. This is not always possible due to rounding, quantization and values that cannot divided giving integer numbers.

FIG. 8 illustrates a debouncing signal 50 and a smoothed signal 52 as processed by a control device, e.g. by microcontroller 26, see FIG. 6.

There is a signal difference D between a signal value V1 (voltage or current) before the key switch is pressed and a signal value V2 (voltage or current) at the end of pressing down the key switch.

The debouncing signal 50 goes up and down several times and shows spikes with decreasing width having a decreasing amplitude thereby. Thus it is challenging to detect intermediate states. However, the usage of the analog digital converter ADC allows the detection of intermediate values, of for instance 75 percent, 50 percent and 25 percent of the signal value V1.

It is possible to get a smooth value in contrast to the fast changing debouncing function by using a smoothing capacitor, for instance in combination with statistical analysis. Alternatively it is possible to detect minima of the debouncing signal or values that are less than a high potential at the beginning of the activation of a key switch. Maxima or values that are considerable higher than the low signal value may be detected if the signal is low at the beginning.

High and low signal states may be interchanged in all examples that are given above.

Although embodiments of the present invention and their advantages have been described in detail, it should be understood that various changes, substitutions and alterations can be made therein without departing from the spirit and scope of the invention as defined by the appended claims. For example, it will be readily understood by those skilled in the art that many of the features, functions, processes and methods described herein may be varied while remaining within the scope of the present invention. Moreover, the scope of the present application is not intended to be limited to the particular embodiments of the system, process, manufacture, method or steps described in the present invention. As one of ordinary skill in the art will readily appreciate from the disclosure of the invention systems, processes, manufacture, methods or steps presently existing or to be developed later that perform substantially the same function or achieve substantially the same result as the corresponding embodiments described herein may be utilized according to the present invention. Accordingly, the appended claims are intended to include within their scope such systems, processes, methods or steps.

Detailed Description—Second Aspect

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. Moreover, the same reference signs refer to the same technical features if not stated otherwise. As far as "may" is used in this application it means the possibility of doing so as well as the actual technical implementation.

Figure 9:
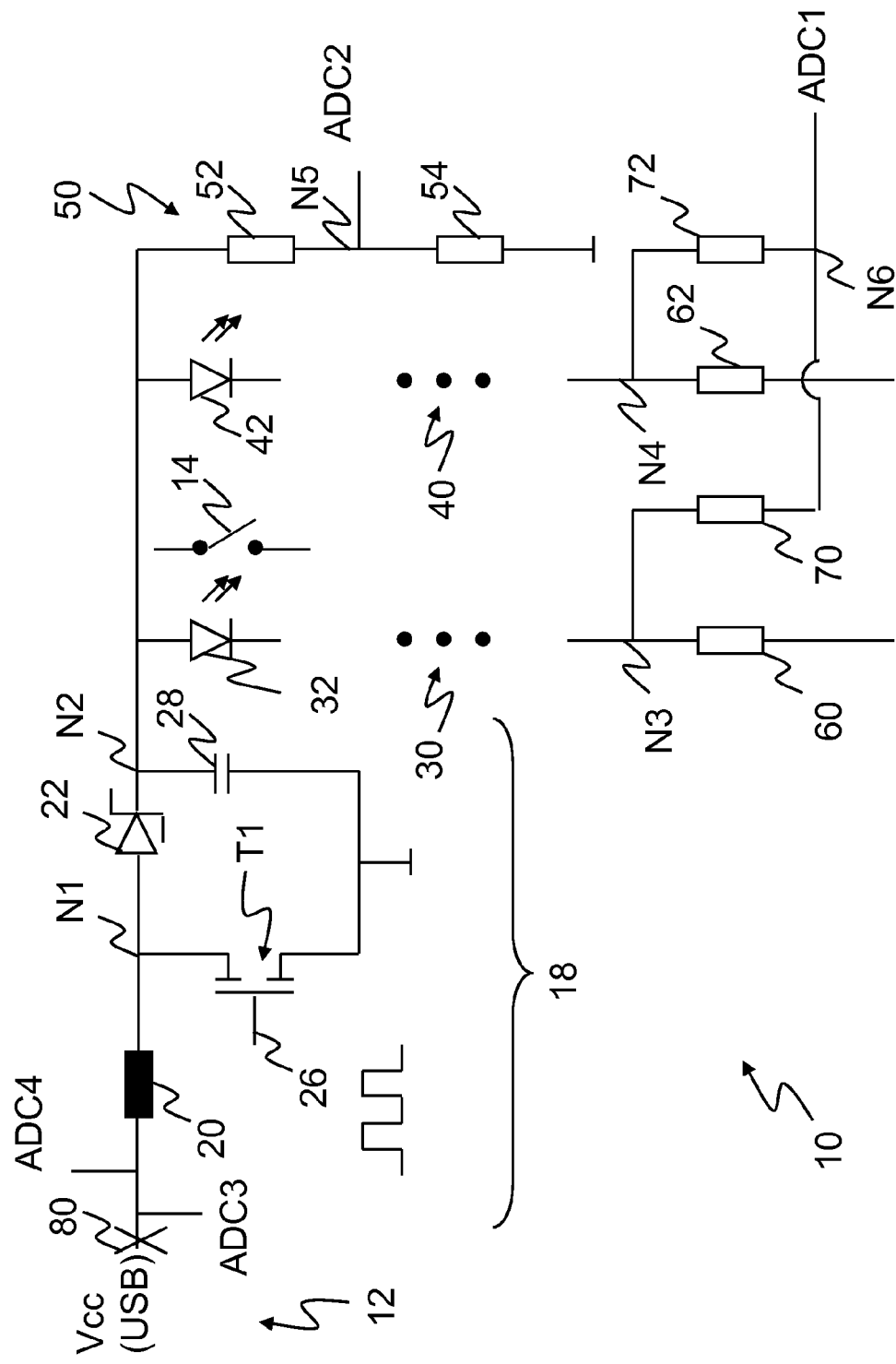
FIG. 9 illustrates a circuit arrangement for controlling the current that flows through strings of optical elements, especially LEDs.

FIG. 9 illustrates a circuit arrangement 10 for controlling the current that flows for example through strings of optical elements, especially through LEDs 32, 42. Alternatively only one LED, bundles of Strings of LEDs or drivers for optical elements may be controlled in a similar manner or in the same manner. The circuit arrangement 10 is part of a keyboard in the embodiment.

There is a positive operation voltage Vcc at an interface 12 between the keyboard and a computer that is not shown in FIG. 9. A key switch 14 of the keyboard is located adjacent to or in physical contact to LED 32. Other key switches of the keyboard are not shown in FIG. 9. Alternatively, wave guides may be used to conduct the light to the key switches, for instance to frames that are arranged around each key switch.

The interface 12 is electrically conductively coupled to a voltage converter 18. In the embodiment, an USB interface 12 is used.

The voltage converter 18 is of the boost type. Alternatively, a buck converter, an inverter or another type of converter may be used. The input voltage is, for instance, in the range of 4 volts to 5 volts. The output voltage of the converter may be in the range of 15 volts to 25 volts.

The converter 18 comprises an inductor 20 between Vcc and a circuit node N1. The inductor 20 may have an inductance in the range of 10 to 100 micro Henry, for instance 47 micro Henry. The drain of a switching field effect transistor (FET) T1 is connected to node N1. The source of switching transistor T1 is connected to ground. A PWM signal 26 is connected to the gate of transistor T1. Instead of FETs bipolar transistors can also be used in an similar way.

Furthermore, the anode of a Schottky diode 22 or of another diode is also coupled to node N1. The cathode of Schottky diode 22 is connected to a circuit node N2. The Schottky diode enables fast switching and has a low forward voltage. Alternatively, an appropriately controlled transistor, especially a MOSFET, may be used instead of the Schottky diode 22.

A capacitor 28 is connected to the node N2 and to ground potential. The principal function of the voltage converter 18 is known. Diode 22 forms a second switch of the voltage converter 18 in addition to transistor T1.

A first string 30 of LEDs is connected to node N2 and to a node N3. There is a detection resistor 60 connected to node N3 and to ground. Thus there is a first branch or a first serial connection consisting of string 30 and of resistor 60.

The first string 30 consists, for instance, of seven or eight LEDs or any other number. Only the first LED 32 of string 30 is shown in FIG. 9.

A second string 40 of LEDs is connected to node N2 and to a node N4. There is a detection resistor 62 connected to node N4 and to ground. Thus there is a second branch or a second serial connection consisting of string 40 and of resistor 62.

The second string 40 consists for instance of seven or eight LEDs or any other number resulting in a voltage drop equal to that one of the first string 30, which usually means the same number of LEDs as in the first string 30. Only the first LED 42 of string 40 is shown in FIG. 9.

In other embodiments there may be more than two strings of LEDs connected in parallel to strings 30 and 40. The other strings are connected to ground via resistors that correspond to resistors 60 and 62. Resistors 60, 62 are also named as resistor R_B and have a low Ohmic value, for instance less than 50 Ohms.

A voltage divider 50, for instance a 10:1 divider, is also connected to node N2 and to ground. The voltage divider 50 consists of two or more than two resistors 52, 54 in serial connection. A node N5 is on the connection between resistors 52 and 54.

A first resistor 70 is connected to node N3. A resistor 72 is connected to node N4. Corresponding resistors are connected to corresponding nodes of further LED strings that may be connected to node N2. The other ends of the resistors 70, 72 etc. are connected to a circuit node N6. Resistors 70, 72 etc. have all the same high Ohmic value of for instance more than 4.5 kilo ohms or 5 kilo Ohms.

There are four analog digital converters ADC1 to ADC4. The analog digital converter ADC1 is connected to node N6 and detects the mean value I_E of the currents through resistors 60, 62 etc. Current I_E multiplied by k, i.e. the number of LED strings, corresponds to the output current of voltage converter 18.

The analog digital converter ADC2 is connected to node N5 and detects the voltage U_LED over the LED strings 30, 40 etc. Voltage U_LED corresponds to the output voltage of voltage converter 18. Furthermore, a unity gain amplifier or a voltage follower may be coupled between node N5 and analog digital converter ADC2. Voltage divider 52, 54 and/or the unity gain amplifier is optional.

Figure 13:
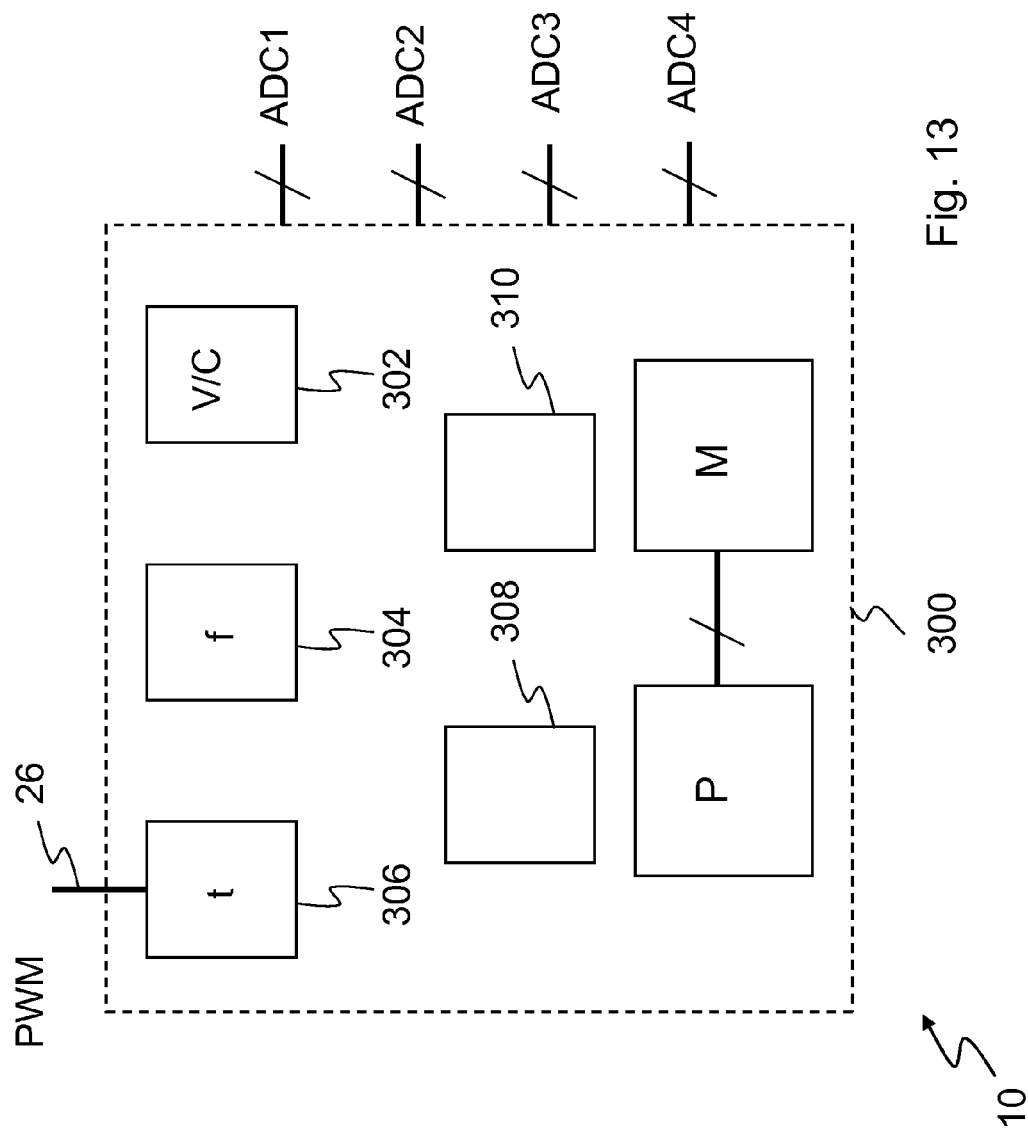
FIG. 13 illustrates further components of the circuit arrangement.

The analog digital converter ADC3 is connected to the input of a circuit that comprises the voltage converter 18 and a microcontroller, see FIG. 13. The analog digital converter ADC3 detects U_IN (U Input). Again a voltage divider or a unity gain amplifier may be used. The voltage U_IN corresponds to the input voltage of voltage converter 18 but also to the input voltage of a further converter that is used to produce the operating voltage of the microcontroller.

The analog digital converter ADC4 is connected to an inductor (not shown) of the interface 12 via a resistive capacitive network that is not shown in FIG. 9. This network is used for DCR sensing (Direct Current Resistance). The analog digital converter detects I_IN (I Input) that corresponds to the input current of the voltage converter 18 plus the input current of a further voltage converter for the microcontroller. It is possible to use ADC4 to determine the electric power used by the microcontroller. However, other methods may be used to determine the current that is used by the microcontroller. This electric current remains comparably constant during the operation of the circuit arrangement 10.

The following equations may be used to determine the overall voltage current characteristics of circuit arrangement 10 or to find an appropriate point of operation:

$$I\_E = U\_ADC1/R\_B \quad (1),$$

wherein U_ADC1 is the voltage detected by analog digital converter ADC1 and R_B is the Ohmic value of resistor 60, 62, etc.

$$P\_OLED = U\_LED * I\_E * k \quad (2)$$

wherein k is an integer number that gives the number of LED strings and wherein P_OLED is the overall power of the LEDs, Equation 3 is describing the converter's input. By P_OLED and the converters efficiency factor Ny it is correlated to equation 2, which virtually is describing the converter's output. Ny=1−Gamma.

$$I\_ILED = P\_OLED/((1-Gamma)*U\_ILED) \quad (3),$$

wherein I_ILED is the input current into the converter 18, see circuit point 80, and wherein U_ILED is the input voltage of the voltage converter 18, see circuit point 80, while Gamma is the loss factor of the converter 18 (for instance in the range of 0.02 to 0.10 assuming a sufficient load) and $$I\_USB(MAX) = I\_Proz + I\_ILED(MAX) \quad (4),$$

wherein I_Proz is the current that is consumed by the processor and wherein I_ILED(MAX) is the maximum current into the power converter and wherein I_USB(MAX) is the maximum current according to the USB standard.

It is possible to detect the input voltage I_USB directly by using ADC4.

Equations (1) to (4) may be used to calculate I_ILED (MAX). U_LED may be increased until I_ILED reaches I_ILED(MAX).

Figure 10:
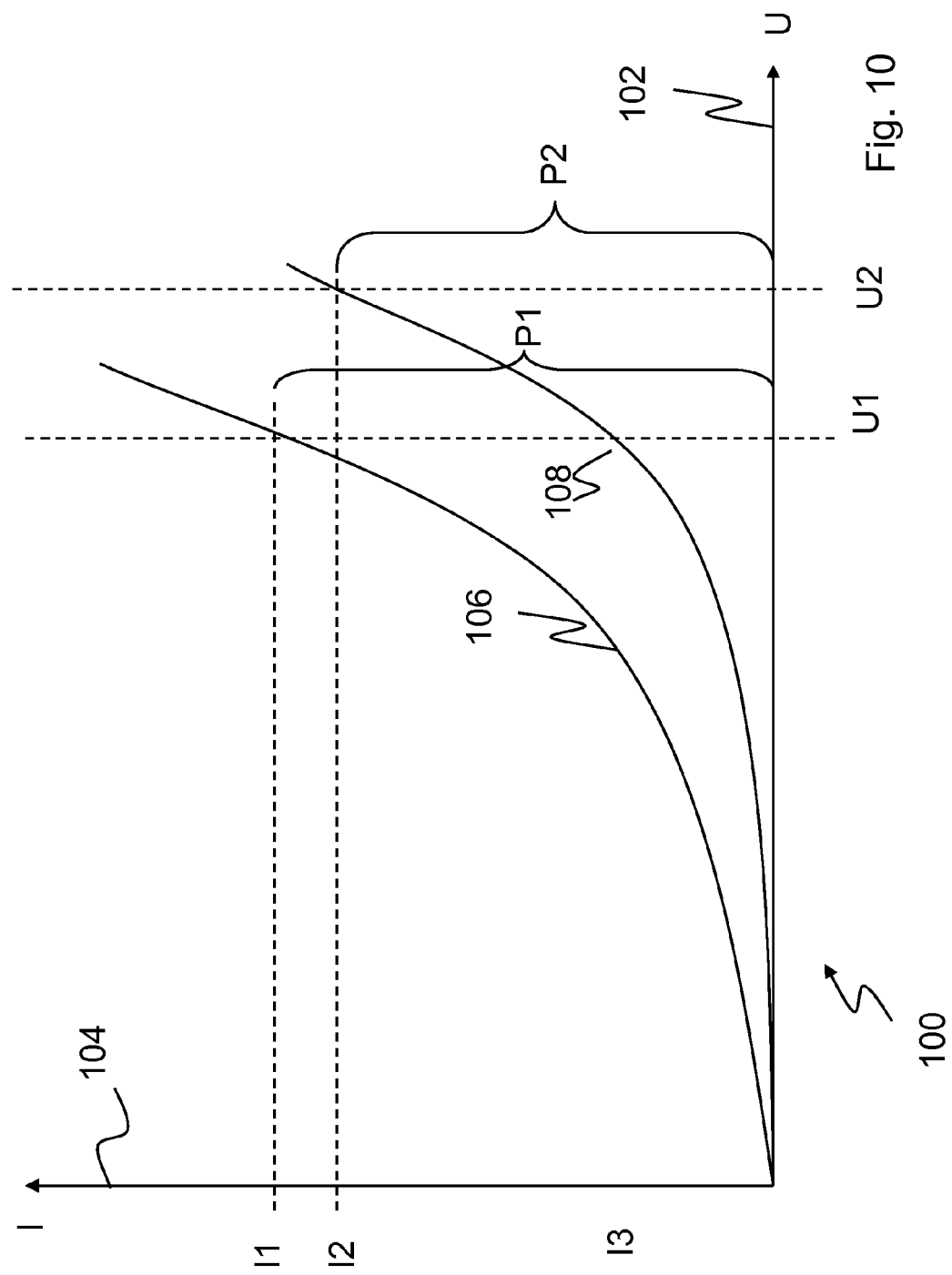
FIG. 10 illustrates two voltage/current characteristics of LEDs.

FIG. 10 illustrates two voltage/current characteristic curves 106 and 108 of two LEDs 32, 42 or of one LED 32 at different temperatures. Alternatively, the characteristic curves 106 and 108 may be valid for two strings 30, 32 of LEDs or for one string 30 at different temperatures.

A coordinate system 100 has an x-axis 102 showing the voltage over the LED or LED string. An y-axis 104 of coordinate system 100 shows the current through the LED or through the string of LEDs.

The characteristic curves of the LED or LED string(s) vary individually even if the LEDs or LED strings are pre selected within given tolerances. Thus it is not known which characteristic curve 106, 108 is valid for an LED or LED string or for a special operation state, for instance for special temperatures.

One of the constraints is that the maximum current of an LED or LED string or LED bundle is obeyed. Another constraint is the maximum input current drawn from the USB interface 12. FIG. 10 shows a first rectangle for the maximum power P1 at the USB interface 12 that is valid for characteristic curve 106, i.e. voltage U1 and current I1. A second rectangle is valid for the maximum power P2 at the USB interface 12 with regard to the characteristic curve 108, i.e. a voltage U2 and a current I2. Current I1 is larger than current I2 but voltage U1 is less than voltage U2.

Figure 11:
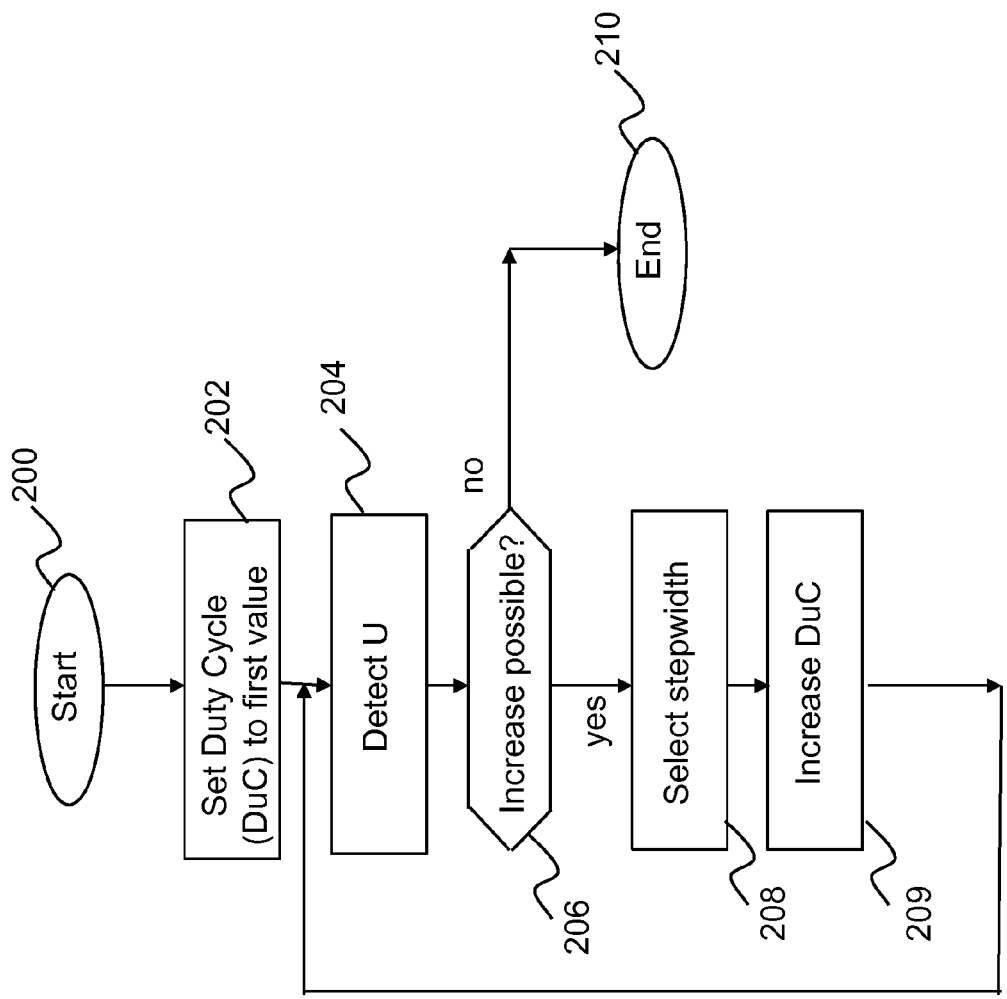
FIG. 11 illustrates steps for determining the characteristic curves of an LED or of a string of LEDs or a bundle of LED strings.

FIG. 11 illustrates steps for determining the voltage to duty cycle characteristic curve of an LED or of a string of LEDs or of a bundle of strings of LEDs. The method starts in step 200. In a following step 202, a start value is selected for the output voltage of the voltage converter 18. A starting duty cycle DuC of 10 to 15 percent may be selected, i.e. drain and source of transistor T1 are connected for 10 to 15 percent of the time t of one duty cycle using a given (fixed) frequency f. It is assumed that the voltage is for instance 14 volts and the current is 10 micro ampere within one LED string. It is furthermore assumed that there are 15 strings, i.e. an overall current of 330 micro ampere. This gives a power of 3.6 mW (milli watts).

There are no restrictions for increasing the DuC at the beginning of the detection of the characteristic curve, see steps 206 and 208. This means that the ratio may be increased at comparably large steps, for instance by 5 to 10 percent, see step 209. In step 209 the duty cycle is increased by the value determined in step 208. Increasing the duty cycle DuC increases the output voltage, for instance as shown in portion 260 in FIG. 12.

Figure 12:
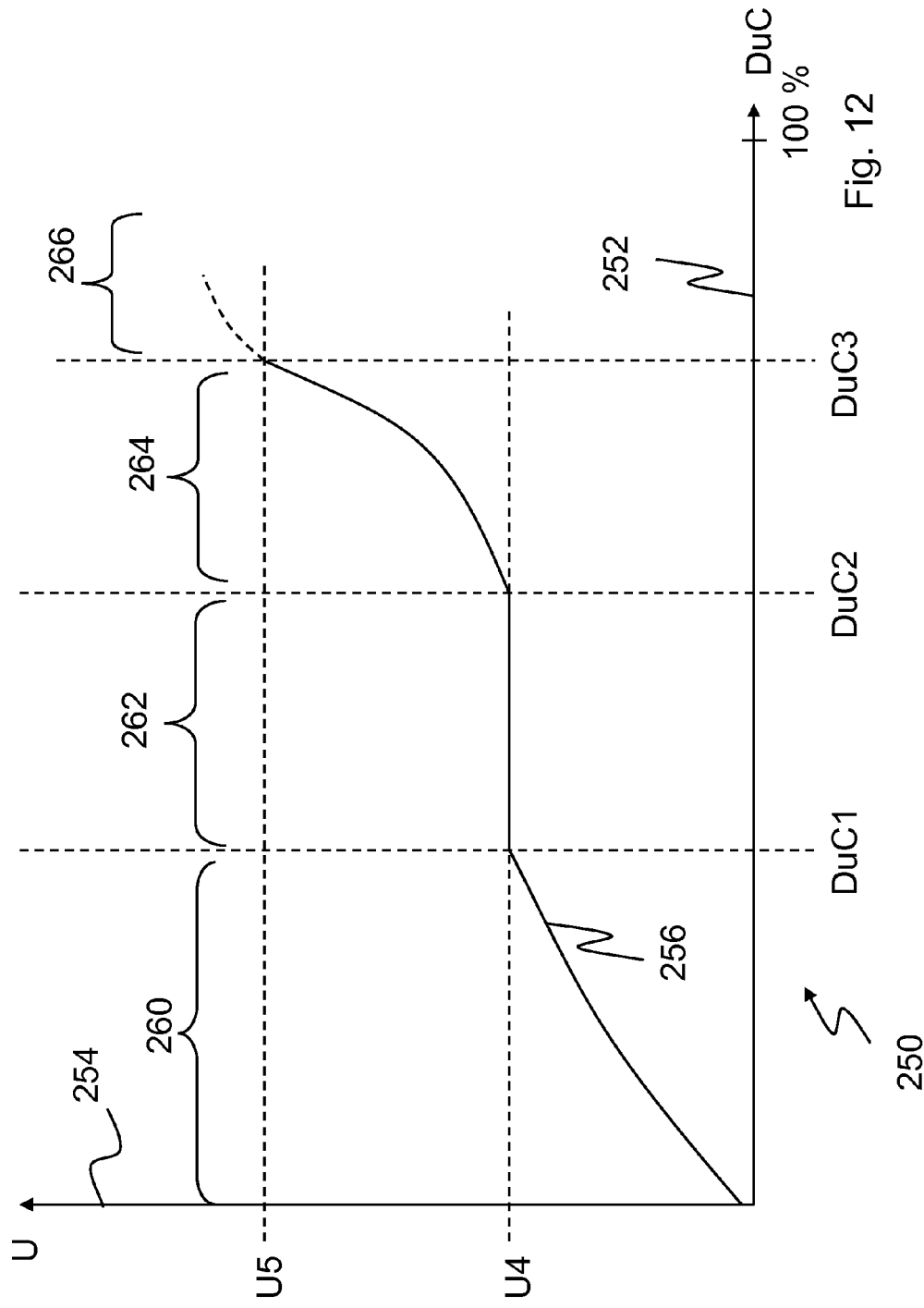
FIG. 12 illustrates the duty cycle versus voltage characteristic curve of the circuit arrangement.

However, in the embodiment a plateau portion 262, see FIG. 12, is reached in the overall characteristic curve at a voltage U4 of 17 volts for instance. The plateau is between a duty cycle DuC1 of for instance 30 percent to 50 to 55 percent, see also FIG. 12. Within the plateau the output voltage of the voltage converter does not increase considerably. Constant voltage means constant current flow through the LED strings 30 to 40.

This means that the duty cycle may again be increased at comparably large steps for instance by 5 to 10 percent, see steps 206, 208. It is assumed that there are for example 17 volts (U4) and a current of for example 1 milli ampere at the beginning and also at the end of the plateau. Furthermore the frequency also has an influence to the width of the plateau.

If the duty cycle is further increased, step 209, there will be again a rising portion 264, see FIG. 12, of the characteristic curve 256. However, the shape of the curve within portion 264 depends on the individual LED, string of LEDs or strings of LEDs that are used in parallel connection.

At the end of the rising portion 264, see FIG. 12, a very small step width is used in step 208 to detect a decrease or a at least a smaller increase of the output voltage of the voltage converter 18 as early as possible.

If a decrease or a smaller increase of the output voltage is detected it is possible to extend the curve further by the methods that will be described below with reference to FIGS. 14 to 25.

The step width may be smaller than 1 percent of the current duty cycle. The step width may be smaller than 0.5 percent or smaller than 0.45 percent.

Step 210 follows step 206 directly if no increase of the duty cycle is possible any more, see step 206. No increase is possible if the limits have been reached that are set by the specification of a standard, for instance by the USB standard. The method ends in step 210.

FIG. 12 illustrates the duty cycle (DuC) versus voltage characteristic curve 256 of the circuit arrangement 10. A coordinate system 250 has an x-axis 252 showing the duty cycle of the voltage converter, i.e. of the PWM signal 26. An y-axis 254 of coordinate system 100 shows the voltage U_LED, i.e. the voltage at the output of the voltage converter 18.

There is a first portion 260 of characteristic curve 256. Within the first portion there is a first increase from DuC of 0 percent and voltage 0 volt to DuC1 and U4. DuC1 is for instance 30 percent. U4 is for instance 17 volts.

A second portion 262 of characteristic curve 256 forms a plateau where the voltage does not change significantly if the duty cycle is increased from DuC1 to DuC2. DuC2 is for instance 50 to 55 percent. It is possible to change the frequency of the PWM signal 26 within the portion 262, for instance to increase the frequency.

A third portion 264 of characteristic curve 256 starts at DuC2. Within the third portion there is again an increase to a duty cycle DuC3 and a voltage U5 at the output of the voltage converter 18. The following formula may be true in portion 264:

$$U(DuC) = 1/(1-DuC)*U0,$$

wherein U0 is the input voltage of the converter 18.

The frequency of PWM may be higher in portions 260 and 262 than in the main part of portion 264. Alternatively PFM may be used within portions 260 and 262.

The frequency of PWM at the end of portion 264 may be lower than the frequency of PWM within the main part of portion 260. There may be a frequency of for instance 1.5 Megahertz within the main part of portion 264 and a frequency of only 0.75 Kilohertz at the end of portion 264, i.e. the frequency may be reduced within the range of 25 percent to 75 percent, preferably in a stepwise manner.

There is a further increase of the voltage in a fourth portion 266 of characteristic curve 256. The portion 266 is outside the limits of the specification of the USB interface 12. Therefore, portion 266 is not detected. However, it is possible to move very closely to portion 266 as is explained below with reference to FIGS. 14 to 25.

FIG. 13 illustrates further components of the circuit arrangement 10. The analog digital converters ADC1 to ADC4 are coupled to a microcontroller 300 by signal buses that comprise data lines and control lines.

The microcontroller 300 comprises:
- a memory M, for instance a RAM (Random Access Memory), ROM (Read Only Memory), PROM (Programmable ROM) or EEPROM (Electrical Erasable PROM) or another kind of memory, and
- a processor P that performs instructions stored in the memory M.

Alternatively, the analog digital converters ADC1 to ADC4 may also be part of the microcontroller 300.

The microcontroller 300 further comprises:
- a characteristic curve determining unit 302 or a respective program, for instance a part of the firmware of the keyboard, for instance,
- an optional frequency determining unit 304 or a respective program, for instance a part of the firmware of the keyboard, for instance, and
- a duty cycle determining unit 306 comprising for instance a program and a hardware.

The characteristic curve determining unit 302 performs the method shown in FIG. 11.

The optional frequency determining unit 304 may be used at the end of the portion 264. Furthermore unit 302 may be used to increase the frequency f of the PWM signal 26 within portion 260 and 262. Alternatively PFM may be used within portions 260 and 262.

However, left of DuC2 another means of modulating may be applied instead of simply increasing the frequency of the PWM—the PFM (pulse frequency modulation):

Which means to utilize a constant switch on phase of the length of the on phase applied at DuC2 and lengthening the off phase for voltages lower than U4 (FIG. 4). This virtually means even to continuously lowering the frequency for lower voltages. The voltage there will be a strictly homogeneous increasing function of the frequency, in theory it virtually might be nearly linear. This is the same method, switching power supplies are utilizing in low power mode for better efficiency. This also applies to other occurrences of portions 260 and 262.

The duty cycle determining unit 306 may be part of the characteristic curve determining unit 302 but may also be used to determine the duty cycle depending, for instance, on values that are user dependent or depending on temperature values.

Alternatively, another hardware may be used instead of microcontroller 300, e.g. a separate microprocessor or a hardware without a processor.

A control unit 308 is used to control the duty cycle of the PWM signal 26 with regard to brightness far below P_MAX. The details will be described below with reference to FIGS. 15 to 19. A control unit 310 is used to control the duty cycle of the PWM signal 26 with regard to brightness near P_MAX. The details will be described below with reference to FIGS. 20 to 25.

Figure 14:
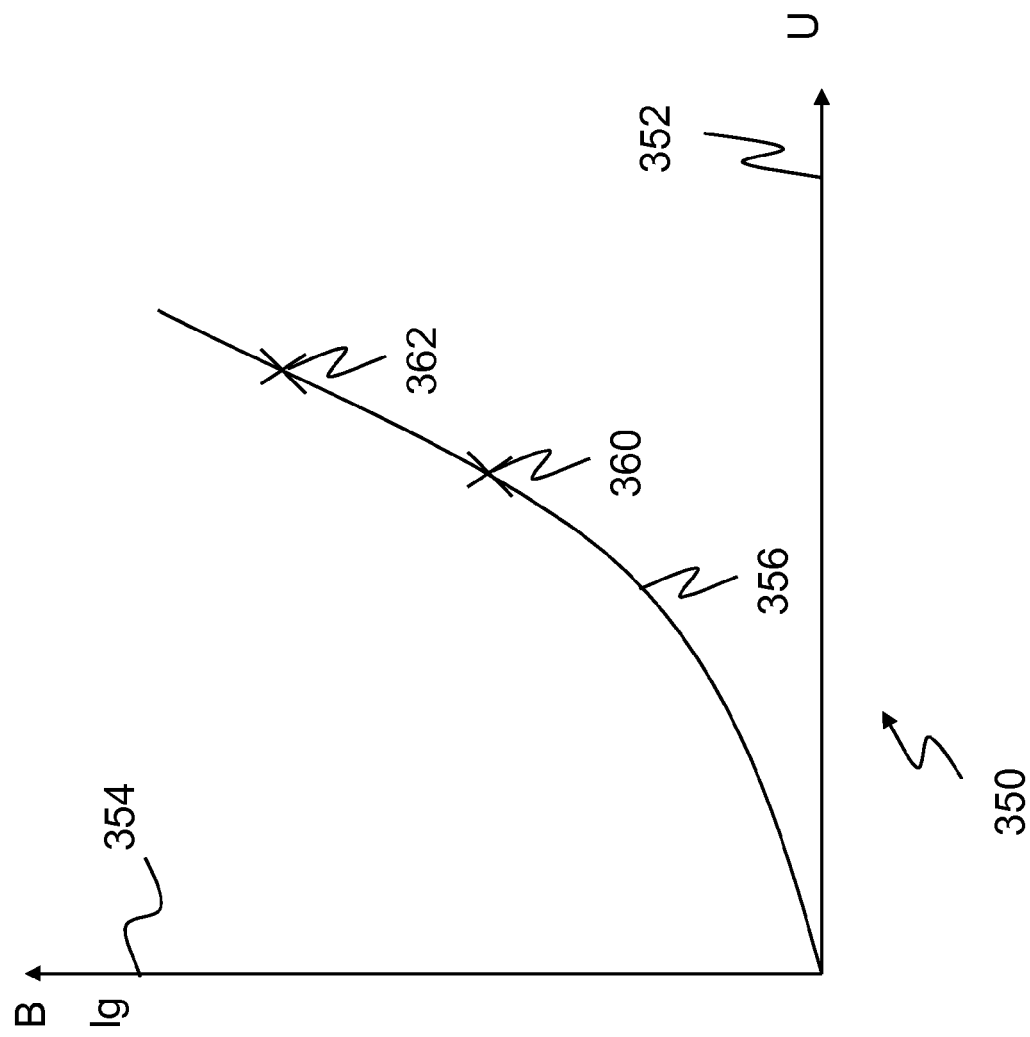
FIG. 14 illustrates the characteristic curve of the voltage to brightness of an LED or of an LED string or of LED strings or a bundle of LED strings.

FIG. 14 illustrates the current to (or versus) brightness characteristic curve 356 of an LED 32, 42 or of an LED string 30, 40. The same curve 356 is valid for all LED strings 30, 40, i.e. the current value has to be multiplied by the number of LEDs strings 30, 40. These data could be found in the data sheet of the manufacturer of the LEDs. It is possible to store the data in memory M using a table or splines, for instance by using cubic splines.

A coordinate system 350 has a horizontal x-axis 352 showing the values of voltage U at the LED(s). A vertical y-axis 354 shows the values of the brightness B using a logarithmic scale. The current versus brightness correlation for nearly the whole domain is linear with a slight offset, i.e. a "dead" area for very low currents, at the larger value end slightly sub linear.

Point 360 of characteristic curve 356 relates to a brightness 360 below P_MAX, i.e. usually to a medium or low brightness of LED 32, 42. Point 362 of characteristic curve 356 relates to a brightness 362 near P_MAX, i.e. usually to a high brightness. P_MAX is determined by the product of the actual input voltage of the device and the maximum current set by the USB standard. The power P_MAXLED that can be used for the LEDs 32, 42 and for the strings 30, 42 depends on P_MAX and on other circuits that are connected to one USB interface 12 or USB hub. P_MAX is for instance nominally 2.5 Watt for USB 2.0. P_MAXLED is lower than P_MAX as the energy consumption of other devices and/or circuits has to be taken in consideration, i.e. the consumption of the microcontroller 300 or of other devices that are operated on the same USB interface 12. This will be explained in more detail below with reference to FIG. 25.

Figure 15:
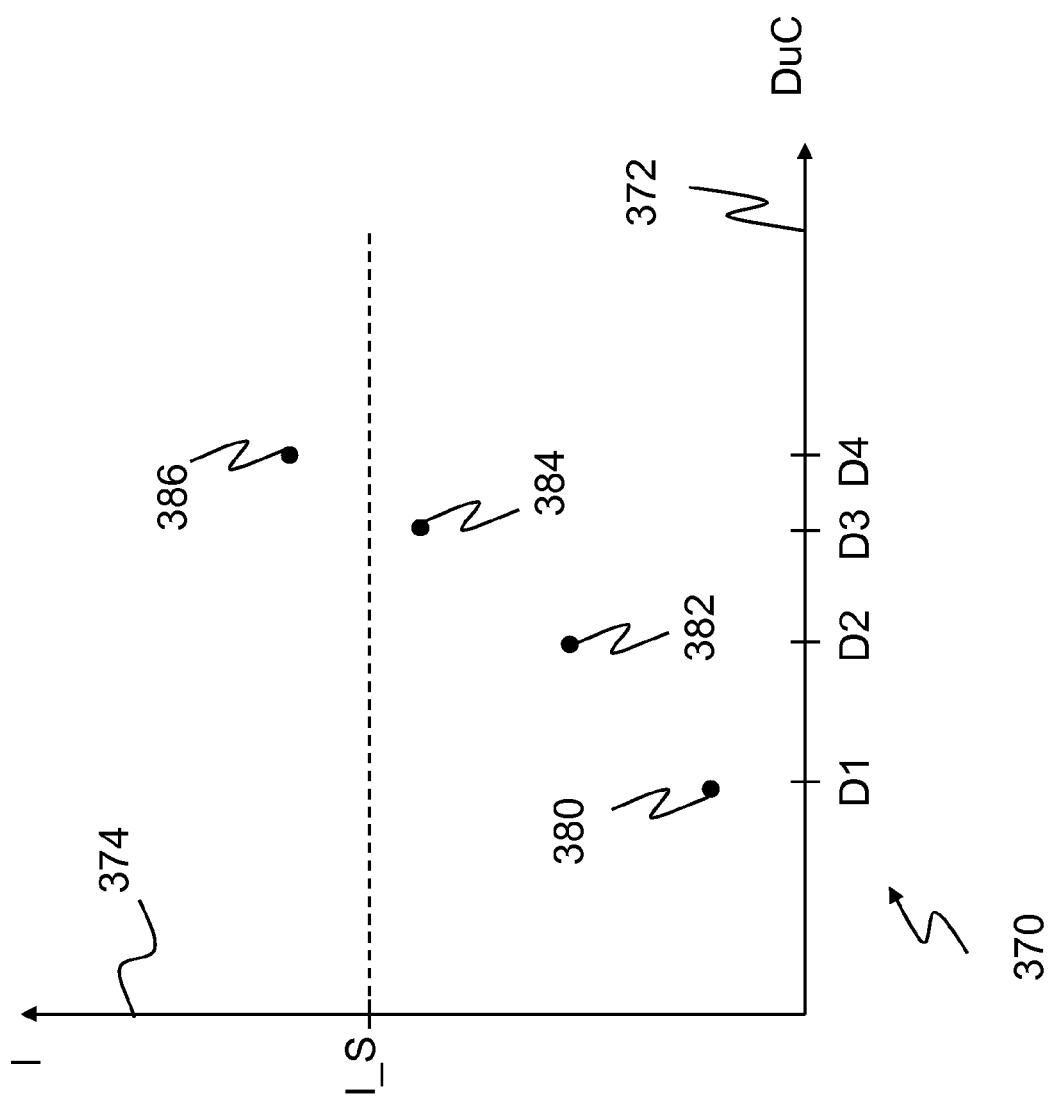
FIG. 15 illustrates detected pairs of values of duty cycle and current that flows for example through LED strings.

FIG. 15 illustrates detected pairs of values of duty cycle and current through an LED 32, 42 or an LED string 30, 40 or preferably through all LED strings 30, 40 that are connected in parallel. It is possible to detect or even to measure the I values using analog digital converter ADC1. The corresponding duty cycle DuC of PWM signal 26 values will be known within microcontroller 300.

A coordinate system 370 has a horizontal x-axis 372 showing the values of the duty cycle DuC of PWM signal 26. A vertical y-axis 374 of coordinate system 370 shows the values of the current I_LED that flows through all LEDs 32, 42, i.e. I_LED=I_E*k as defined above.

A reference current I_S is also shown in coordinate system 370. Reference current I_S corresponds to a medium brightness B that has been selected by a user of the keyboard that comprises key switch 14. Characteristic curve 356 has been used to determine the current I_S that belongs to the selected brightness.

Pairs 380 to 386 of values of the duty cycle DuC and the corresponding current I have been detected using analog digital converter ADC1 and microcontroller 300. It is easily possible to also calculate triplets of values of the duty cycle DuC, the voltage U and the corresponding current I. It can be seen that there is an increasing curve that would connect the points 380, 382, 384 and 386. The duty cycle DuC is increased from D1 for point 380, via D2 for point 382, via D3 for point 384 to D4 for point 386. There may be the same increase for the duty cycles D1 to D4. However, it is also possible to have smaller intervals for points that are located near I_S as shown in FIG. 15. The microcontroller 300 stops the detection of points if a current I is detected that is higher than the reference current I_S, i.e. point 386 is the last point that is automatically detected in the embodiment.

Figure 16:
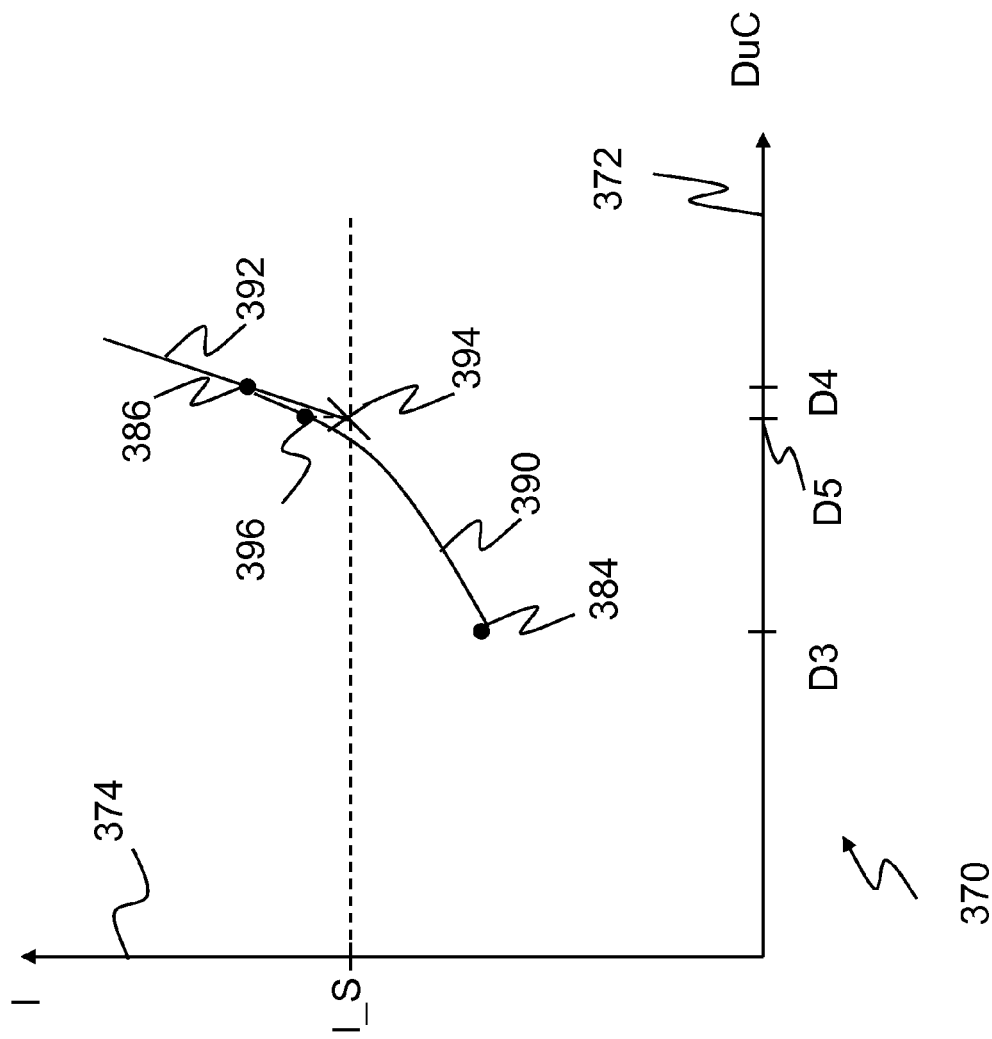
FIG. 16 illustrates a Newton iteration that is used to detect the first point of operation that is far from P_MAX.

FIG. 16 illustrates a Newton iteration that is used to detect the first point of operation that is far from P_MAX. FIG. 16 shows a magnification of coordinate system 370 for the relevant range between duty cycles D3 and D4 that relate to points 384 and 386 nearby the reference current I_S.

The task for the microcontroller 300 is to find the cross section between a curve 390 that would connect the points 384 and 386 and a horizontal line that represents current I_S. Curve 390 is a cubic spline in the embodiment. Other interpolation methods may also be used.

The Newton iteration starts at point 386. A straight line 392 shows the slope of curve 390 at point 386. According to the known Newton iteration a cross section of the straight line 392 and the horizontal line for I_S can be calculated, see point 394. Point 394 gives a duty cycle D5. The formula (spline) for curve 390 may be used to determine the current I that belongs to duty cycle D5, i.e. point 396. The next iteration of the Newton method is for point 396. The Newton iteration ends if a duty cycle has been determined that gives a current that is within a given delta range with regard to current I_S.

Figure 17:
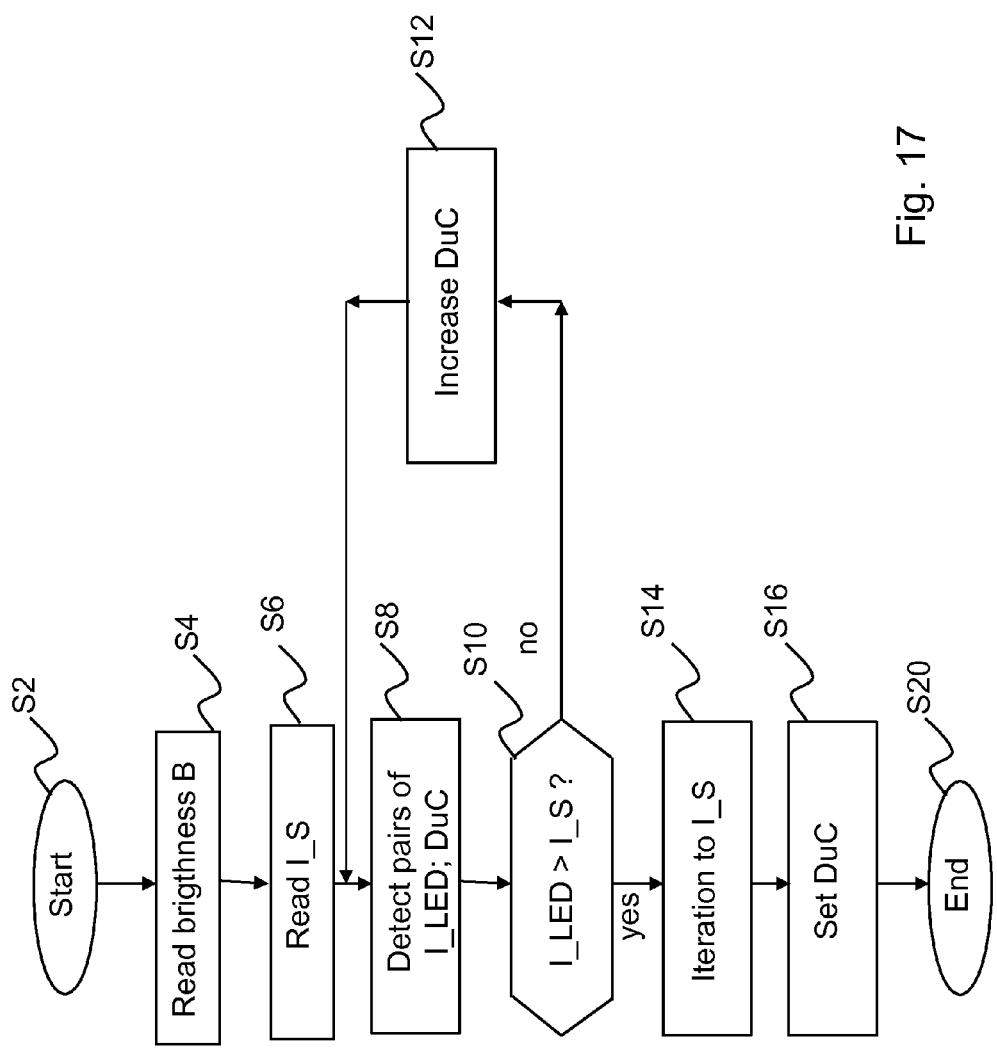
FIG. 17 illustrates method steps for the detection of the first point of operation that is far from P_MAX.

FIG. 17 illustrates method steps for the detection of the first point of operation that is far from P_MAX. This method has already been described graphically above with regard to FIGS. 14 to 16. All steps S2 to S20 that are shown in FIG. 17 are automatically performed by microcontroller 300.

The method starts in a method step S2, i.e. short in step S2. A brightness B is determined in a step S4 that follows after step S2. The brightness B is based on a value that, for instance, was entered by a user of the keyboard. The brightness B may be read from memory M or from an input buffer.

Characteristic curve 356 is used in step S6 to determine the reference current I_S that belongs to the brightness B selected by the user.

Pairs of values of duty cycle DuC and I_LED are determined in step S8 that follows step S6. The first pair is for instance represented by point 380 in FIG. 15.

Then, it is checked whether the current I_LED or I that belongs to the last detected pair of values is higher than I_S, i.e. the reference value. The method continues in a step S12 if the value I_LED is not higher.

The duty cycle DuC is increased in step S12, for instance by a fixed value or according to a strategy for increasing the duty cycle DuC.

The method is now within a loop of steps S8 to S12 and determines several pairs of values of DuC and I, see for instance points 382 and 384 in FIG. 15. The loop of steps S8 to S12 will only be left in step S10 if the current I_LED is greater than the reference current I_S.

Step S14 follows immediately after step S10 if the current I_LED is higher than the reference current I_S, i.e. the last point 386 has been detected. The microcontroller 300 performs the Newton iteration that has been described above with reference to FIG. 16. Other iteration methods or other methods for determining the relevant cross section may also be used. The iteration ends if the duty cycle DuC at the cross section or near the cross section of curve 390 and reference current I_S has been found.

The duty cycle DuC that has been determined in step S14 is used in step S16 to control the PWM signal 26 and the voltage converter 18. Then, the method ends in step S20.

However, there may be a drift of curve 390 and also of curve 356 depending, for instance, on temperature changes within the keyboard or outside the keyboard. The drift results in a higher or lower current I with regard to the duty cycle DuC that has been determined at the beginning. Therefore, preferably closed loop controlling is necessary, see FIG. 18.

Figure 18:
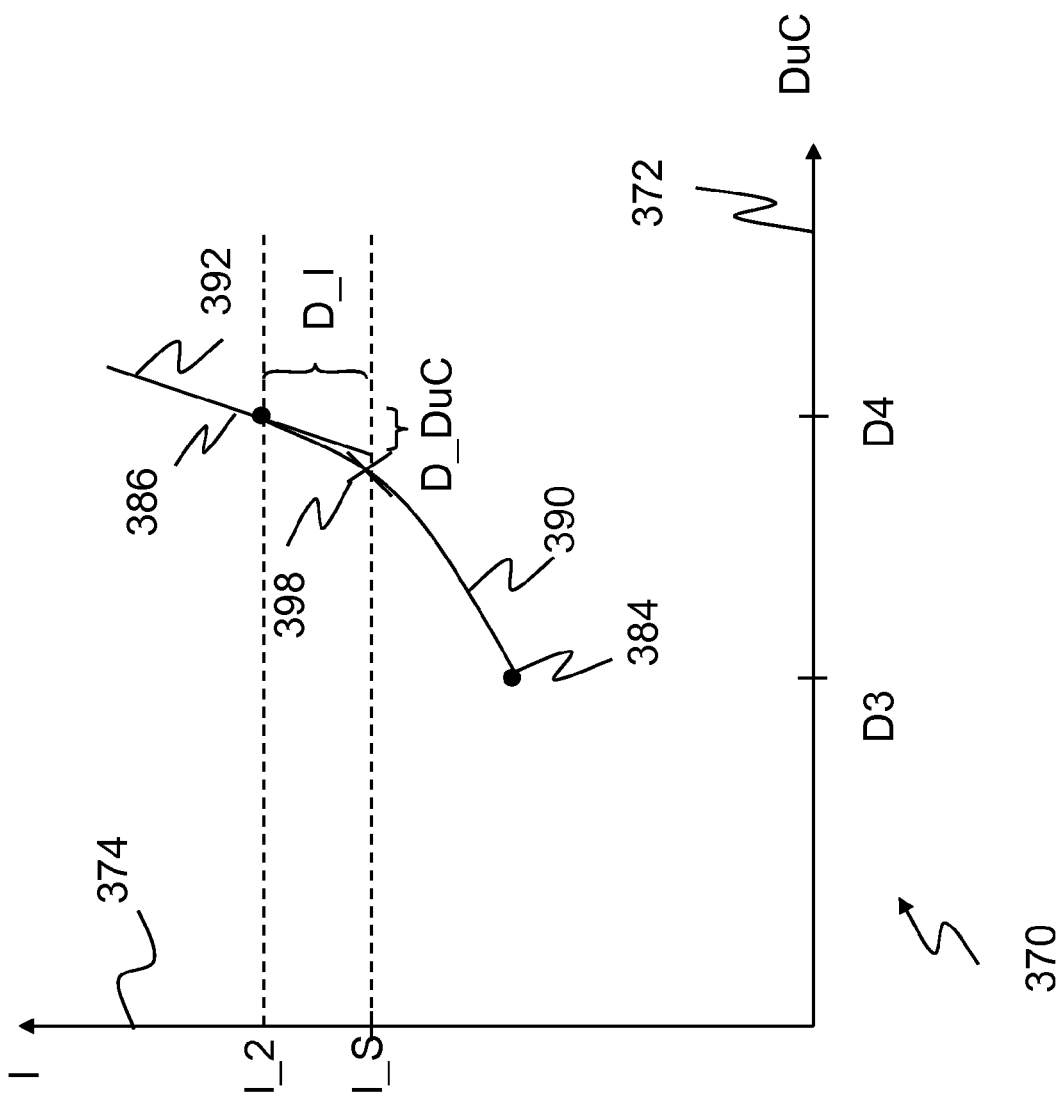
FIG. 18 illustrates the controlling of medium brightness during the operation of a keyboard.

FIG. 18 graphically illustrates the controlling of medium brightness during the operation of a keyboard. It is supposed that the last point of operation was a point 398. Point 398 was determined for instance by the method described with regard to FIGS. 14 to 17. Alternatively, point 398 has been determined by previous closed loop control.

FIG. 18 shows a current I_2 that is higher than the reference current I_S. There is a delta D_I of I that is detected by the analog digital converter ADC1. A correction of the duty cycle is necessary if delta D_I is outside a delta range that may be, for instance, defined by a threshold value T1. The value of correction may be determined using one of several methods. A very simple but nevertheless efficient method is used in the embodiment.

It is supposed that a drift to point 386 took place. Alternatively, any other point could also be handled in the same way. The slope of the straight line 392 corresponds to the slope m of curve 390 at point 386. Point 386 is the actual or current value at curve 390.

This slope m and delta D_I are used to calculate the delta DuC according to the following formula:

$$D\_DuC = D\_I / m,$$

where m is the slope of straight line 392. D_DuC is then used to decrease DuC.

If the drift is in the other direction, i.e. the current I_LED decreases below a threshold with regard to I_S, a similar method is used to determine D_DuC. However, the slope of curve 390 at point 398 is used, i.e. of the target point.

Figure 19:
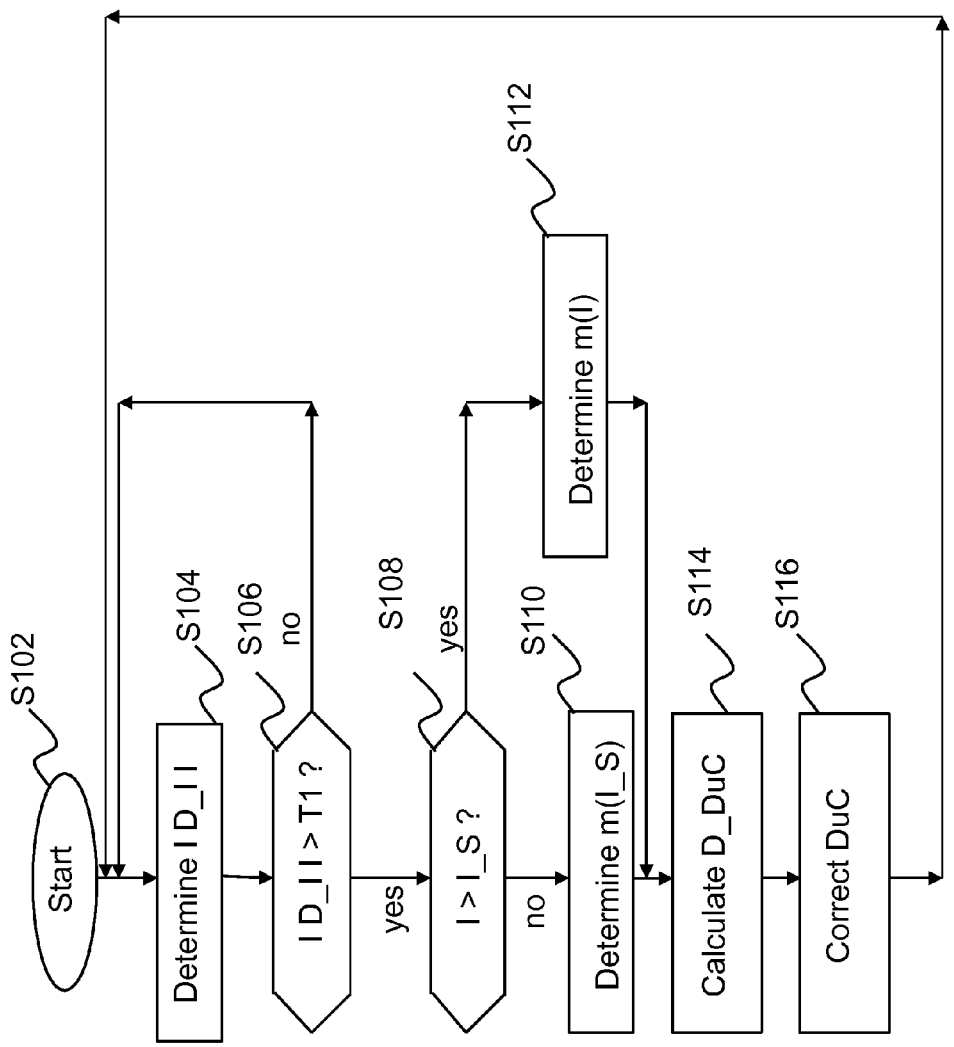
FIG. 19 illustrates method steps for the controlling of medium brightness during the operation of a keyboard.

FIG. 19 illustrates method steps for the digital controlling of medium brightness during the operation of a keyboard. This method has already been described graphically above with regard to FIG. 18. All steps S102 to S116 that are shown in FIG. 19 are automatically performed by microcontroller 300.

The method starts in a method step S102, i.e. in short in step S102. Delta I, i.e. D_I is determined, in a step S104 that follows after step S102. Analog digital converter ADC1 is used to determine I_LED. Microcontroller 300 calculates the difference between I_LED and reference current I_S.

Then, it is checked whether the absolute value of D_I is higher than a threshold value T1. If the absolute value of D_I is not higher, the method continues in step S104.

The method is now within a loop of steps S104 and S106 and is waiting for the occurring of drift. Alternatively, the method is only started if a drift is detected. Interrupts may be used to start a corresponding routine of microcontroller 300.

The loop of steps S104 and S106 will only be left in step S106 if the absolute value of D_I is higher than the threshold value T1.

Step S108 follows immediately after step S106 if the absolute value of D_I is higher than the threshold value T1, i.e. the last point 386 has been detected.

Then, it is checked whether the actual value of current I or of current I_LED is higher than the reference current I_S. The method continues in step S110 if the value of current I is not higher than I_S, i.e. there is a drift to lower values of current I.

The value of the slope of the curve 390 at the target point is determined in step S110, for instance at point 398 as shown in FIG. 18. The method is continued in step S114 afterwards.

However, the method continues after step S108 in step S112 if the value of I is higher than I_S, i.e. there is a drift to higher values of current I. The value of the slope of the curve 390 at the current or actual point of operation is determined in step S112, for instance at point 386 as shown in FIG. 18. The method is continued in step S114 afterwards.

Step S114 relates to the calculation of the correction value or delta value D_DuC for the duty cycle DuC according to the formula that was given above.

The current duty cycle DuC is corrected in step S116 based on the calculated value for D_DuC.

Step S104 follows again after step S116, i.e. the method is within a loop of steps S104 to S116 and performs controlling of the brightness of the LEDs 32, 42. The method ends if the computer and the keyboard are, for instance, switched off.

Figure 20:
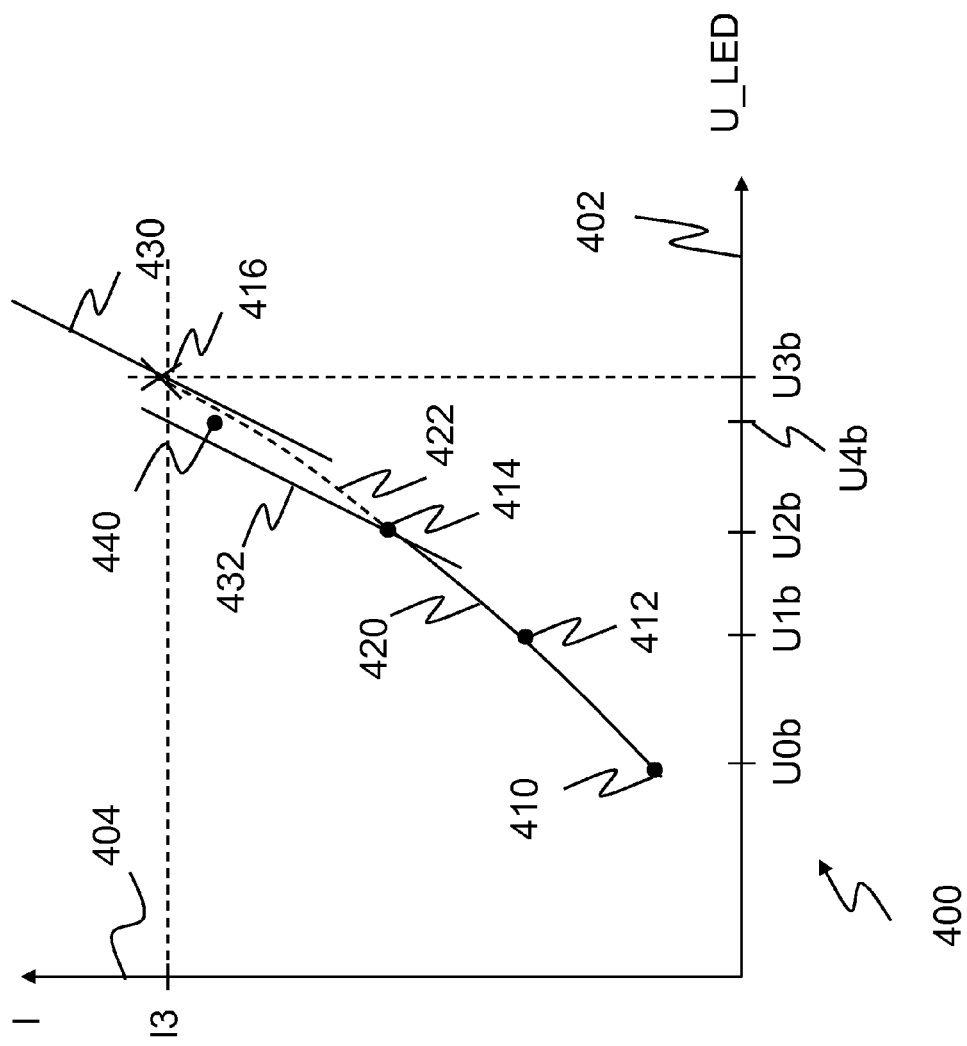
FIG. 20 illustrates the determination of a characteristic curve near P_MAX.

FIG. 20 graphically illustrates the determination of a characteristic curve near P_MAXLED. The calculation of P_MAXLED will be described in more detail with regard to FIG. 25 below.

A coordinate system 400 has a horizontal x-axis 402 showing the values of U_LED. U_LED is detected using the analog digital converter ADC2. A vertical y-axis 404 of coordinate system 400 shows the values of I_LED. I_LED is detected using the analog digital converter ADC1.

It is supposed that a current I3 and a voltage U3b are valid for the maximum power consumption that is allowed for the LEDs 32, 42, i.e. for the strings 30, 42 at that moment. This means that the product of the current I3 and of the voltage U3b is equal to the electric power P_MAXLED.

The methods that will be described in the following do not exceed the power limit P_MAXLED. Since the function is concave, the slope used for interpolation is steeper than the real one, guaranteeing, that the calculated new U_LED is lower than U_LED_U3b. Only if some other device is consuming additional power decreasing the power, that is left to be used by the lighting system, this could happen. But since the MCU (micro controller unit) or other processing unit is controlling all the components that could cause this, it can reduce the LED-current before starting the device consuming additional power. Temperature drift is slow enough to be detected before P_MAX exceeding the limit.

Furthermore, the power limit P_MAXLED is variable. However, the methods may also be used for a power limit that is fixed.

Pairs of detected values 410 to 414 are detected by the microcontroller 300, i.e. a point 410 having a voltage U0b and corresponding current, a point 412 having a voltage U1b and corresponding current, and a point 414 having a voltage U2b and corresponding current. The points 410 to 414 lie within the specification of the USB standard or of another standard, for instance of firewire. This means that the electric power for points 410, 412 and 414 is smaller than the maximum power P_MAXLED. Therefore, the detection of these points 410, 412 and 414 is possible by increasing U with a fixed step width or according to another appropriate strategy. It is possible to use interpolation to find a curve or curves 420 that lie below points 410 to 414. Spline interpolation may be used, for instance cubic splines or quadratic splines.

However, a more sophisticated method is used to make sure that the maximum power P_MAXLED is not exceeded if the operation point is near to the maximum power. This will be described in the following.

A curve 422 is extrapolated from the point 414 to a point 416 that corresponds to a maximum power and has a voltage of U3b and the current I3. Again, splines could also be used for the extrapolation. However other extrapolation methods may be used as well.

The slope m of curve 422 at point 416 is determined, for instance by using the first derivative of curve 422. A straight line 430 shows this slope m. It is presumed that the slope m of curve 422 increases with increasing values of U. The slope m at point 416 is also used at point 414 to determine the next value of U_LED.

This can be graphically done by a parallel translation of line 430 to point 414, see straight line 432. Then, the cross section of line 432 and horizontal line I3 is calculated, for instance by using the difference of the current I3 and the current at point 414 and the slope m of line 432. This results in a delta U that can be added to the voltage U2b at point 414. The resulting voltage is the voltage U4b.

The voltage U4b is used to determine the corresponding duty cycle DuC, for instance by using the characteristic curve 256, see FIG. 12. Stored pairs of values of curve 256 may be used for this purpose. Alternatively, a formula may be used that may be gotten by rearranging the formula that has been given above for U(DuC). Spoken with other words, either using the inverse function of the converter's characteristic function give a good estimate of the necessary duty cycle, or by using the data from curve 256 for creating a inverted spline, i.e. by mirroring curve 256 diagonally.

This duty cycle DuC is used to control the converter 18. Then the voltage U_LED is detected again by analog digital converter ADC2 and the corresponding current I is detected by analog digital converter ADC1 resulting in a further point 440 that describes the relationship between voltage U_LED and current I_LED.

A next iteration step may be performed using point 440 instead of point 414 and using again the slope m that has been determined for point 416. The iteration is finished if the power for the last point is close enough to the maximum power P_LEDMAX. It is also possible to perform only one iteration step or to find the missing points using another way.

Figure 21:
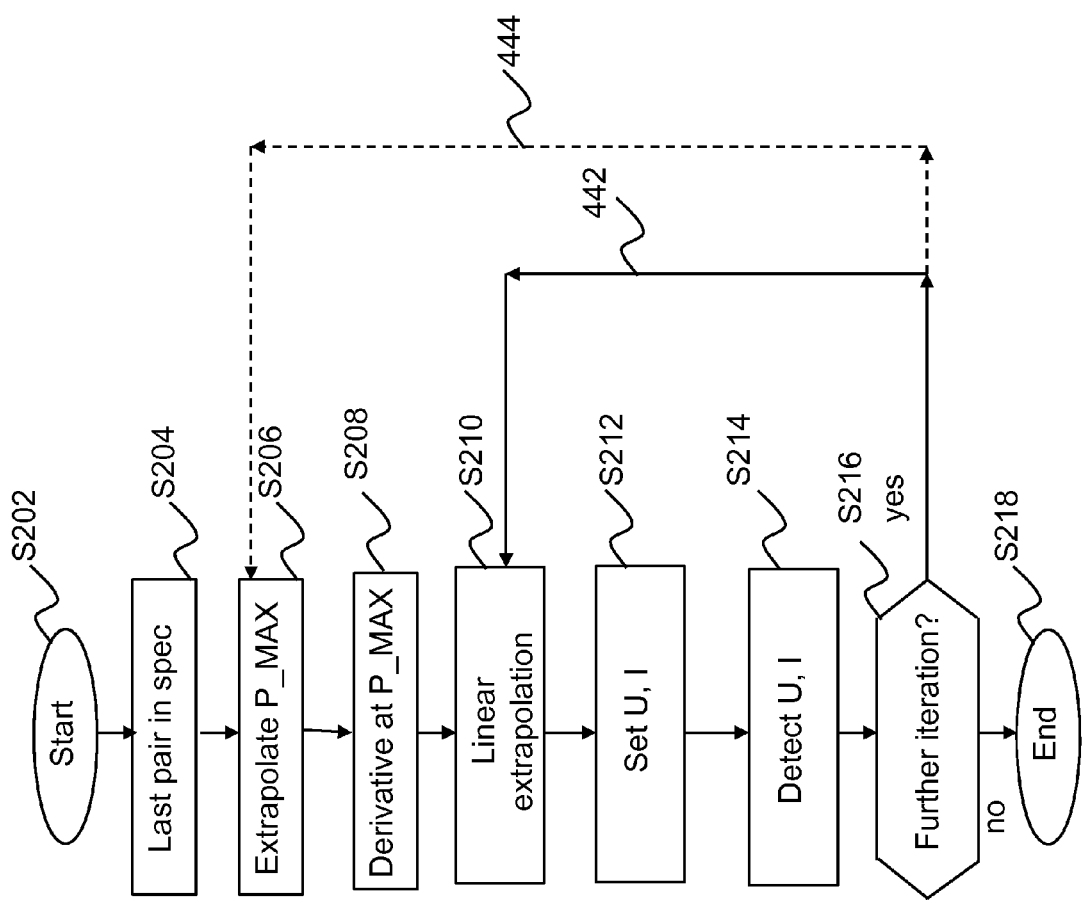
FIG. 21 illustrates method steps for the determination of a characteristic curve near P_MAX.

FIG. 21 illustrates method steps for the determination of a characteristic curve near P_MAX. This method has already been graphically described above with regard to FIG. 20. All steps S202 to S218 that are shown in FIG. 21 are automatically performed by microcontroller 300.

The method starts in a method step S202, i.e. in short in step S202. The last known point 414 that has an electric power that is within the USB standard is determined in a step S204 that follows after step S202.

The last point 414 and optionally also other points 410, 412 are used in step S204 to extrapolate the curve 422 to a point 416 that represents the maximum electric power for the LEDs 32, 42 within the strings 30, 40.

Then, the derivative at point 416, i.e. the point of maximum power is calculated to get the slope m at this point 416, see step S208.

In step S210, the point that has been detected last is used as a starting point for a next extrapolation using the slope m that has been calculated in step 208. This is point 414 for the first iteration and point 440 for the second iteration, for example. A new value for U_LED is calculated based on the extrapolation that uses slope m.

Thereafter, in step S212, the new value for U_LED is set by choosing an appropriate duty cycle for voltage converter 18. Updated characteristic curve 256 may be used for that purpose.

The values of the voltage U_LED and of the current I_LED are detected for the new duty cycle in step S214. The analog digital converter ADC1 is used to detect the current I_LED and the analog digital converter ADC2 is used to detect the voltage U_LED.

Then, it is checked whether further iteration steps are necessary. The method continues in step S210 if further iteration steps are necessary, see arrow 442.

The method is now within a loop of steps S210 to S216 and is finding new pairs of values of voltage U_LED and current I_LED. All pairs or points have an electric power that is smaller than P_MAXLED.

The loop of steps S210 to S216 is only left in step S216 if no further iteration step is necessary, for instance because the last pair of values has an electric power that is very close to P_MAXLED. There follows a step S218 immediately after step S216 if this is the case.

Figure 22:
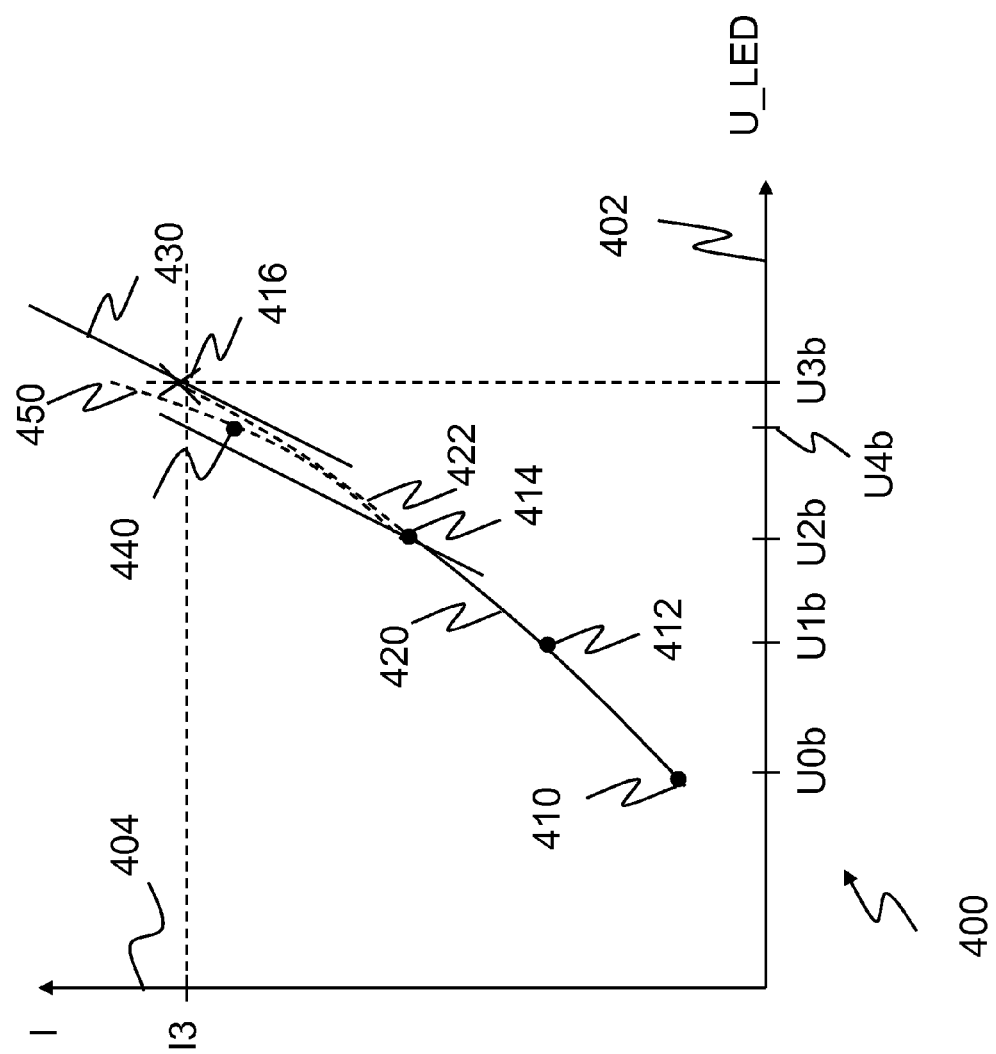
FIG. 22 illustrates the determination of a characteristic curve near P_MAX according to a second embodiment.

FIG. 22 illustrates the determination of a characteristic curve near P_MAX or more exactly near P_MAXLED according to a second embodiment. FIG. 22 corresponds to FIG. 20. However, point 440 is used to improve the extrapolation curve 422. A new curve 450 is calculated using point 414 and point 440 as well as other points 410, 412.

The slope m2 of curve 450 at point 440 is used for the next iteration instead of the slope m of curve 422 at point 416. The iteration becomes more accurate and/or is faster compared to the method of FIG. 20.

The second embodiment is also shown in FIG. 21, see dashed line 444 that extends from step S216 to step S206. The method is therefore within a loop of steps S206 to S216 and is finding new pairs of values of voltage U_LED and current I_LED using improved extrapolation curves 422, 450 etc. All pairs or points have an electric power that is smaller than P_MAXLED.

Figure 23:
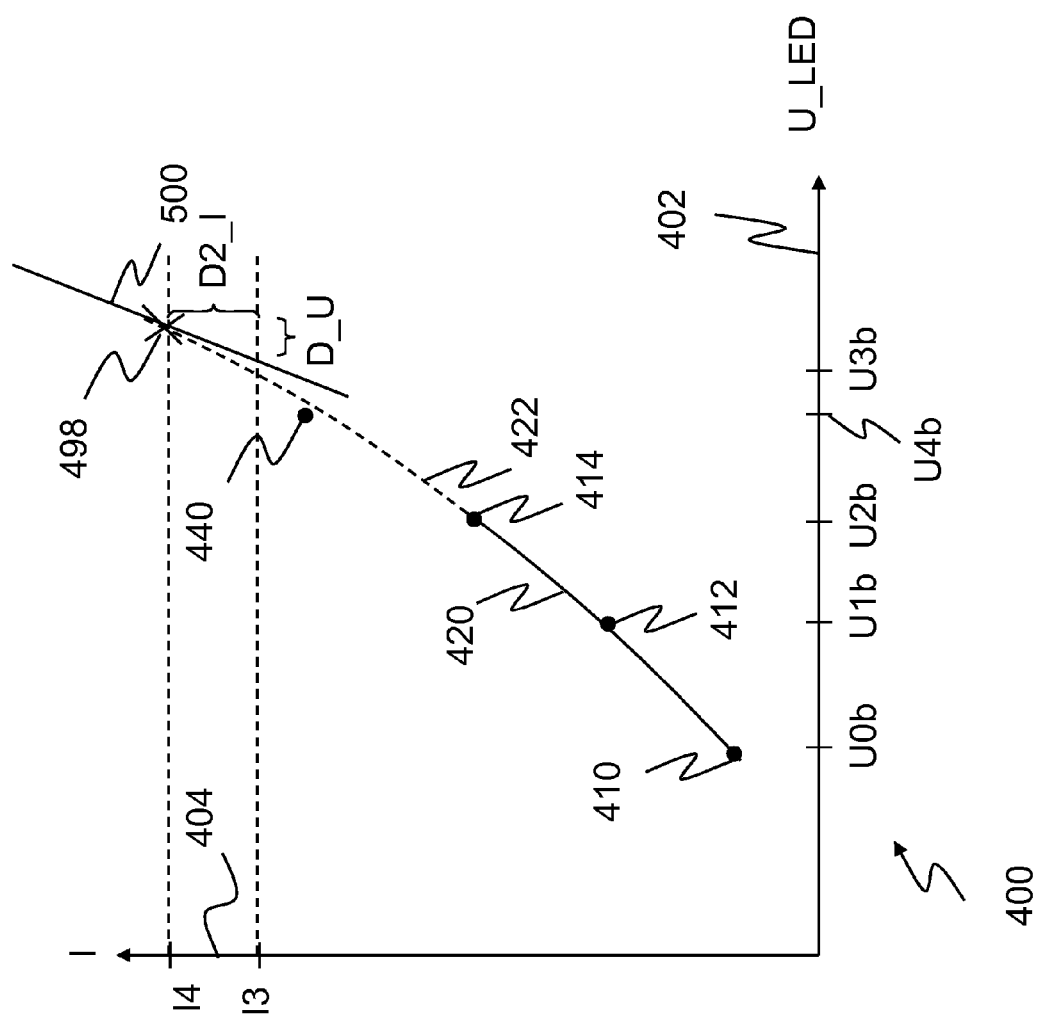
FIG. 23 illustrates the controlling of brightness near P_MAX during the operation of a keyboard.

FIG. 23 illustrates the controlling of brightness near P_MAX or near P_MAXLED during the operation of a keyboard. It is assumed that there has been a drift to higher current values of I, i.e. to a current I4 for instance. The microcontroller 300 detects the difference of I, i.e. the delta D2_I. The microcontroller 300 performs a closed loop control step if the delta D2_I increases a threshold value T2.

The derivative of curve 422 or even of an updated curve 450 at the point 498 is calculated. Point 498 has the current value I4 that is higher than current I3.

The derivative at point 498 may be represented by a straight line 500 with slope m3. Straight line 500 is the tangent of curve 422, 450 at point 498. A delta D_U of the voltage is calculated using delta D2_I and the slope m3. Delta D_U is subtracted from the last value of the voltage U_LED, which was, for instance, between the voltage U4b and the voltage U3b.

A new duty cycle DuC is determined from updated characteristic 256 based on the new value for the voltage U_LED. The PWM signal 26 is adjusted according to the new duty cycle resulting in a decrease of U_LED and I_LED.

Contrary to the drift to a higher value, the slope at the target point has to be used if there is a drift to lower values of current I, see description of FIG. 18.

Figure 24:
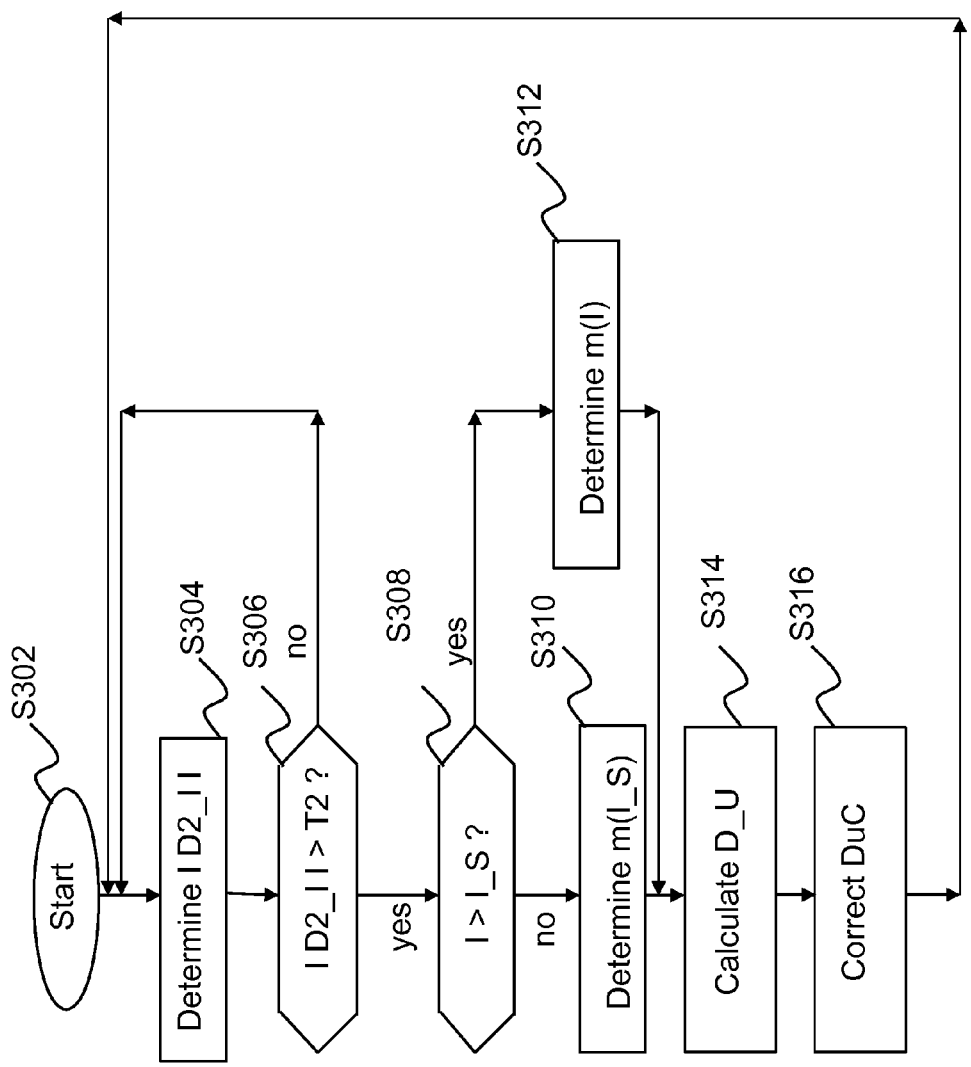
FIG. 24 illustrates method steps for controlling the brightness near P_MAX during the operation of a keyboard.

FIG. 24 illustrates method steps for the controlling of the brightness B near P_MAX during the operation of a keyboard. This method has already been graphically described above with regard to FIG. 23. All steps S302 to S312 that are shown in FIG. 24 are automatically performed by microcontroller 300.

The method starts in a method step S302, i.e. short in step S302. Delta I, i.e. D2_I, is determined in a step S304 that follows after step S302. Analog digital converter ADC1 is used to determine I_LED. Microcontroller 300 calculates the difference between I_LED and reference current I3 or I_S.

Then, it is checked whether the absolute value of D2_I is higher than a threshold value T2. If the absolute value of D2_I is not higher the method continues in step S304.

The method is now within a loop of steps S304 and S306 and is waiting for the occurring of drift. Alternatively the method is only started if a drift is detected. An interrupt may be used to start a corresponding routine of microcontroller 300.

The loop of steps S304 and S306 will only be left in step S306 if the absolute value of D2_I is higher than the threshold value T2.

Step S308 follows immediately after step S306 if the absolute value of D2_I is higher than the threshold value T2.

Then, it is checked whether the actual value of I or I_LED is higher than the reference current I_S. The method continues in step S310 if the value of I is not higher than I_S, i.e. there is a drift to lower values of I.

The value of the slope of curve 390 at the target point is determined in step S310. The method is continued in step S314 afterwards.

However, the method continues after step S308 in step S312 if the value of I is greater than I_S, i.e. there is a drift to higher values of I. The value of the slope of curve 422 or of curve 450 at the current point of operation is determined in step S312, for instance at point 498 as shown in FIG. 23.

If point 498 is reached the first time due to drift, simply the slope at the last intentionally adjusted point can be scaled appropriately, since the drift will not change the basic form of the curve, but roughly the curve can be considered simply stretched. The resulting adjustment will, of course, create a new value pair, that can be used for further refining the new curve by the usual interpolation methods. Temperature drift will "scale" the whole curve, while most other influences simply will move the allowed maximum leaving the existing curve itself untouched. At the end of the allowable range it is done as already explained, while for other points there is already a known interpolation function whose derivative gives the slope.

The method is continued in step S314 afterwards.

Step S314 is used to calculate the correction value or delta value D_U using slope m and delta I, i.e. D2_I for instance. A new U_LED is calculated using the delta value D_U.

The current duty cycle DuC is corrected in step S316 based on the calculated value for D_U. Characteristic curve 256 may be used to calculate the new DuC for the new voltage U_LED. The PWM signal 26 is adapted according to the new duty cycle DuC. This results in an increase or decrease of current I.

Step S304 follows again after step S316, i.e. the method is within a loop of steps S304 to S316 and is performing controlling of the brightness of the LEDs 32, 42 near the maximum power P_MAXLED. The method ends if the computer and the keyboard are, for instance, switched off.

Different curves are used according to FIG. 19 and FIG. 24, i.e. current to duty cycle (FIG. 19) and current to voltage (FIG. 24). A sufficiently good approximation of the duty cycle DuC to current I dependency can be calculated from the voltage U to current I dependency and vice versa as far as the point of operation is far enough away from P_MAX. It is also possible to use the voltage U to current I dependency for controlling at a point of operation that is far away from P_MAX. Since there is a strictly monotonic increasing correlation between duty cycle and voltage they can be used equivalently.

Figure 25:
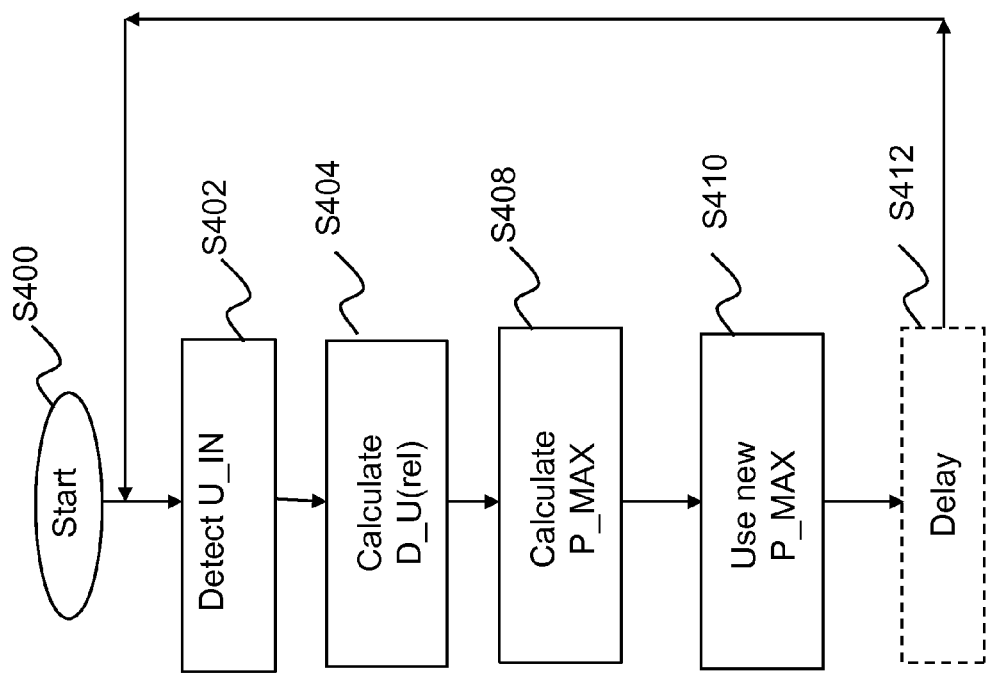
FIG. 25 illustrates method steps for the determination of P_MAX.

FIG. 25 illustrates method steps for the determination of P_MAX. All steps S400 to S412 that are shown in FIG. 25 are automatically performed by microcontroller 300.

The method starts in a method step S400, i.e. short in step S400. The input voltage U_IN of the circuit arrangement 10 is detected in a step S404 that follows after step S400. Analog digital converter ADC3 is used to detect U_IN.

The relative decrease of U_IN with regard to a reference voltage U_REF is calculated in a step S404 that follows after step S402. The reference voltage U_REF for USB is for instance 5 volts.

An overall maximum electric power P_MAX and/or the power P_MAXLED that may be used for the LEDs 32, 42 and for the strings 40, 42 is calculated in step S408 based on the results of step S404. The reduction of maximum power P_MAX, P_MAXUSB or of the power P_MAXLED is, for instance, proportional to the reduction of the input voltage U_IN. This, for example, means that P_MAXLED is reduced by ten percent if U_IN also decreases by ten percent relative to U_REF. Other calculation schemes may also be used.

The new P_MAXLED is used in step S410, for instance in the methods of FIG. 21 and FIG. 24.

Optional step S412 may comprise a delay. The method is again repeated beginning with step S402.

The following formulas may be used to calculate P_MAXLED:

$$P\_MAXUSB = U\_USB * 500 \text{ mA(milli Amperes)},$$

where U_USB is the internal voltage behind a diode, $$P\_USB = P\_LED + P\_PROZ,$$

$$P\_MAXLED = (P\_USB - P\_PROZ) * (1 - GAMMA),$$

where GAMMA is the loss ratio within the voltage converter.

The maximum power P_MAX and/or the power P_MAXLED is reduced if there is a voltage decrease of the input voltage U_IN. The voltage decrease may be due to plug in a further device at a USB interface that shares its power supply with other USB interfaces. Furthermore, the voltage decrease may be due to a high current through the LEDs themselves. This means that the brightness may be automatically limited by the methods described above if the user selects the brightness too high. Due to its non well defined nature the possibly occurring USB voltage drop is not appropriate to limit P_MAXLED effectively, though the methods as a whole will do.

FIG. 21 is relevant if the power P_MAXLED increases, for instance because a USB device has been removed from an USB interface 12 that shares its power supply with other USB interfaces. The reference current I3 or I_S will increase in this case. An extrapolation of characteristic curve 420 into a further range has to be found.

However, FIG. 24, step S312, is relevant if the power P_MAXLED and the reference current I_S decrease, for instance because a USB device has been connected to another USB interface 12 sharing the same power supply. The characteristic curve 420 is already known in this case.

Other methods may also be used to determine P_MAX or P_MAXLED. It is possible, for instance, to use analog digital converter ADC4. The input current I_IN is detected by ADC4. Power P_MAX and/or also P_MAXLED has to be decreased if the input current I_IN is higher than I_MAX specified for instance by the USB standard or by another relevant standard. The amount of decrease of maximum electric power P_MAX may be proportional to the decrease of I_IN that is necessary to get to a current that is given by the specification.

The result of the method of FIG. 25 has to be considered for the method of FIG. 20. Both methods have to be applied in turns if operating at the limit. The Method shown in FIG. 25 is dispensable if operating far enough from the limit.

It is also possible to use another type of converter, in particular an inverter, a buck converter or a fly back converter instead of the boost converter. There may only be one LED or two LED's in one branch of the circuit if a buck converter is used.

In other embodiments the operation voltage of an LED driver is controlled by using the same or corresponding circuits or methods. The LED string is replaced by one driver circuit that drives a plurality of LEDs.

Pre-selected LEDs may be used, for instance LEDs for which the manufacturer of the LEDs guarantees a brightness that is within a very small range for a reference current, for instance within a range of plus and/or minus smaller 5 percent or 1 percent with regard to a reference brightness that lies within the range, for instance in the middle of the range. However, the invention is also appropriate for not pre-selected LEDs/optical elements.

A constant input voltage is used in other embodiments instead of the USB voltage.

The invention may be used for keyboard LEDs, backlight LEDs for displays, power LEDs for automotive devices as cars, trucks, ships, air crafts etc.

Although embodiments of the present invention and their advantages have been described in detail, it should be understood that various changes, substitutions and alterations can be made therein without departing from the spirit and scope of the invention as defined by the appended claims. For example, it will be readily understood by those skilled in the art that many of the features, functions, processes and methods described herein may be varied while remaining within the scope of the present invention. Moreover, the scope of the present application is not intended to be limited to the particular embodiments of the system, process, manufacture, method or steps described in the present invention. As one of ordinary skill in the art will readily appreciate from the disclosure of the invention systems, processes, manufacture, methods or steps presently existing or to be developed later that perform substantially the same function or achieve substantially the same result as the corresponding embodiments described herein may be utilized according to the present invention. Accordingly, the appended claims are intended to include within their scope such systems, processes, methods or steps. It is possible to combine the embodiments of the introduction with each other. Furthermore is possible to combine the examples of the description of Figures with each other.

Further, it is possible to combine the embodiments of the introduction and the examples of the description of Figures.

Detailed Description—Third Aspect

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. Moreover, the same reference signs refer to the same technical features if not stated otherwise. As far as "may" is used in this application it means the possibility of doing so as well as the actual technical implementation.

Figure 26:
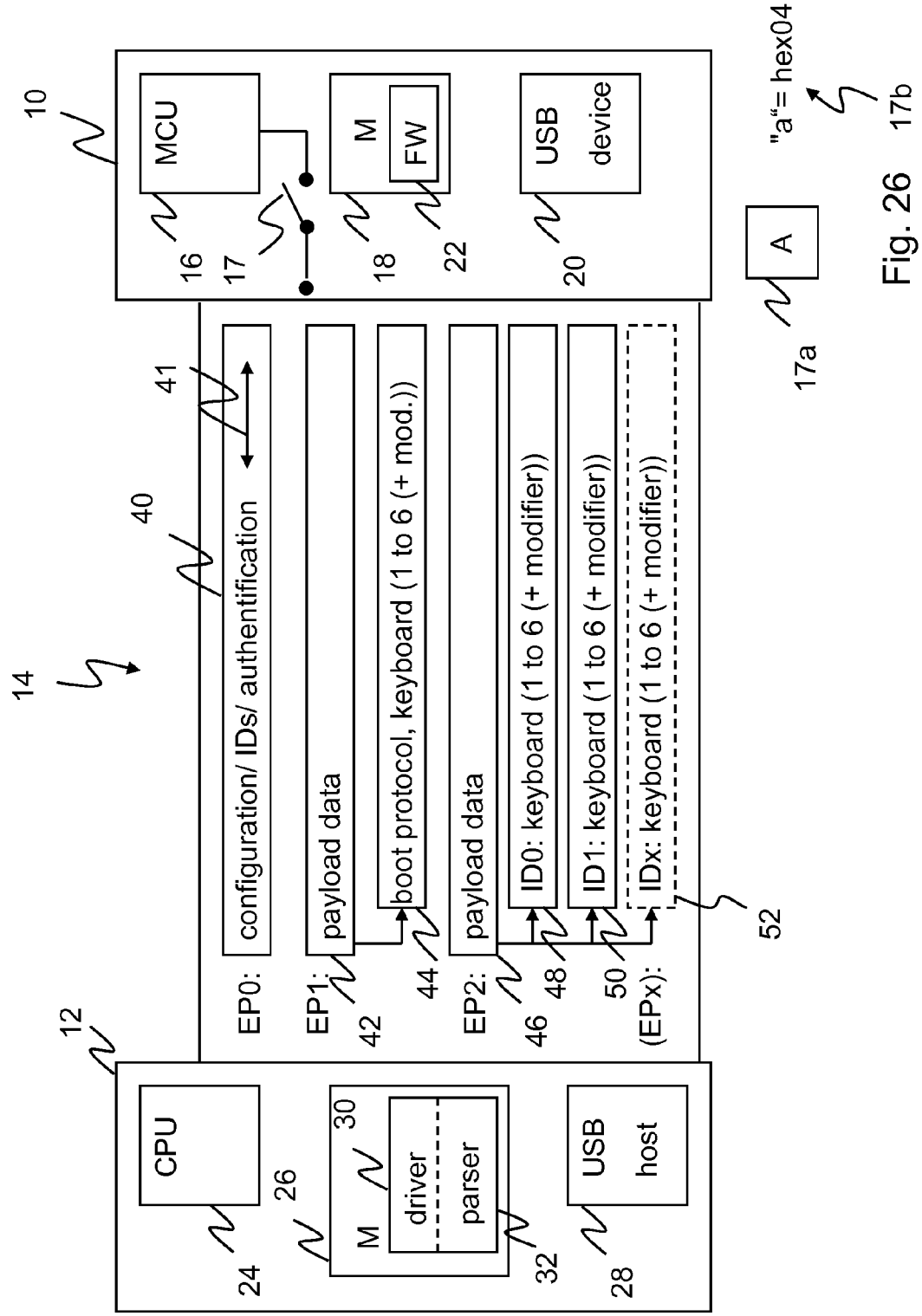
FIG. 26 illustrates a keyboard that is connected to a computer via a USB cable.

FIG. 26 illustrates a keyboard 10 that is connected to a computer 12 via a USB cable 14.

The keyboard 10 comprises:
a microcontroller 16, i.e. processor, memory and peripheral circuits, or a microprocessor or simply a processor chip,
a plurality of push buttons, see for instance push button 17, or other input element, e.g. a touch screen,
a memory 18, that may be part of the microcontroller 16,
a USB device function 20, that may also be part of the microcontroller 16 or of a different USB chip.

All input elements may comprise the same elements, for instance a push button head 17a in addition to the push button 17. A key code, e.g. 17b, may be defined and used for each push button, e.g. 17, or push button head, e.g. 17a. The push button 17 may belong to a push button head carrying the letter "A". Therefore, the corresponding key code 17b is hex 04, i.e. here the same as decimal 04.

The memory M or 18 may comprise a firmware 22 that includes operation instructions for the processor or controller 16. The methods mentioned in the following are executed if the instructions of the firmware 22 are processed by the processor or controller 16. Alternatively, a circuit without a processor and a controller 16 may be used, for instance an FPGA (Field Programmable Gate Array).

The computer 12 comprises:
a processor 24, for instance a microprocessor,
a memory 26 that stores instruction data for the processor 24 and/or other data that may be used during the processing of the instructions, and
a USB host 28 that operates for instance in line with the USB specification.

The memory M or 30 may store:
a device driver 30 program for the keyboard 10, and or
a parser program 32, that is able to read report descriptors as explained below, especially with regard to FIG. 32, and or that is able to receive reports that are in line with such report descriptors. The parser program 32 may be part of the device driver 30.

The USB host 28 communicates via the USB cable 14 with several endpoints that are defined and implemented within the keyboard 10:
an endpoint EP0 that is mainly used for configuration purposes of the USB device 20, i.e. of the keyboard 10,
an endpoint EP1 that is for instance used in connection with the boot protocol of the BIOS,
an endpoint EP2 that is used for the transmission of key codes under the control of an operation system,
optional endpoints EPx, wherein x is a number within the range of 3 to 32.

The endpoint EP0 is also called the default endpoint and is used for the configuration of the other endpoints during the start of the BIOS and of the operation system, see configuration data 40. During the start of the BIOS only endpoint EP0 and endpoint EP1 are used. Endpoint EP1 is configured via endpoint EP0 within this phase. Bidirectional data transfer 41 takes place from USB host 28 to USB device 20 and in the opposite direction, i.e. from USB device 20 to USB host 28.

The endpoint EP1 may be used to transmit 1 to 6 key code bytes plus one byte for modifiers, see boot protocol data 44. An eighths byte is defined in the specification that is RESERVED and can not be used for key codes or for modifiers. Most BIOS's are able to deal with such a number of key codes per transmission. The key codes from endpoint EP1 are transmitted in payload data 42 to the USB host 28. The USB host 28 forwards the key code data to the driver 30. The driver 30 communicates with the main operating system of computer 12 or directly to BIOS, depending on operation mode.

Payload data 46 is directed to endpoint EP2 from the USB host 28 or in the other direction, i.e. from USB device 20 to USB host 28. The payload data 46 comprises several reports:

report data 48,
report data 50, and
optional report data 52.

Report data 48 is identified by a first report identifier ID0 that has for instance the numerical value "0". According to the definition for first report data 48 it is possible to include up to 6 "normal" key codes, i.e. no modifiers, and one byte for a maximum of 8 modifiers.

Report data 50 is identified by a second report identifier ID1 that has for instance the numerical value "1". According to the definition for second report data 50 it is possible to include up to 6 "normal" key codes, i.e. no modifiers, and one byte for a maximum of 8 modifiers.

The same may be true for optional report data 52 and possible further report data, see report identifier IDx. Again it is possible to include up to 6 "normal" key codes, i.e. no modifiers, and one byte for a maximum of 8 modifiers within these further reports.

The USB host 28 requests the report data 44 as well as the report data 48 to 52 from the USB device during BIOS boot and during OS operation mode. This is called polling. A NAK (not acknowledged, i.e. denial of requested data) may be sent from USB device 20 if no key codes are there for a report. This is the case if no key is pressed or if the key codes of pressed keys can be transmitted by earlier reports within the same transmission phase or period.

The definition of the format of the report data 48 to 52 is described below with regard to FIG. 32. Based on the definition of the report data 48 to 52 within the report descriptor the parser 32 is able to extract the key codes from payload data 46. The parser 32 is part of keyboard driver 30 which forwards the key codes to the operating system of computer 12.

Thus, only two endpoints EP1 and EP2 are used to transmit all key codes that may be pressed between two polling phases. Furthermore, there is little overhead data because only 6 normal key codes are transmitted per report, i.e. if only one key code has to be transmitted within a group there are only 5 Bytes overhead excluding data for modifiers.

Figure 27:
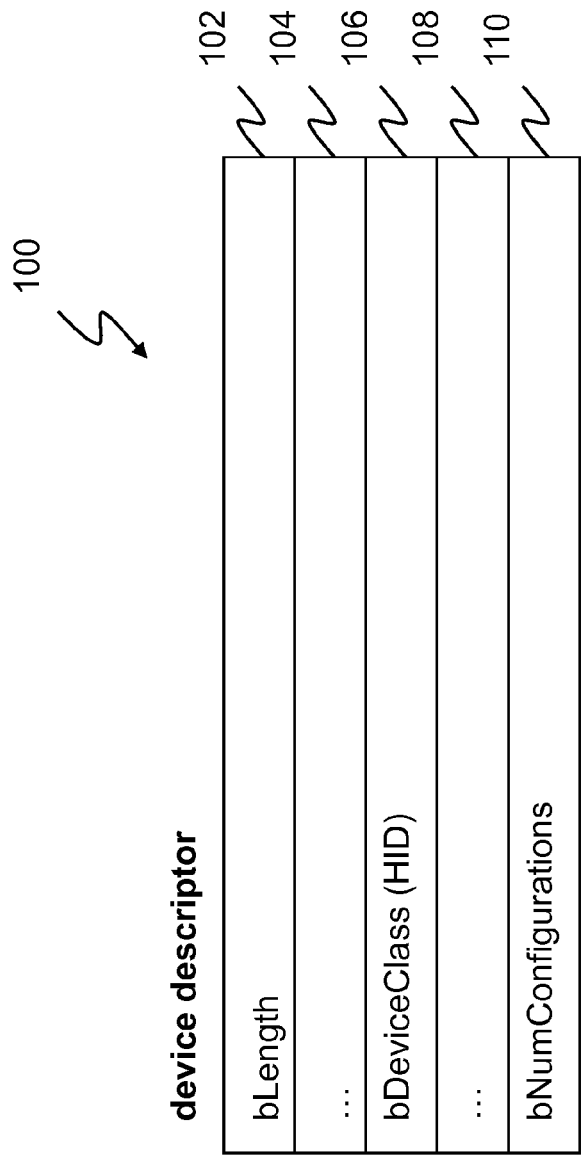
FIG. 27 illustrates a device descriptor according to the USB specification.

FIG. 27 illustrates a device descriptor 100 according to the USB specification, see for instance USB 2.0, Apr. 27, 2000, pages 262 and 263. In the following only these fields are mentioned that allow a better understanding of the invention. Other fields are used also but do not have a close relation to the invention.

The device descriptor 100 comprises or consists of for instance:

length data 102 with an offset of 0 bytes from the beginning of the descriptor,
descriptor data 104 with an offset of 1 byte and of two bytes,
device class data 106 with an offset of 4 bytes,
further descriptor data 108 with offset of 5 to 16 bytes, and
the number of configuration descriptors 110 with an offset of 17 bytes.

The length data 102 specifies the size of the device descriptor 100 in bytes. The device class data 106 states the class code of the keyboard, i.e. HID (Human Interface Device) with class code hex 03. The number of configuration descriptors 110 refers to the number of possible configurations. There is at least one configuration that is described by a configuration descriptor as explained with regard to FIG. 28 in the following.

Figure 28:
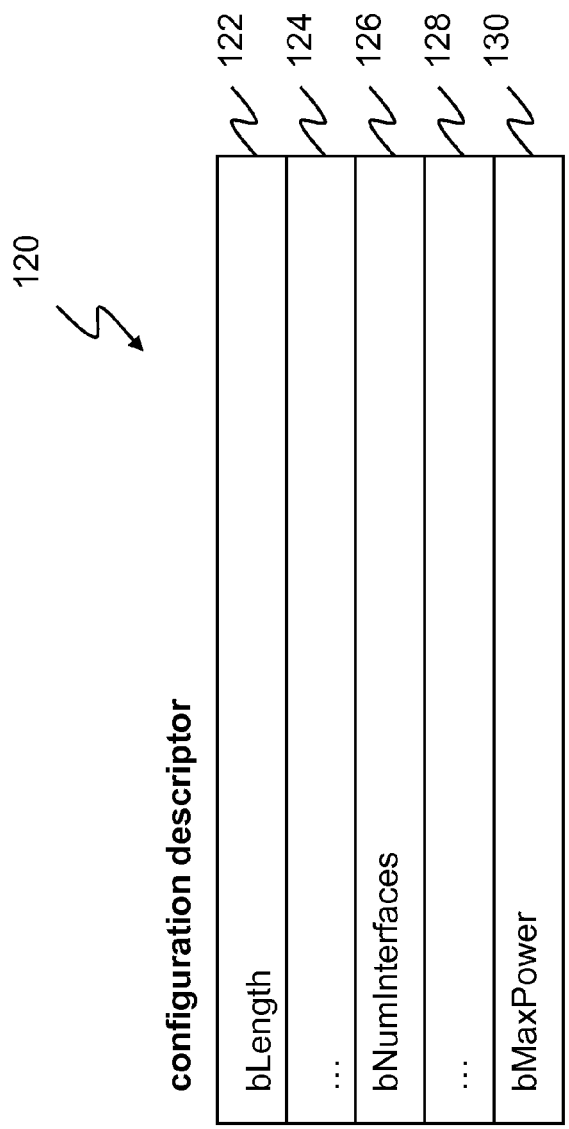
FIG. 28 illustrates a configuration descriptor according to the USB specification.

FIG. 28 illustrates a configuration descriptor according to the USB specification, see for instance USB 2.0, Apr. 27, 2000, pages 265 and 266. In the following, only these fields are mentioned that allow a better understanding of the invention. Other fields are used also but do not have a close relation to the invention.

The configuration descriptor 120 comprises or consists of:

length data 122 with an offset of 0 bytes from the beginning of the descriptor,
descriptor data 124 at offsets of 1 byte and 2 bytes,
number of interface descriptors 126 at an offset of 4, bytes,
further descriptor data 128 at offsets of 5 to 7 bytes, and
data specifying maximum power 130 at offset of 8 bytes.

The length data 122 specifies the length of configuration descriptor 120. The number of interface descriptors 126 refers to the number of interfaces that are supported by this configuration. At least an interface is supported. An example for an interface descriptor is given in FIG. 29 below.

The data 130 specifying maximum power gives the maximum power consumption of the USB device from the bus in this specific configuration when the device is fully operational, expressed in 2 mA (milli ampere) units, e.g. 50=100 mA.

Figure 29:
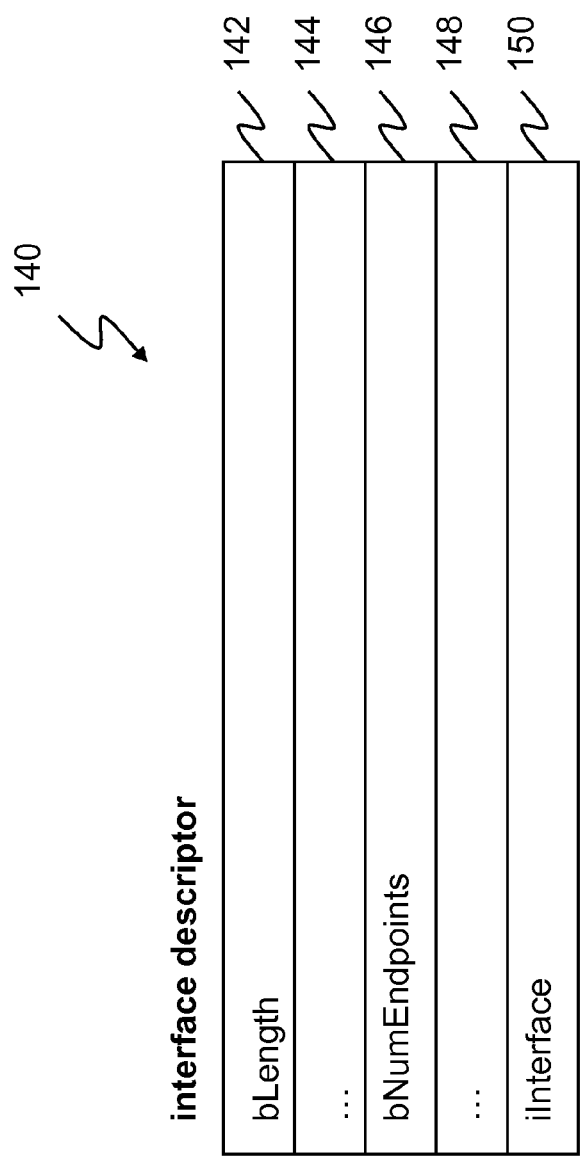
FIG. 29 illustrates an interface descriptor according to the USB specification.

FIG. 29 illustrates an interface descriptor 140 according to the USB specification, see for instance USB 2.0, Apr. 27, 2000, pages 268 and 269. In the following, only these fields are mentioned that allow a better understanding of the invention. Other fields are used also but do not have a close relation to the invention.

The interface descriptor 140 comprises or consists of:
length data 142 having offset of 0 bytes,
descriptor data 144 with offsets of 1 byte, 2 bytes and 3 bytes from the beginning of the descriptor,
number of endpoints 146 at offset of 4 bytes,
further descriptor data 148 at offsets of 5 bytes to 7 bytes,
index of string data 150 at an offset of 8 bytes.

The length data 142 specifies the size of the interface descriptor 140. The number of endpoints 146 refers to the number of endpoints used by this interface, excluding endpoint zero. An example for an endpoint descriptor is given in FIG. 31 below. The index of string data 150 refers to an index of a string descriptor describing this interface, i.e. the interface that is specified by interface descriptor 140.

Figure 30:
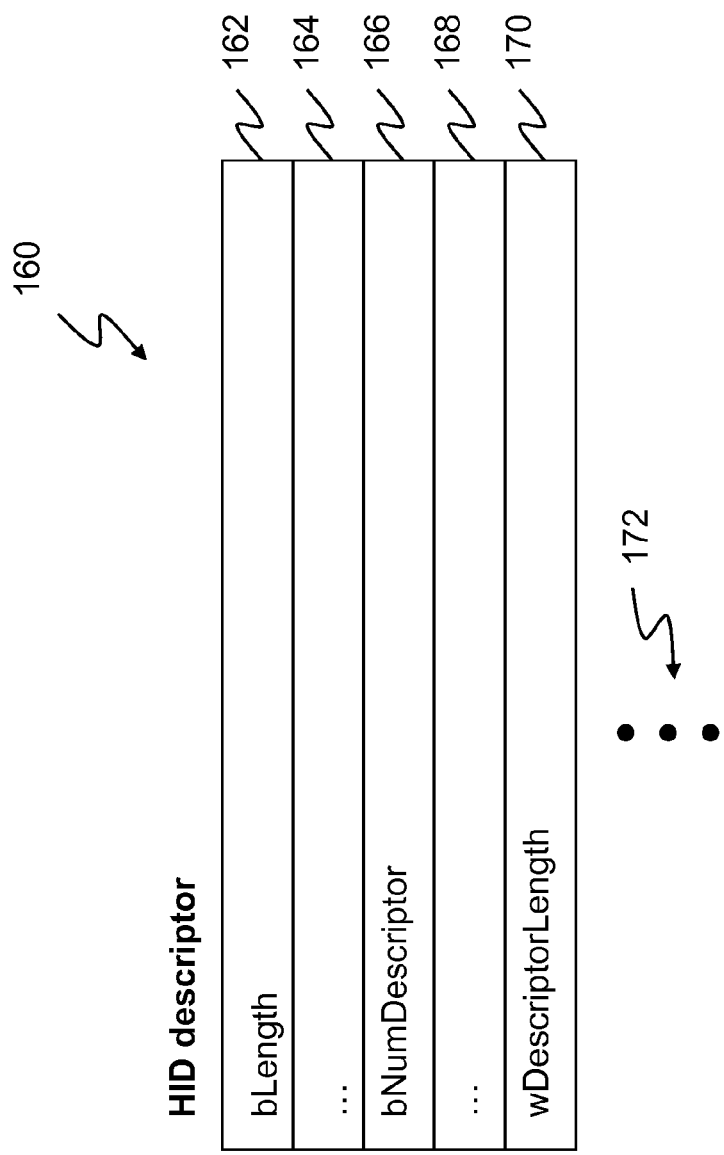
FIG. 30 illustrates a HID descriptor according to the USB specification.

FIG. 30 illustrates a HID descriptor 160 according to the USB specification, see for instance HID specification: Universal Serial Bus (USB)—Device Class Definition for Human Interface Devices (HID), Firmware Specification Jun. 27, 2001, Version 1.11, page 22. In the following, only these fields are mentioned that allow a better understanding of the invention. Other fields are used also but do not have a close relation to the invention.

The HID descriptor 160 comprises or consists of:
length data 162 at offset of 0 bytes,
descriptor data 164 at offsets of 1 byte, 2 bytes and 4 bytes,
number of report descriptors 166 at an offset of 5 bytes,
further descriptor data 168 at an offset of 6 bytes,
length data specifying length of report descriptor 170 at an offset of 7 bytes,
further data 172 at offsets of 9 bytes and possibly of 10 bytes.

The length data 162 is a numeric expression that is the total size of the HID descriptor 160. The number of report descriptors 166 is a numeric expression specifying the number of class descriptors that is always at least one, i.e. report descriptor. The length data specifying length of report descriptor 170 is a numeric expression that is the total size of the report descriptor. An example of a report descriptor is explained with regard to FIG. 32 below.

Figure 31:
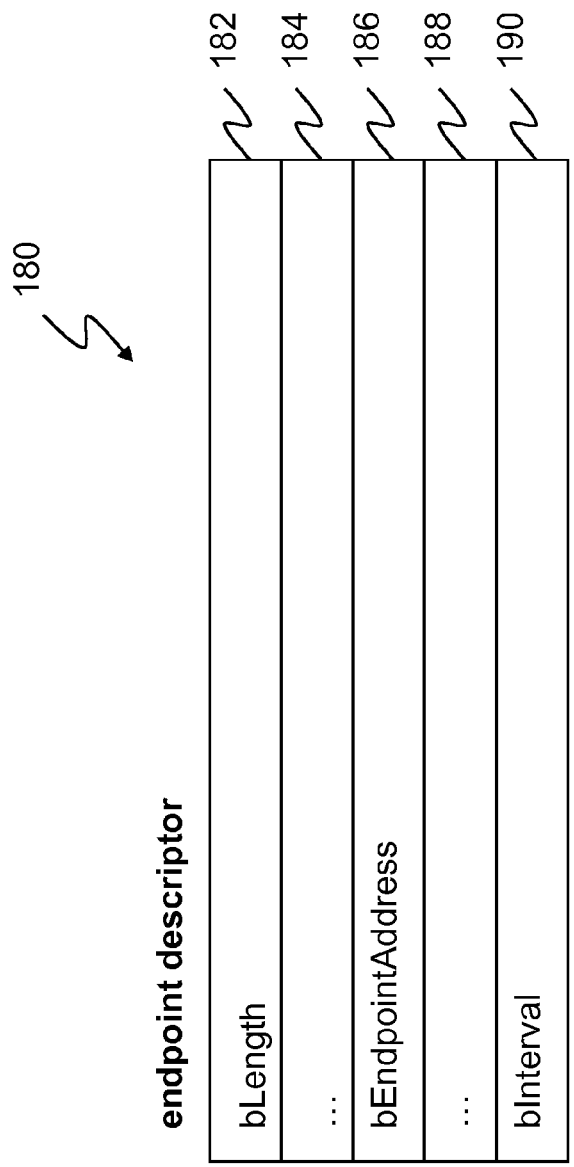
FIG. 31 illustrates an endpoint descriptor according to the USB specification.

FIG. 31 illustrates an endpoint descriptor 180 according to the USB specification, see for instance USB 2.0, Apr. 27, 2000, pages 269 to 271. In the following, only these fields are mentioned that allow a better understanding of the invention. Other fields are used also but do not have a close relation to the invention.

The endpoint descriptor 180 comprises or consists of:
length data 182 at offset of 0 bytes,
descriptor data 184 at an offset of 1 byte,
endpoint address data 186 at an offset of 2 bytes,
further descriptor data 188 at offsets of 4 bytes and 5 bytes,
interval data 190 at an offset of 6 bytes.

The length data 182 specifies the size of this descriptor 180. The endpoint address data 186 states the address or endpoint identifier of the endpoint on the USB device 20, see FIG. 26. The interval data 190 specifies the interval for polling the endpoint for data transfers. The interval is expressed in frames or micro frames depending on the device operation speed, i.e. either 1 millisecond or 125 microsecond units. For full speed or low speed interrupt endpoints, the value of this field may be from 1 to 255.

Figure 32:
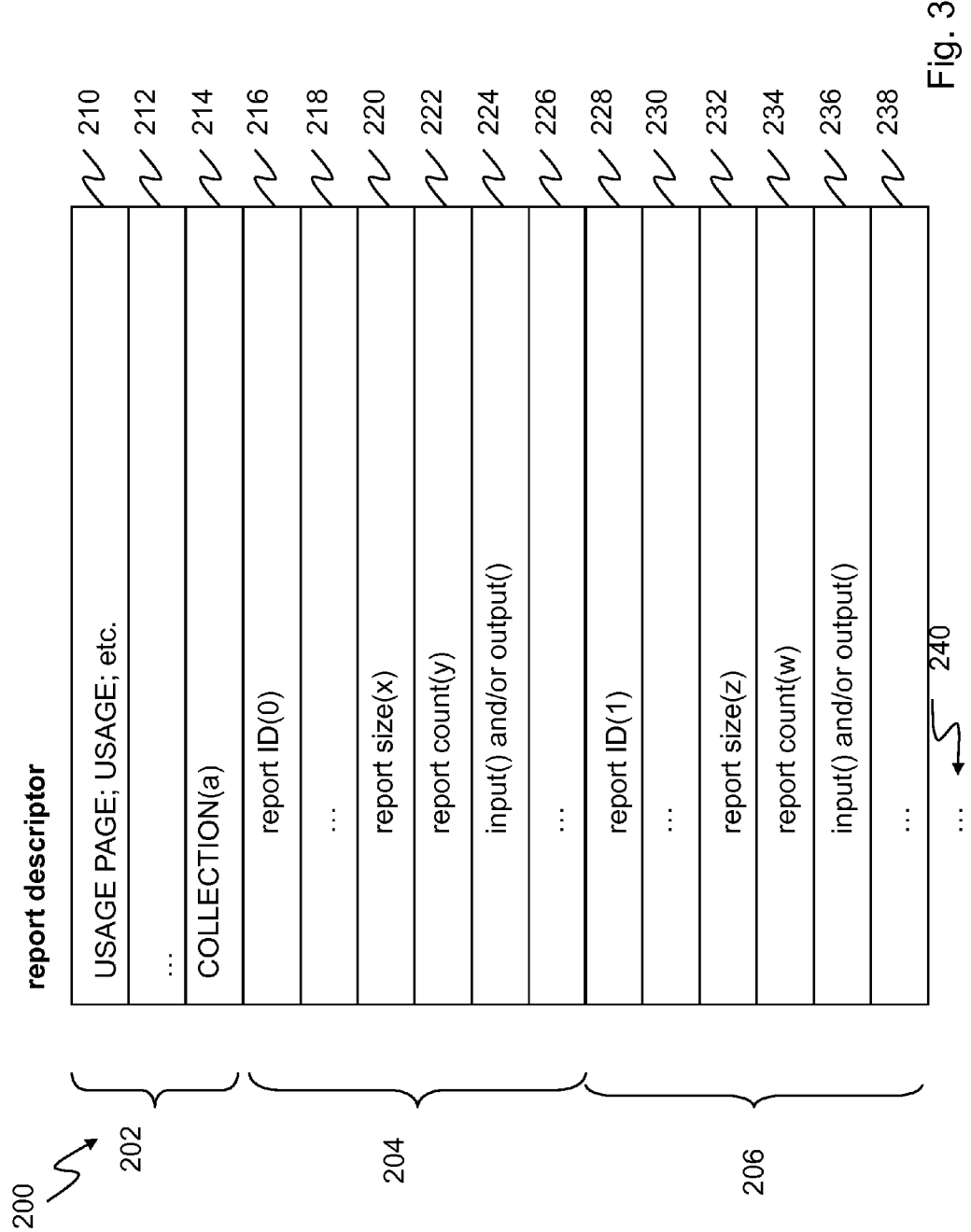
FIG. 32 illustrates a report descriptor.

FIG. 32 illustrates a report descriptor 200 that is referred to in HID descriptor 160. Report descriptors and or single data fields of report descriptors are mentioned and specified in the HID specification. However, there is room for further definitions. Here, the report descriptor defines two reports for the same keyboard which is not mentioned in the HID specification.

See for instance HID specification: Universal Serial Bus (USB)—Device Class Definition for Human Interface Devices (HID), Firmware Specification Jun. 27, 2001, Version 1.11, page 23 to page 25. In the following, only these fields are mentioned that allow a better understanding of the invention. Other fields are used also but do not have a close relation to the invention.

The report descriptor 200 comprises or consists of:
head data 202,
first report definition 204, and
second report definition 206.

The head data 202 comprises or consists of:
descriptor data 210, for instance USAGE_PAGE( . . . ),
further descriptor data 212, for instance USAGE( . . . ) and
definition of begin of collection 214, for instance COLLECTION( ), The first report definition 204 comprises or consists of:
first report identifier 216, for instance REPORT ID(0),
descriptor data of first report 218, for instance usage( . . . ), usage minimum( . . . ), usage maximum( . . . ), logical minimum( . . . ), logical maximum( . . . ),
report size 220, for instance report size(x), wherein x is a number in the range of 1 to n, n is for instance 32 or higher,
report count 222, for instance report count(y), wherein y is a number in the range of 1 to n, n is for instance 32 or higher,
input definition or output definition 224, for instance input (data, variable, absolute),
further descriptor data 226, for instance input(constant), i.e. spacer byte.

The second report definition 206 comprises or consists of:
second report identifier 228, for instance REPORT ID(1),
descriptor data of second report 230, for instance usage( . . . ), usage minimum( . . . ), usage maximum( . . . ), logical minimum( . . . ), logical maximum( . . . ),
report size 232, for instance report size(y), wherein y is a number in the range of 1 to n, n is for instance 32 or higher,
report count 234, for instance report count(w), wherein w is a number in the range of 1 to n, n is for instance 32 or higher,
input definition or output definition 236, for instance input (data, variable, absolute),
further descriptor data 238, for instance input(constant), i.e. spacer byte.

It is also possible to define more than two reports with different report identifiers, see data 240.

This is an example of an implementation of a keyboard report descriptor:

```
const uchar code
keyboardReportDescriptor[KEYBOARD_SIZ_REPORT_DESC] = {
0x05, 0x01, // usage page (generic desktop)
0x09, 0x06, // usage (keyboard)
0xA1, 0x01, // collection (application)
0x85, 0x00, // REPORT ID(0)
0x05, 0x07, // usage (Key codes)
0x19, 0xE0, // usage minimum (224)
0x29, 0xE7, // usage maximum (231)
0x15, 0x00, // logical minimum (0)
0x25, 0x01, // logical maximum (1)
0x75, 0x01, // report size (1)
0x95, 0x08, // report count (8) = Modifier Bits (x8)
0x81, 0x02, // Input (data, variable, absolute) = Modifier Byte
0x81, 0x01, // Input (Constant) = Reserved Byte
0x19, 0x00, // usage minimum (0)
0x29, 0x65, // usage maximum (101)
0x15, 0x00, // logical minimum (0)
0x25, 0x65, // logical maximum (101)
0x75, 0x08, // report size (8)
0x95, 0x06, // report count (6)
0x81, 0x00, // input (data, array) = Keycode Bytes (6)
0x85, 0x01, // REPORT ID(1)
0x05, 0x07, // usage (Key codes)
0x19, 0xE0, // usage minimum (224)
0x29, 0xE7, // usage maximum (231)
0x15, 0x00, // logical minimum (0)
0x25, 0x01, // logical maximum (1)
0x75, 0x01, // report size (1)
0x95, 0x08, // report count (8) = Modifier Bits (x8)
0x81, 0x02, // Input (data, variable, absolute) = Modifier Byte
0x81, 0x01, // Input (Constant) = Reserved Byte
0x19, 0x00, // usage minimum (0)
0x29, 0x65, // usage maximum (101)
0x15, 0x00, // logical minimum (0)
0x25, 0x65, // logical maximum (101)
0x75, 0x08, // report size (8)
0x95, 0x06, // report count (6)
0x81, 0x00, // input (data, array) = Keycode Bytes (6)
0x05, 0x08, // usage page (page# for LEDs)
0x19, 0x01, // Usage minimum (1)
0x29, 0x03, // Usage maximum (3)
0x15, 0x00, // logical minimum (0)
0x25, 0x01, // logical maximum (1)
0x75, 0x01, // report size (1)
0x95, 0x05, // report count (5)
0x91, 0x02, // output (data, variable, absolute) = LED Bits (x3)
0x95, 0x03, // report count (3)
0x91, 0x01, // output (constant) = Spacer Bits ( x3)
0xC0 // end collection
};
```

Figure 33:
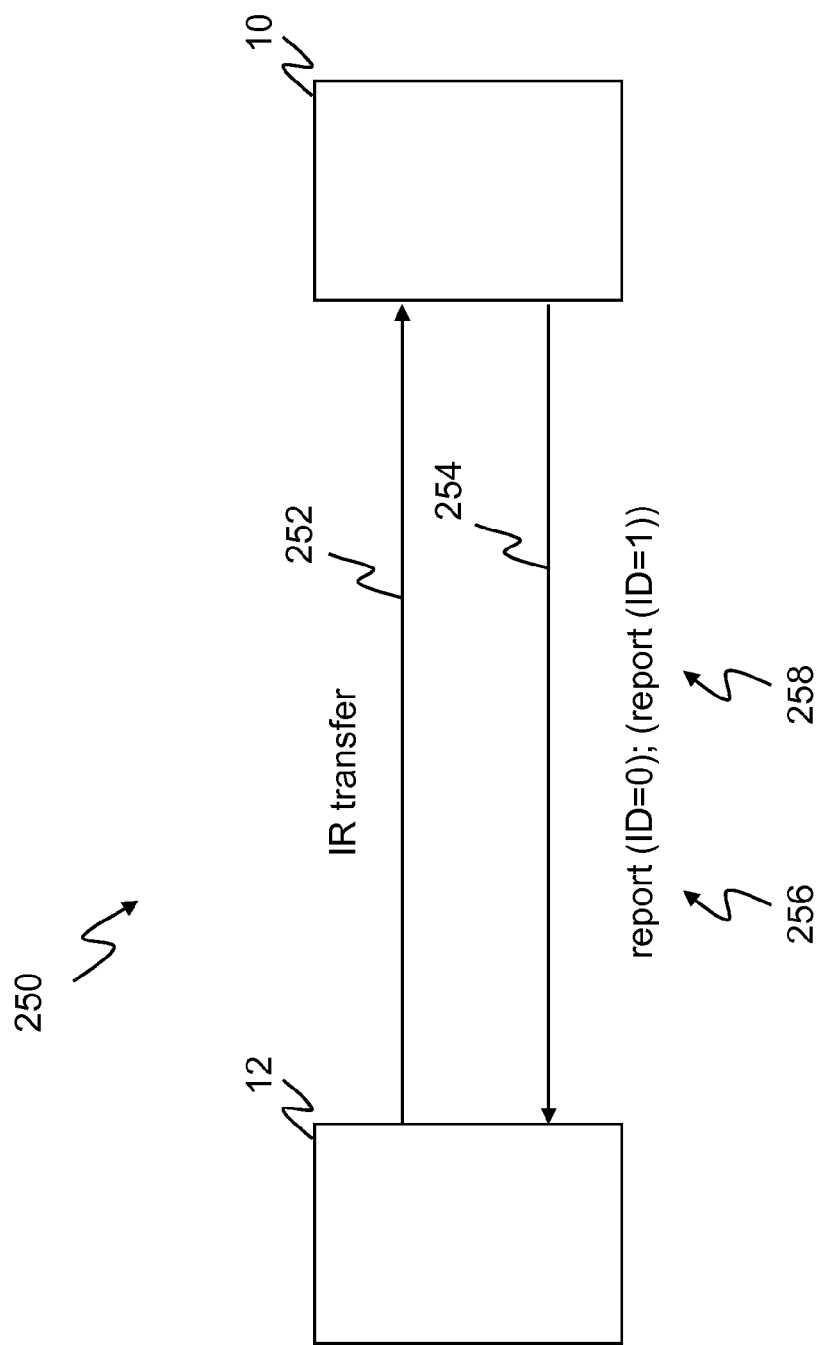
FIG. 33 illustrates a data exchange between a computer and a keyboard.

FIG. 33 illustrates a data exchange 250 between the computer 12 and the keyboard 10.

The computer 12 or more exactly the USB host 28 in computer 12 sends IR (Interrupt Request) transfer request 252 to keyboard 10, i.e. to the USB device 20 that is implemented within keyboard 10. The requests 252 are sent in regular intervals. This is also known as polling.

The USB device within keyboard 10 answers to the request 252 with an answer which comprises report data 256. Report data 258 may be sent within the same answer, i.e. in more detail within DATA0 and DATA1 phase, or in response to a further request 252 within the same polling cycle.

Report data 256 comprises the first report identifier ID(0) and the first group of key codes. Report data 258 comprises the second report identifier ID(1) and a second group of key codes. If there are no key codes left for the second group an empty second report may be sent or a NAK.

Figure 34:
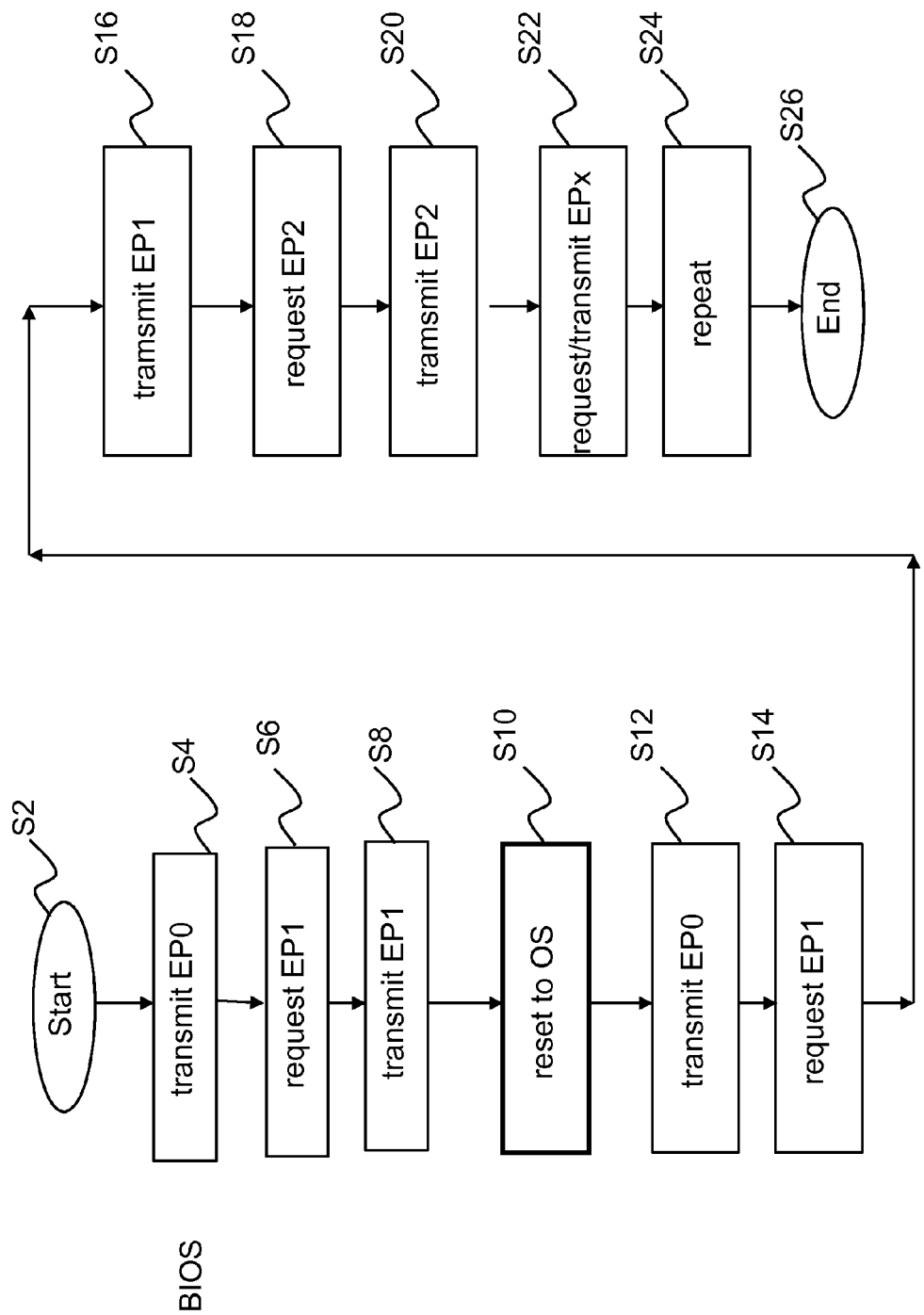
FIG. 34 illustrates method steps during the start of a computer.

FIG. 34 illustrates method steps during the start of a computer. The method starts in method step S2 or in short in step S2. The method starts with the reset of the computer 12, for instance. Steps S4 to S8 relate to the boot process of the BIOS. Steps S12 to S24 relate to the boot process and to the normal mode of operation of the main operating system of computer 12.

Step S4 follows after step S2. In step S4 the BIOS communicates with endpoint EP0 to determine the configuration of endpoint EP1, for instance. Other endpoints EP2, etc., are not used by the BIOS.

In step S6, the BIOS requests the endpoint EP1 whether keys are pressed at the moment or not, for instance key "F1" or another key or combination of keys to change set up within the BIOS. The keyboard 20 transmits the key codes for keys that are pressed at the moment in Step S8.

After the BIOS boot process has been completed a reset signal is created that resets the USB host, see step S10. At the same time, the operating system of computer 12 is started or booted.

In Step S12 the main operating system transmits data to and/or from endpoint EP0, i.e. the default endpoint. During this transmission the description data for all endpoints EP0, EP1, EP2, EPx etc. is transmitted to the USB host 28. The corresponding endpoints may be configured and initialized if necessary. After initialization, the endpoints may be used in a regular mode.

Endpoint EP1 is requested in step S14. Endpoint EP1 answers in Step 316, for instance by transmitting respective key codes of the first group if any and of the second group using at least two reports in the first embodiments.

Endpoint EP2 is requested in step S18. Endpoint EP2 answers in Step S20, for instance by transmitting respective data of another input device in the first embodiment. In the second embodiment endpoint EP2 may be used to transmit key codes of the second group if there are any key codes for this group.

Endpoint EPx is requested in step S22. Endpoint EPx answers in Step S24, for instance by transmitting endpoint specific data.

The steps S12 to S22 are repeated, see step S24. The method ends in step S26, for instance by switching off the computer 12.

FIG. 35 illustrates a second embodiment using a keyboard 310 that is connected to a computer 312 via a USB cable 314.

The keyboard 310 comprises:
a microcontroller 316, i.e. processor, memory and peripheral circuits, or a microprocessor or simply a processor chip,
a plurality of push buttons, see for instance push button 317, or other input element, e.g. a touch screen,
a memory 318, that may be part of the microcontroller 316,
a USB device function 320, that may also be part of the microcontroller 316 or of a different USB chip.

All input elements may comprise the same elements, for instance a push button head 317a in addition to the push button 317. A key code, e.g. 317b, may be defined and used for each push button, e.g. 317, or push button head, e.g. 317a. The push button 317 may belong to a push button head carrying the letter "A". Therefore, the corresponding key code 317b is hex 04, i.e. here the same as decimal 04.

The memory M or 318 may comprise a firmware 322 that includes operation instructions for the processor or controller 316. The methods mentioned in the following are executed if the instructions of the firmware 322 are processed by the processor or controller 316. Alternatively, a circuit without a processor and without a controller 316 may be used, for instance an FPGA (Field Programmable Gate Array).

The computer 312 comprises:
a processor 324, for instance a microprocessor,
a memory 326 that stores instruction data for the processor 324 and or other data that may be used during the processing of the instructions, and
a USB host 328 that operates for instance in line with the USB specification.

The memory M or 330 may store:
a device driver 330 program for the keyboard 310, and or
a parser program 332, that is able to read report descriptors, and or that is able to receive reports that are in line with such report descriptors. The parser program 332 may be part of the device driver 330.

The USB host 328 communicates via the USB cable 314 with several endpoints that are defined and implemented within the keyboard 310:
an endpoint EP0a that is mainly used for configuration purposes of the USB device 320, i.e. of the keyboard 310,
an endpoint EP1a that is for instance used in connection with the boot protocol of the BIOS,
an endpoint EP2a that is used for the transmission of key codes 317b under the control of an operation system of the computer 312,
optional endpoints EPxa, wherein x is a number within the range of 3 to 32.

The endpoint EP0a is also called the default endpoint and is used for the configuration of the other endpoints during the start of the BIOS and of the main operation system, see configuration data 340. During the start and operation of the BIOS only endpoint EP0a and endpoint EP1a are used. Endpoint EP1a is configured via endpoint EP0a within this phase. Bidirectional data transfer 341 takes place from USB host 328 to USB device 320 and in the opposite direction, i.e. from USB device 320 to USB host 328.

The endpoint EP1a may be used to transmit 1 to 6 key code bytes plus one bytes for modifiers, see boot protocol data 344. Most BIOS's are able to deal with such a number of key codes per transmission. The key codes from endpoint EP1a are transmitted in payload data 342 to the USB host 328. The USB host 328 forwards the key code data to the driver 330. The driver 330 communicates with the main operating system of computer 312 or directly to BIOS, depending on operation mode.

Payload data 346 is directed to endpoint EP2a from the USB host 328 or in the other direction, i.e. from USB device 320, endpoint EP2a, to USB host 328. The payload data 346 comprises report data 348.

Report data 348 has not necessarily to have a report identifier. According to the definition for report data 348 it is possible to include for instance up to 100 "normal" key codes 317*b*, i.e. no modifiers, and one byte for modifiers.

Optional payload data 350 is directed to endpoint EPxa from the USB host 346 or in the other direction, i.e. from USB device 320, endpoint EPxa, to USB host 28. The payload data 350 may comprise optional report data 352.

Optional report data 352 has not necessarily to have a report identifier. According to the definition for report data 352 it is possible to include for instance up to 100 "normal" key codes 317*b*, i.e. no modifiers, and one byte for modifiers.

The USB host 328 requests the report data 344 as well as the report data 348 and optionally report data 350 from the USB device 320 during BIOS boot and during OS operation mode. This is called polling. A NAK (not acknowledged) may be sent from USB device 320 if no key codes are there for a report. This is the case if no key is pressed or if the key codes of pressed keys can be transmitted by endpoints with lower identifiers within the same transmission phase or period.

In the second embodiment, the definition of the format of the report data is also in line with the USB specification and/or the HID specification. No report identifiers are necessary as only one report is defined for each relevant endpoint. However, a report identifier may be used Thus only one report is used for one endpoint EP1*a*, EP2*a* and EPxa. This allows a simple definition of the reports. At least one of the reports is a very huge report that comprises for instance more than 7 key codes, more than 20 key codes or more than 50 key codes that have to be transmitted at one polling cycle. The keys belonging to these key codes are pressed and/or played by a macro recorder program, for instance.

Preferably, the second endpoint generates the huge or larger report. This enables the usage of the first endpoint for the transmission of key codes even if the main operating system is not able to deal with larger reports for the transmission of key codes.

The invention may be used for keyboards or other input devices as well as for output devices.

The HID specification is not only valid for USB but also for other transfer protocols, for instance for wireless protocols, for example Bluetooth.

Although embodiments of the present invention and their advantages have been described in detail, it should be understood that various changes, substitutions and alterations can be made therein without departing from the spirit and scope of the invention as defined by the appended claims. For example, it will be readily understood by those skilled in the art that many of the features, functions, processes and methods described herein may be varied while remaining within the scope of the present invention. Moreover, the scope of the present application is not intended to be limited to the particular embodiments of the system, process, manufacture, method or steps described in the present invention. As one of ordinary skill in the art will readily appreciate from the disclosure of the invention systems, processes, manufacture, methods or steps presently existing or to be developed later that perform substantially the same function or achieve substantially the same result as the corresponding embodiments described herein may be utilized according to the present invention. Accordingly, the appended claims are intended to include within their scope such systems, processes, manufacture, methods or steps.

It is possible to combine the embodiments of the introduction with each other. Furthermore, it is possible to combine the examples of the description of Figures with each other. Further, it is possible to combine the embodiments of the introduction and the examples of the description of Figures.

The invention claimed is:

1. A method for determining active input elements (S1*a*, S2*a*) of input elements (S1*a* to S2*b*) of an input arrangement (10), comprising:
   providing the input elements (S1*a* to S2*b*) such that they are connected according to a matrix arrangement (Ma),
   providing within the matrix arrangement (Ma) at least two drive lines (L1, L2) that are each connected to a respective driving circuit (2, 4),
   providing within the matrix arrangement (Ma) at least two sense lines (Ca, Cb) that are used to detect the active input elements (S1*a*, S2*a*),
   providing within the matrix arrangement (Ma) serial connections (SC1 to SC4) each comprising a respective input element (S1*a* to S2*b*) of the input elements (S1*a* to S2*b*) and a resistor (R1*a* to R2*b*) and each of the serial connections (SC1 to SC4) being connected to a respective one of the drive lines (L1, L2) and to a respective one of the sense lines (Ca, Cb),
   providing pull resistors (Ra, Rb) that connect the sense lines (Ca, Cb) to a first potential, and
   using a control device and the driving circuits (2, 4) to selectively activate by driving a first drive line (L1) of the at least two drive lines (L1, L2) to a second potential that is different from the first potential and to selectively activate by driving a second drive line (L2) or other respective drive lines of the at least two drive lines (L1, L2) to the first potential or to a potential having an absolute offset value from the first potential that is at most 50 percent of the absolute value of the difference of the first potential and of the second potential,
   the method further comprising:
   activating the first drive line (L1) of the at least two drive lines (L1, L2), wherein only one drive line (L1, L2) of the at least two drive lines (L1, L2) is active at one time,
   detecting a first value of an electrical signal on a first sense line (Ca) of the at least two sense lines (Ca, Cb) during activating the first drive line (L1), and
   determining the respective activated input element (S1*a*, S2*a*) of the input elements (S1*a* to S2*b*) in the respective serial connection (SC1, SC2) of the serial connections (SC1 to SC4) between the first drive line (L1) and the first sense line (Ca) due to an undershoot or due to exceeding of a threshold value (SW) by the first value,
   whereby the threshold value (SW) is independent of a number of the active input elements (S1*a*, S2*a*) or independent of at least two, three or four different numbers of the active input elements (S1*a*, S2*a*) on the first sense line (Ca) and/or on the other sense lines (Ca, Cb) of the at least two sense lines (Ca, Cb),
   wherein the matrix arrangement (Ma) comprises a calibration line (Ccc),
   whereby reference resistors (R1*cc*, R2*cc*) are connected to the calibration line (Ccc) and to each of the at least two drive lines (L1, L2) respectively, and
   wherein the method comprises:
   detecting a calibration value using the calibration line (Ccc),
   using the calibration value to determine the threshold value (SW), and whereby the calibration line (Ccc) is connected to the first potential by a further pull resistor (Rcc).

2. The method according to claim 1, comprising:
detecting a second value of an electrical signal on a second sense line (Cb) of the at least two sense lines (Ca, Cb) during activating the first drive line (L1),
determining a respective activated input element (S1b) of the input elements (S1a to S2b) in the respective serial connection (SC3) of the serial connections (SC1 to SC4) between the first drive line (L1) and the second sense line (Cb) due to an undershoot or due an exceeding of the threshold value (SW) by the second value.

3. The method according to claim 2, comprising
deactivating the first drive line (L1) after detecting the first value and the second value,
activating the second drive line (L2) of the at least two drive lines (L1, L2),
determining a respective activated input element (S2b) in the respective serial connection (SC2) of the serial connections (SC1 to SC4) between the second drive line (L2) and the first sense line (Ca) due to an undershoot or due an exceeding of the threshold value (SW) by the first value.

4. The method according to claim 1, whereby the calibration line (Ccc) is sensed and the threshold value (SW) is determined after the activation of a respective drive line (L1, L2) of the at least two drive lines (L1, L2) but before sensing of one of the at least two sense lines (Ca, Cb).

5. The method according to claim 1, whereby the threshold value (SW) is a first threshold value (SW) that is used to calculate or to determine further threshold values or threshold ranges (TR1 to TR11) which indicate different numbers of activated input elements (S1a to S2b) on a respective sense line (Ca, Cb) of the at least two sense lines (Ca, Cb).

6. The method according to claim 1, whereby the resistors (R1a to R2b) or the resistors (R1a to R2b) and the pull resistors (Ra, Rb, Rcc) have the same resistance values, within a range of tolerance smaller than 5 percent with regard to a largest resistance value of the applicable resistors (R1a to R2b) and the applicable pull resistors (Ra, Rb, Rcc), and/or whereby the resistors (R1a to R2b) have a fixed resistance value, or there is no pressure sensitivity of the resistors (R1a to R2b),
and/or whereby the resistors (R1a to R2b) or the resistors (R1a to R2b) and the pull resistors (Ra, Rb, Rcc) are produced by carbon printing,
and/or wherein the resistors (R1a to R2b) have resistance values of at least 4.5 kilo ohms or 5 kilo ohms.

7. The method according to claim 1, whereby a scanning of the matrix arrangement (Ma) is accelerated by at least one of the following measures:
it is determined how many respective input elements (S1a to S2b) of the input elements (S1a to S2b) are active on a respective sense line (Ca, Cb) of the at least two sense lines (Ca, Cb) as soon as the first active input element (S1a to S2b) of the input elements (S1a to S2b) is detected at the respective sense line (Ca, Cb) based on a detected value and based on threshold values (TR1 to TR11) that indicates a number of active input elements (S1a to S2b),
no further electrical signal is detected as soon as the number of respective active input elements (S1a to S2b) is detected that is equal to the indicated number of active input elements (S1a to S2b),
all drive lines (L1, L2) of the at least two drive lines (L1, L2) are driven to the second potential and respective sense lines (Ca, Cb) of the at least two sense lines (Ca, Cb) are determined that do not have respective activate input elements (S1a, S2a) of the input elements (Sa1 to S2b),
the determined respective sense lines (Ca, Cb) are not considered during the scan of the matrix arrangement (Ma) within a current scan cycle any more,
an order of driving the at least two drive lines (L1, L2) is dependent on a probability of active input elements (S1a, S2a) connected to a corresponding drive line (L1, L2) of the at least two drive lines (L1, L2),
a bisection method is used for driving the at least two drive lines (L1, L2).

8. The input arrangement (10), for performing a method according to claim 1, comprising:
the active input elements (S1a, S2a) of the input elements (S1a to S2b),
wherein the input elements (S1a to S2b) are connected according to the matrix arrangement (Ma),
wherein the matrix arrangement (Ma) comprises the at least two drive lines (L1, L2) that are each connected to a respective driving circuit (2, 4) of the driving circuits (2, 4),
wherein the matrix arrangement (Ma) comprises the at least two sense lines (Ca, Cb) that are used to detect the active input elements (S1a, S2a),
whereby, according to the matrix arrangement (Ma), the serial connections (SC1 to SC4) each comprising a respective input element (S1a to S2b) of the input elements (S1a to S2b) and the resistor (R1a to R2b) are each connected to a respective one of the at least two drive lines (L1, L2) and to a respective one of the at least two sense lines (Ca, Cb).

9. The input arrangement (10) according to claim 8, wherein the at least two sense lines (Ca, Cb) are connected to the first potential by the pull resistors (Ra, Rb), and
wherein the control device for the driving circuits (2, 4) selectively activates by driving a first drive line (L1) of the at least two drive lines (L1, L2) to the second potential that is different from the first potential and selectively activates by driving a second drive line (L2) or other respective drive lines (L1, L2) of the at least two drive lines (L1, L2) to the first potential or to the potential having the absolute offset value from the first potential that is at most 50 percent of the absolute value of the difference of the first potential and of the second potential.

10. A method for determining active input elements (S1a, S2a) of input elements (S1a to S2b) of an input arrangement (10), comprising:
providing the input elements (S1a to S2b) such that they are connected according to a matrix arrangement (Ma),
providing within the matrix arrangement (Ma) at least two drive lines (L1, L2) that are each connected to a respective driving circuit (2, 4),
providing within the matrix arrangement (Ma) at least two sense lines (Ca, Cb) that are used to detect the active input elements (S1a, S2a),
providing within the matrix arrangement (Ma) serial connections (SC1 to SC4) each comprising a respective input element (S1a to S2b) of the input elements (S1a to S2b) and a resistor (R1a to R2b) and each of the serial connections (SC1 to SC4) being connected to a respective one of the drive lines (L1, L2) and to a respective one of the sense lines (Ca, Cb),
providing pull resistors (Ra, Rb) that connect the sense lines (Ca, Cb) to a first potential, and using a control device and the driving circuits (2, 4) to selectively activate by driving a first drive line (L1) of the at least two drive lines (L1, L2) to a second potential that is different from the first potential and to selectively activate by driving a second drive line (L2) or other respective drive lines of the at least two drive lines (L1, L2) to the first potential or to a potential having an absolute offset value from the first potential that is at most 50 percent of the absolute value of the difference of the first potential and of the second potential, said method, further comprising:
activating one drive line (L1) of the at least two drive lines (L1, L2),
sensing a first value of an electrical signal on one sense line (Ca) of the at least two sense lines (Ca, Cb) during activating the one drive line (L1),
wherein it is tested whether the first sensed value is different from a value which indicates that no respective input element (S1a to S2b) of the input elements (S1a to S2b) is pressed on the one sense line (Ca), and
wherein a respective input element (S1a) of the input elements (S1a to S2b) between the one drive line (L1) and the one sense line (Ca) is classified as being a respective active input element (S1a) of the active input elements (S1a, S2a) if the testing is positive,
without further testing for ghost keying, including without further testing for at least one respective input element (S1a to S2b) of the input elements (S1a to S2b) configured to be detected as a respective active input element (S1a, S2a) of the active input elements (S1a to S2b) although it is not activated,
wherein a key code of the respective input element (S1a) of the input elements (S1a to S2b) that is classified as being the respective active input element (S1a) is transferred to a computer,
wherein the first potential is a positive operation potential,
wherein the matrix arrangement (Ma) comprises a calibration line (Ccc),
wherein respective reference resistors (R1cc, R2cc) are connected to the calibration line (Ccc) and to each respective drive line (L1, L2) of the at least two drive lines (L1, L2), and
wherein the calibration line (Ccc) is connected to or connectable to a detection unit for detecting a calibration value.

11. The input arrangement (10) according to claim 10, comprising a threshold determination unit that determines a threshold value (SW) that indicates a respective active input element (S1a to S2b) of the detected active input elements (S1a to S2b) independent of a number of detected active input elements (S1a to S2b) or independent of at least two or three or four different numbers of detected active input elements (S1a to S2b) connected to the same respective sense line (Ca, Cb) of the at least two sense lines (Ca, Cb) and/or that determines at least one threshold value or threshold range (TR1 to TR11) that indicates an exact number of detected active input elements (S1a to S2b) connected to the same respective sense line (Ca, Cb).

12. The input arrangement (10) according to claim 10, wherein the detection unit is operated by an operation potential and a reference potential, wherein the reference potential is filtered in a smoother way compared to the operation potential of the detection unit.

13. The input arrangement (10) according to claim 10, wherein the calibration line (Ccc) is connected to the first potential by a further pull resistor (Rcc), whereby the resistors (R1a to R2b) or the resistors (R1a to R2b) and the resistors (Ra, Rb, Rcc) have the same resistance values, within a range of tolerance smaller than 5 percent, with regard to a largest resistance value of the applicable resistors (R1a to R2b) and the applicable pull resistors (Ra, Rb, Rcc),
and/or whereby the resistors (R1a to R2b) have a fixed resistance value,
and/or whereby the resistors (R1a to R2b) or the resistors (R1a to R2b) and the pull resistors (Ra, Rb, Rcc) were produced by carbon printing,
and/or wherein the resistors (R1a to R2b) have resistance values of at least 4.5 kilo ohms or 5 kilo ohms.

14. The input arrangement (10) according to claim 10, wherein the resistor (R1a to R2b) of the serial connection (SC1 to SC4) is unmovable with regard to a carrier substrate of the matrix arrangement (Ma),
or wherein the resistor (R1a to R2b) of the serial connection (SC1 to SC4) is movable with regard to a carrier substrate of the matrix arrangement (Ma).

15. The input arrangement (10) according to claim 10, wherein there are no decoupling diodes within and/or connected to the matrix arrangement (Ma).

16. The input arrangement (10) according to claim 10, wherein a respective driving circuit (2, 4) of the driving circuits (2, 4) or the driving circuits (2, 4) for driving the at least two drive lines (L1, L2) are connected directly to the at least two drive lines (L1, L2) or by using a serial resistor (6, 8) having a resistance smaller than 200 ohms or smaller than 100 ohms,
wherein no pull resistor is used connected to an output of the respective driving circuit (2, 4) or no pull resistors are used connected to outputs of the driving circuits (2, 4).

17. The input arrangement (10) according to claim 10, wherein a respective driving circuit (2, 4) of the driving circuits (2,4) is or wherein the driving circuits (2, 4) are output circuits of a microcontroller unit (26).

18. The input arrangement (10) according to claim 10, wherein the detection unit is a first detection unit, the input arrangement (10) further comprising a second detection unit that is operated by an operation potential and a reference potential, wherein the reference potential is filtered in a smoother way compared to the operation potential of the second detection unit.

* * * * *